United States Patent
Nakayama et al.

(10) Patent No.: US 9,520,489 B2
(45) Date of Patent: Dec. 13, 2016

(54) SEMICONDUCTOR DEVICE

(71) Applicant: Renesas Electronics Corporation, Kanagawa (JP)

(72) Inventors: Tatsuo Nakayama, Kanagawa (JP); Hironobu Miyamoto, Kanagawa (JP); Yasuhiro Okamoto, Kanagawa (JP); Yoshinao Miura, Kanagawa (JP); Takashi Inoue, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/604,796

(22) Filed: Jan. 26, 2015

(65) Prior Publication Data

US 2015/0221757 A1   Aug. 6, 2015

(30) Foreign Application Priority Data

Feb. 5, 2014   (JP) ................. 2014-019950

(51) Int. Cl.
*H01L 29/66* (2006.01)
*H01L 29/778* (2006.01)
(Continued)

(52) U.S. Cl.
CPC ....... *H01L 29/7783* (2013.01); *H01L 23/5226* (2013.01); *H01L 27/0605* (2013.01);
(Continued)

(58) Field of Classification Search
CPC .............. H01L 29/66431; H01L 29/66439; H01L 29/66462; H01L 29/66469; H01L 29/775–29/7789; H01L 2924/13064; H01L 23/5226
See application file for complete search history.

(56) References Cited

U.S. PATENT DOCUMENTS 7,884,395 B2   2/2011   Saito
2005/0145851 A1   7/2005   Johnson et al.
(Continued)

FOREIGN PATENT DOCUMENTS

JP   2009-9993   1/2009
JP   2010-40814   2/2010

OTHER PUBLICATIONS

Extended European Search Report received in corresponding European Application No. 14200603.0 dated Jul. 8, 2015.
Wuerfl, J. et al., "Reliability Issues of GaN Based High Voltage Power Devices", Microelectronics Reliability, Elsevier Science Ltd., Jul. 5, 2011, pp. 1710-1716, vol. 51 No. 9, Germany.
(Continued)

*Primary Examiner* — Cuong B Nguyen
(74) *Attorney, Agent, or Firm* — Mattingly & Malur, PC

(57) ABSTRACT

Characteristics of a semiconductor device are improved. The semiconductor device is configured to provide a trench that penetrates a barrier layer, and reaches a middle portion of a channel layer among an n+ layer, an n-type layer, a p-type layer, the channel layer, and the barrier layer which are formed above a substrate, a gate electrode arranged within the groove through a gate insulating film, and a source electrode and a drain electrode which are formed above the barrier layer on both sides of the gate electrode. The n-type layer and the drain electrode are electrically coupled to each other by a connection portion that reaches the n+ layer. The p-type layer and the source electrode are electrically coupled to each other by a connection portion that reaches the p-type layer. A diode including a p-type layer and an n-type layer is provided between the source electrode and the drain electrode, to thereby prevent the breaking of an element caused by an avalanche breakdown.

14 Claims, 57 Drawing Sheets

(51) Int. Cl.
  *H01L 23/522*  (2006.01)
  *H01L 29/15*   (2006.01)
  *H01L 29/417*  (2006.01)
  *H01L 29/861*  (2006.01)
  *H01L 27/06*   (2006.01)
  *H01L 29/423*  (2006.01)
  *H01L 29/10*   (2006.01)
  *H01L 29/20*   (2006.01)

(52) U.S. Cl.
  CPC ...... *H01L 29/155* (2013.01); *H01L 29/41758* (2013.01); *H01L 29/861* (2013.01); *H01L 29/1066* (2013.01); *H01L 29/1075* (2013.01); *H01L 29/1087* (2013.01); *H01L 29/2003* (2013.01); *H01L 29/41766* (2013.01); *H01L 29/4236* (2013.01); *H01L 2924/0002* (2013.01)

(56) References Cited

U.S. PATENT DOCUMENTS

| | | |
|---|---|---|
| 2009/0166677 A1 | 7/2009 | Shibata et al. |
| 2011/0115025 A1 | 5/2011 | Okamoto |
| 2013/0248928 A1* | 9/2013 | Yoshioka ............ H01L 29/4175 257/192 |

OTHER PUBLICATIONS

Musser, M. et al., "Individual Source Vias for GaN HEMT Power Bars", 2013 European Microwave Integrated Circuits Conference, European Microwave Association, Oct. 6, 2013, pp. 184-187, Germany.

Communication Pursuant to Article 94(3) EPC received in corresponding European Application No. 14 200 603.0 dated Aug. 23, 2016.

* cited by examiner

US 9,520,489 B2

SEMICONDUCTOR DEVICE

CROSS-REFERENCE TO RELATED APPLICATIONS

The disclosure of Japanese Patent Application No. 2014-019950 filed on Feb. 5, 2014 including the specification, drawings and abstract is incorporated herein by reference in its entirety.

BACKGROUND

The present invention relates to a semiconductor device, for example, to a semiconductor device using a nitride semiconductor.

In recent years, attention has been paid to a semiconductor device which is made of compounds of Group III-V having a band gap larger than that of silicon (Si). Among them, an MISFET made of gallium nitride is advantageous in that (1) a breakdown electric field is large, (2) an electron saturation velocity is high, (3) a thermal conductivity is high, (4) an excellent heterojunction can be formed between AlGaN and GaN, and (5) gallium nitride is a material that is non-toxic and high in safety.

For example, Japanese Unexamined Patent Application Publication No. 2009-9993 discloses a semiconductor device in which an HFET having an AlGaN/GaN heterojunction structure is arranged on a silicon pin diode.

Also, Japanese Unexamined Patent Application Publication No. 2010-40814 discloses a semiconductor device in which a pn diode is coupled between a source electrode and a drain electrode of the GaN-HFET.

SUMMARY

The present inventors have been engaged in research and development of the semiconductor device using the nitride semiconductor described above, and intensively studied an improvement in the characteristics of the semiconductor device. In the process, it has been found that there is room for further improvement in the characteristics of the semiconductor device using the nitride semiconductor.

The other problems and novel features will become apparent from a description of the present specification and attached drawings.

An outline of a typical configuration in embodiments disclosed in the present application will be described in brief below.

According to an embodiment disclosed in the present application, there is provided a semiconductor device having an n-type layer, a p-type layer, a channel layer, and a barrier layer. The semiconductor device also includes a gate electrode that is arranged above the channel layer, and a source electrode and a drain electrode which are formed above the barrier layer on both sides of the gate electrode. The p-type layer and the source electrode are coupled to each other by a connection portion within a through-hole that reaches the p-type layer. Also, the n-type layer and the drain electrode are coupled to each other by a connection portion within a through-hole that reaches the n-type layer.

According to the semiconductor device described in the following typical embodiments disclosed in the present application, the characteristics of the semiconductor device can be improved.

DETAILED DESCRIPTION

Figure 1:
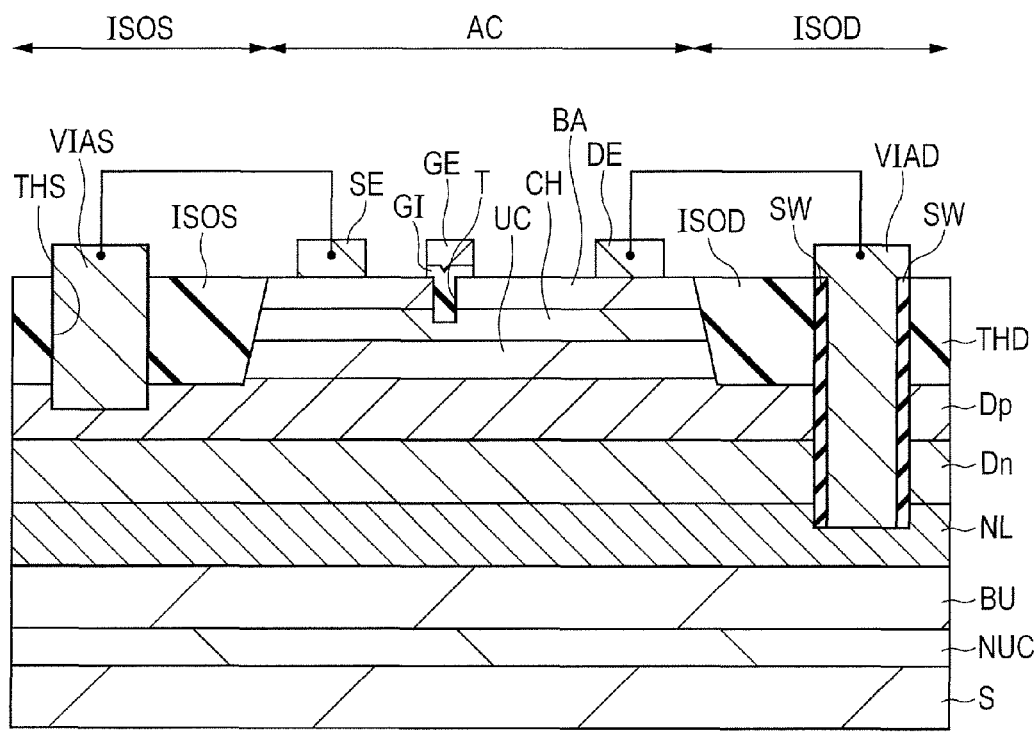
FIG. 1 is a cross-sectional view schematically illustrating a configuration of a semiconductor device according to a first embodiment.

The following embodiment is described by splitting the same into a plurality of sections or embodiments as necessary for convenience's sake, however, it is to be understood that those sections or embodiments are not unrelated to each other unless explicitly stated otherwise, but one thereof represents a part of the other thereof, a variation of the other in whole, or details, supplemental remarks, and so forth. Further, in the case where reference is made to the number, and so forth (including the number of units, a numerical value, quantity, scope, and so forth) as to elements of the following embodiment of the invention, the invention is not limited to a specified number, but the number, and so forth may be either not less than the specified number, or not more than the specified number unless explicitly stated otherwise, and unless obviously limited to the specified number on a theoretical basis.

Further, constituent elements (including a step as an element, and so forth) of the following embodiment are not always essential unless explicitly stated otherwise, and unless obviously considered essential on a theoretical basis. Similarly, when mention is made of respective shapes of constituent elements, and so forth, and position relation between the constituent elements, and so forth, in the following embodiment, the shapes, and so forth include those effectively approximate, or analogous thereto unless explicitly state otherwise, and unless obviously considered otherwise on a theoretical basis. The same can be applied to the above number (including the number of units, a numerical value, quantity, scope, and so forth).

Embodiments of the present invention will be described hereinafter with reference to the accompanying drawings. In all the drawings for use describing the embodiments, identical members are in principle denoted by like reference numerals, thereby omitting detailed description thereof. Also, if there are plural similar members (portions), symbols may be added to signs of generic names to indicate individual or specific portions. Also, in the following description, a description of the identical or same portions will be not repeated in principle unless particularly required.

Also, in some drawings used in the following embodiments, hatching may be omitted even in a cross-sectional view so as to make the drawings easy to see. Also, hatching may be added even in a plan view so as to make the drawings easy to see.

Also, in the cross-sectional views and the plan views, the sizes of the respective portions do not correspond to those of a real device, and a specific portion may be relatively largely displayed for facilitating to understand the drawings. Also, when the cross-sectional drawings correspond to the plan views, the specific portions may be relatively largely displayed for facilitation to understand the drawings.

First Embodiment

Hereinafter, a semiconductor device according to this embodiment will be described in detail with reference to the accompanying drawings.

Structure Description

FIG. 1 is a cross-sectional view schematically illustrating a configuration of a semiconductor device according to this embodiment. A semiconductor device (semiconductor element) according to this embodiment illustrated in FIG. 1 is an MIS (metal insulator semiconductor) type field effect transistor (FET) made of a nitride semiconductor. The semiconductor device can be used as a high electron mobility transistor (HEMT) type power transistor. The semiconductor device according to this embodiment is a so-called recessed gate type semiconductor device.

In the semiconductor device according to this embodiment, a nucleation layer NUC, a buffer layer BU, an n+ layer NL, an n-type layer Dn, a p-type layer Dp, a channel underlying layer UC, a channel layer (also called "electron transit layer") CH, and a barrier layer BA are made over a substrate S in the stated order. The nucleation layer NUC is formed of a nitride semiconductor layer. The buffer layer BU is formed of a nitride semiconductor layer of a single layer or plural layers in which impurities forming a deep level are doped to the nitride semiconductor. In this example, a superlattice structure (also called "superlattice layer") having plural nitride semiconductor layers is used. The n+ layer NL is formed of a nitride semiconductor layer in which n-type impurities are doped to the nitride semiconductor. The n-type layer Dn is formed of a nitride semiconductor layer in which n-type impurities are doped to the nitride semiconductor, which is a layer lower in a concentration of the n-type impurities than the n+ layer NL. The p-type layer Dp is formed of a nitride semiconductor layer in which p-type impurities are doped to the nitride semiconductor. The channel underlying layer UC is a layer that determines a lattice constant in a planar view of an upper layer, a layer smaller in the lattice constant in the planar direction than the channel underlying layer UC is subject to a tensile strain, and a layer larger in the lattice constant in the planar direction than the channel underlying layer UC is subject to a compressive strain. The channel layer CH is formed of a nitride semiconductor layer larger in the electron affinity than the channel underlying layer UC. The barrier layer BA is formed of a nitride semiconductor layer smaller in the electron affinity than the channel layer CH. An insulating film (not shown) is formed on the barrier layer BA. A cap layer may be provided between an insulating film (protective film) and the barrier layer BA. The cap layer is formed of a nitride semiconductor layer larger in the electron affinity than the barrier layer BA.

The MISFET according to this embodiment has a gate electrode GE formed through a gate insulating film GI, and a source electrode SE and a drain electrode DE which are formed on the barrier layer BA between both sides of the gate electrode GE, above the channel layer CH. The MISFET is formed in an active region AC partitioned by device isolation regions ISO. Also, the gate electrode GE is formed within a trench T that penetrates through the barrier layer BA, and reaches the portion of the channel layer CH through the gate insulating film GI. In the device isolation region ISO, an region in which a source pad SP to be described later is arranged may be indicated by a device isolation region ISOS, and an region in which a drain pad DP to be described later is arranged may be indicated by a region ISOD.

A two-dimensional electron gas (2DEG) is generated on the channel layer CH side in the vicinity of an interface between the channel layer CH and the barrier layer BA. Also, when a positive potential (threshold potential) is applied to the gate electrode GE, a channel is formed in the vicinity of an interface between the gate insulating film GI and the channel layer CH.

The two-dimensional electron gas (2DEG) is formed by the following mechanism. The nitride semiconductor layers (gallium nitride based semiconductor layers in this example) configuring the channel layer CH and the barrier layer BA are different in electron affinity (band gap) from each other, and the barrier layer BA is formed of a nitride semiconductor layer smaller in the electron affinity than the channel layer CH. For that reason, a well potential is generated on a joint surface of those semiconductor layers. Electrons are accumulated within the well potential to generate the two-dimensional electron gas (2DEG) in the vicinity of the interface between the channel layer CH and the barrier layer BA. In particular, in this example, since the channel layer CH and the barrier layer BA are epitaxially formed of a nitride semiconductor material of gallium (or aluminum) plane growth, a fixed positive polarization charge is generated on the interface of the channel layer CH and the barrier layer BA due to a spontaneous polarization effect and a piezoelectric effect, and the electrons are accumulated for attempting to neutralize the positive polarization charge. As a result, the two-dimensional electron gas (2DEG) is more likely to be formed.

The two-dimensional electron gas (2DEG) formed in the vicinity of the interface between the channel layer CH and the barrier layer BA is divided by the trench T in which the gate electrode GE is formed. For that reason, in the semiconductor device according to this embodiment, an off-state can be maintained in a state where a positive potential (threshold potential) is not applied to the gate electrode GE, and an on-state can be maintained in a state where a positive potential (threshold potential) is applied to the gate electrode GE. In this way, normally off-operation can be conducted. In the on-state and the off-state, a potential of the source electrode SE is, for example, a ground potential. Also, in the on-state, a potential higher than the source electrode SE is applied to the drain electrode DE.

Also, the channel layer CH is sandwiched between the barrier layer BA and the channel underlying layer UC which are smaller in the electron affinity than the channel layer CH, to thereby improve an electron confinement effect. As a result, the short channel effect can be suppressed, a gain can be improved, and an operating speed can be improved. Also, if the channel underlying layer UC is strained in response to the tensile stress, a negative charge caused by the piezoelectric polarization and the spontaneous polarization is induced in the interface between the channel underlying layer UC and the channel layer CH. For that reason, the threshold potential moves to a positive side. As a result, the normally-off operability can be improved. Also, when the strain of the channel underlying layer UC is reduced, because the negative charge caused by the spontaneous polarization is induced in the interface between the channel underlying layer UC and the channel layer CH, the threshold potential moves to the positive side. As a result, the normally-off operability can be improved.

Figure 2:
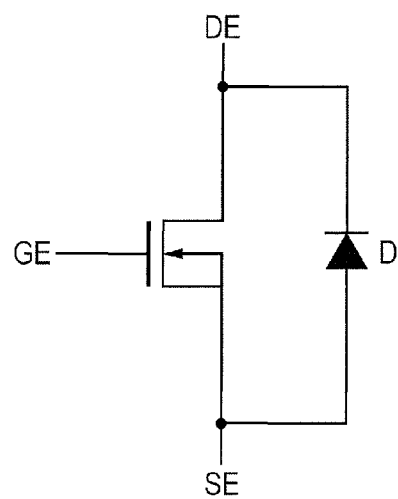
FIG. 2 is a circuit diagram illustrating a configuration of an element according to the first embodiment.

In this embodiment, a connection portion (also called "via") VIAS that penetrates through the device isolation region ISOS, and reaches the p-type layer Dp below the device isolation region ISOS is arranged. Also, a connection portion (also called "via") VIAD that penetrates through the device isolation region ISOD, and reaches the n+ layer NL below the device isolation region ISOD is arranged. The n-type layer Dn is coupled to the drain electrode (cathode electrode) DE through the connection portion VIAD, and the p-type layer Dp is coupled to the source electrode (anode electrode) SE through the connection portion VIAS. The n-type layer Dn and the drain electrode (cathode electrode) DE are coupled to each other through the n+ layer NL. A pn diode formed of the p-type layer Dp and the n-type layer Dn is arranged between the source electrode SE and the drain electrode DE. A relationship of the source electrode SE, the drain electrode DE, and the diode in the element (MISFET) is illustrated in FIG. 2. FIG. 2 is a circuit diagram illustrating a configuration of an element according to this embodiment. In order to prevent an electric connection between the connection portion VIAD and the p-type, layer Dp, a side wall insulating film SW is arranged on a side wall portion of the connection portion VIAD. A drain leakage current can be more effectively reduced by the side wall insulating film SW.

As described above, the diode formed of the p-type layer Dp and the n-type layer Dn is arranged between the source electrode SE and the drain electrode DE, to thereby prevent the breaking of the element (MISFET) caused by an avalanche breakdown, as described in detail later.

Figure 3:
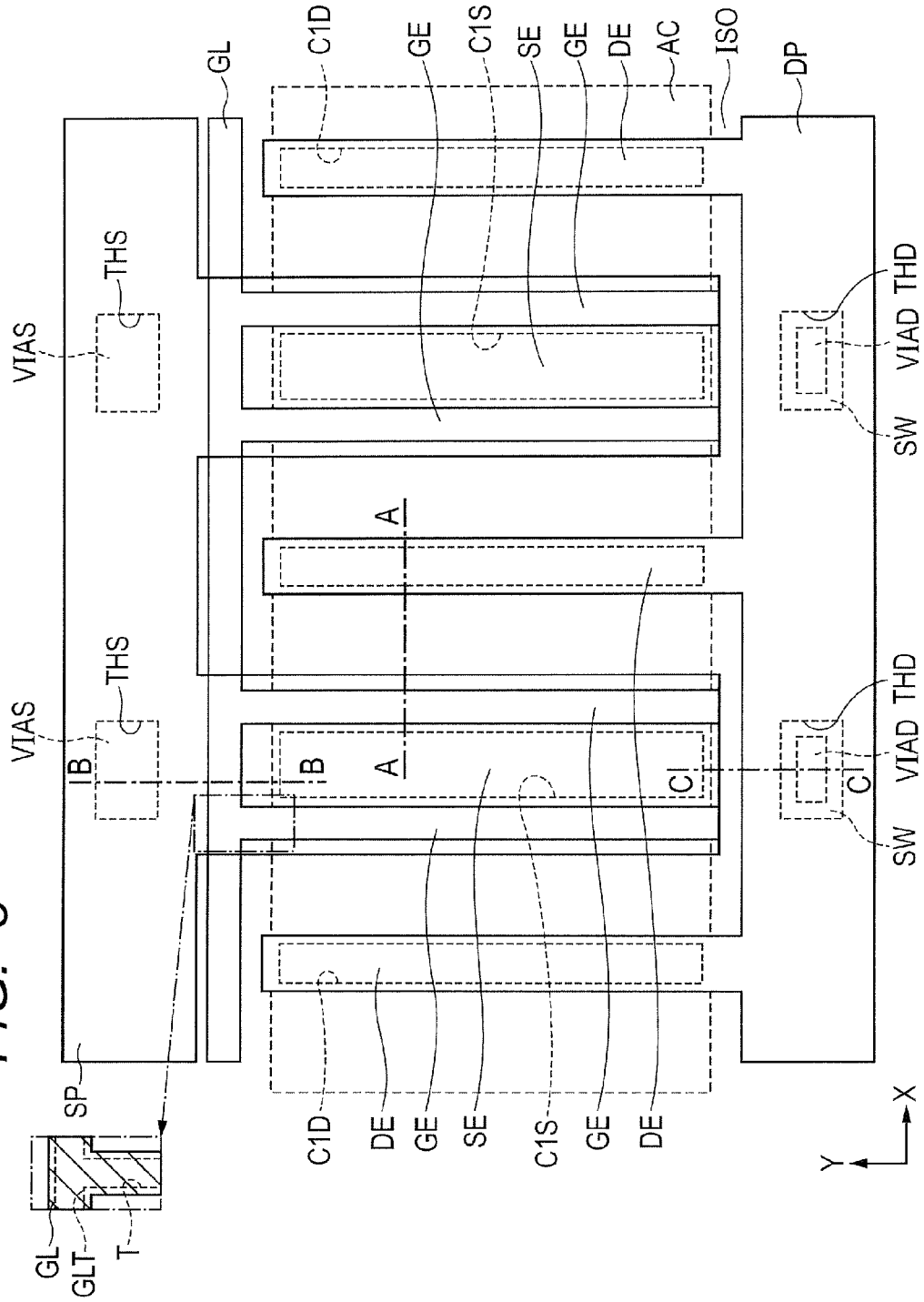
FIG. 3 is a plan view illustrating a configuration of the semiconductor device according to the first embodiment.
Figure 4:
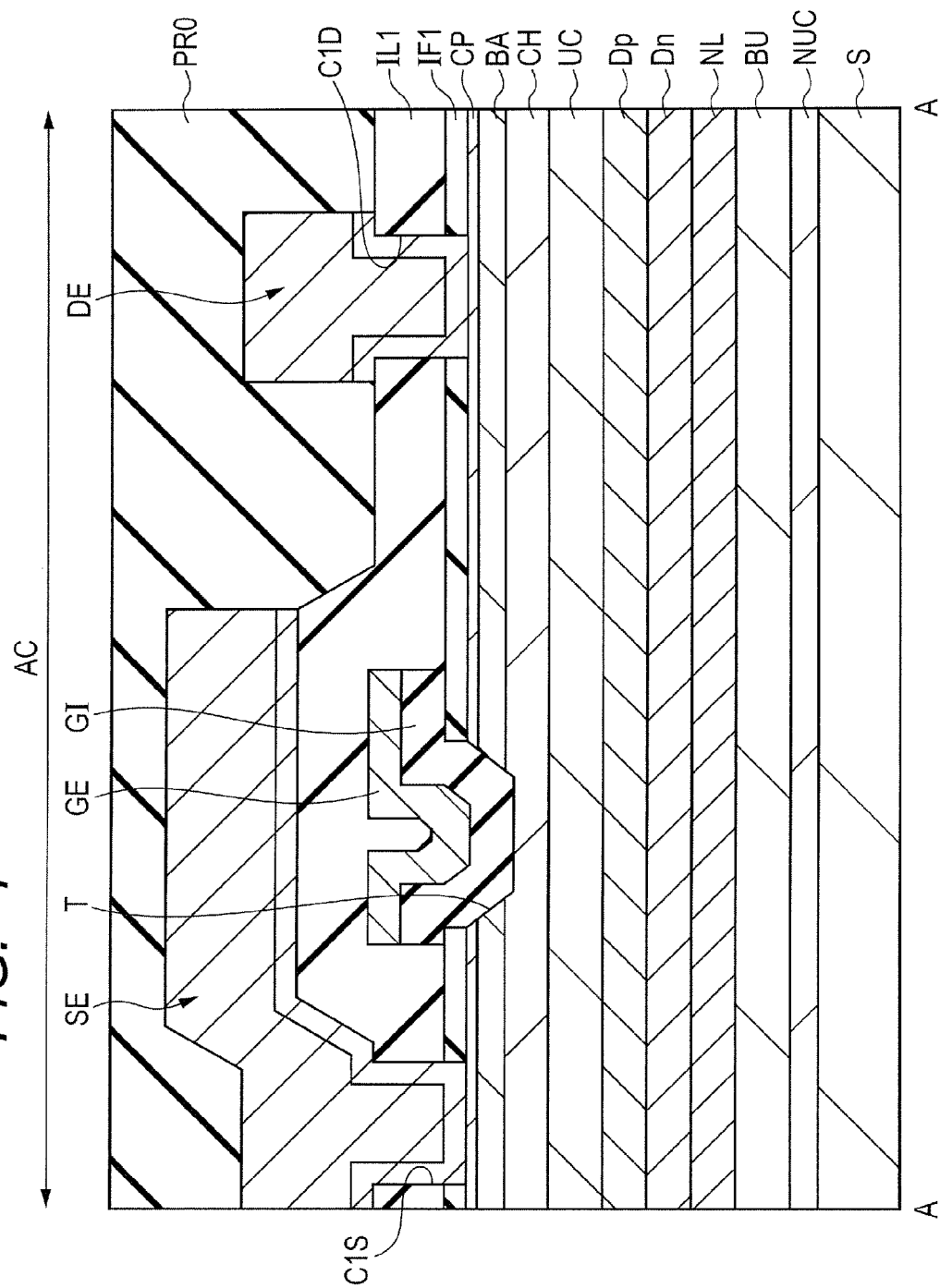
FIG. 4 is a cross-sectional view illustrating one configuration of the semiconductor device according to the first embodiment.
Figure 5:
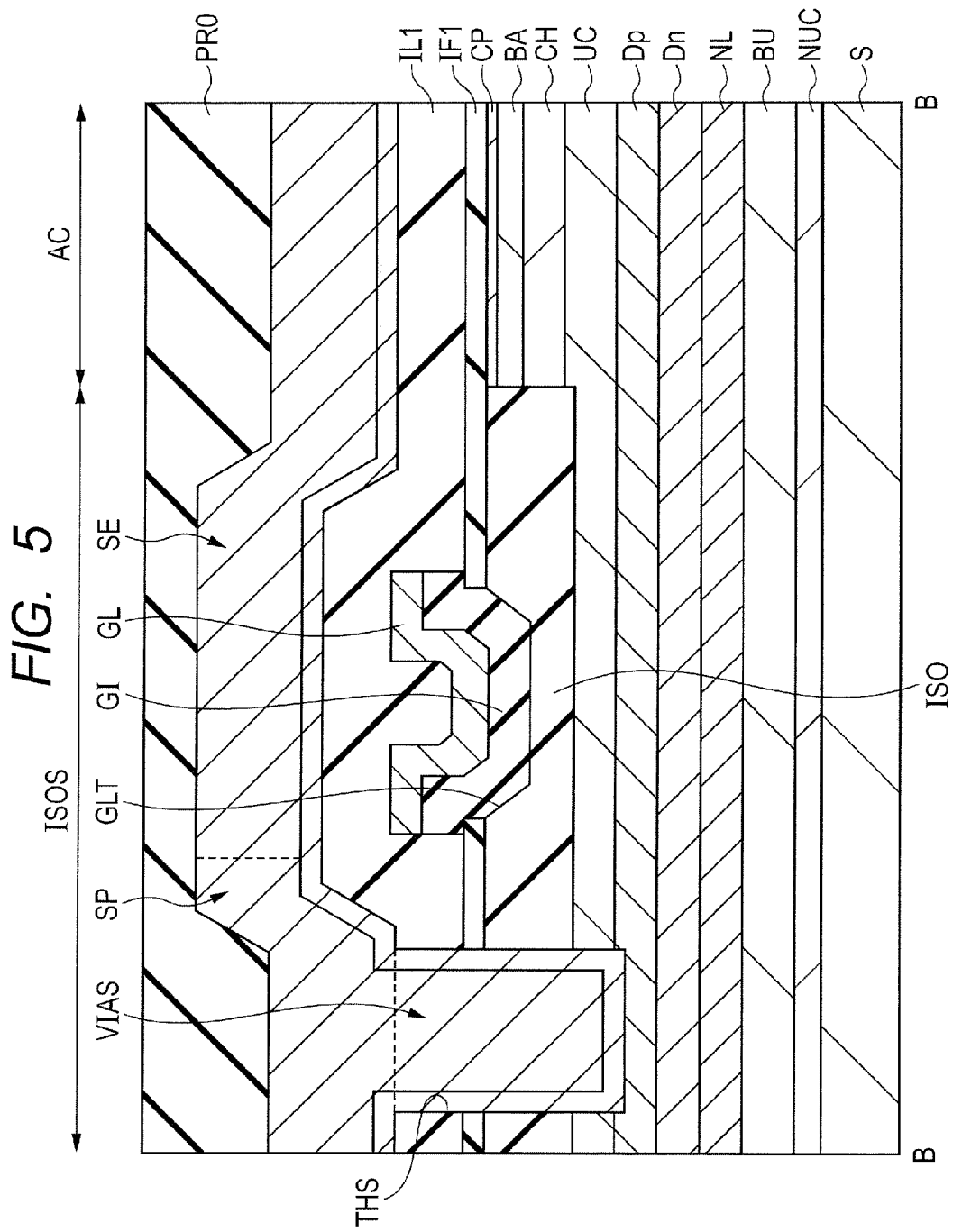
FIG. 5 is a cross-sectional view illustrating another configuration of the semiconductor device according to the first embodiment.
Figure 6:
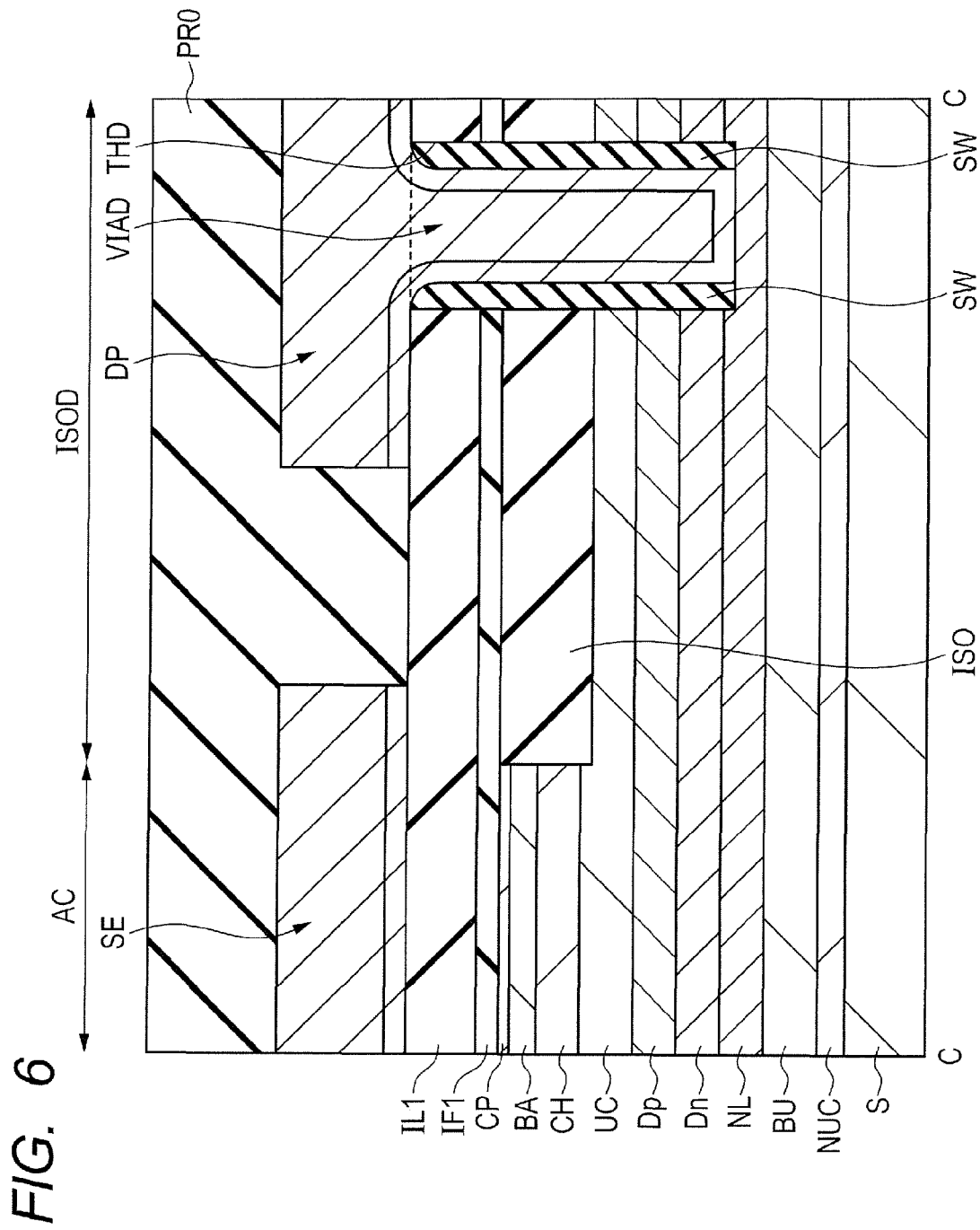
FIG. 6 is a cross-sectional view illustrating still another configuration of the semiconductor device according to the first embodiment.

The semiconductor device according to the first embodiment will be described in more detail with reference to FIGS. 3 to 6. FIG. 3 is a plan view illustrating a configuration of the semiconductor device according to this embodiment. FIGS. 4 to 6 are cross-sectional views illustrating the configuration of the semiconductor device according to this embodiment. FIG. 4 corresponds to a cross-section taken along a line A-A in FIG. 3, FIG. 5 corresponds to a cross-section taken along a line B-B in FIG. 3, and FIG. 6 corresponds to a cross-section taken along a line C-C in FIG. 3.

As illustrated in FIG. 3, a planar shape of the drain electrode DE is a rectangular shape having long sides in a Y-direction. Plural line-shaped drain electrodes DE are arranged at given intervals in the X-direction. Also, a planar shape of the source electrode SE is a rectangular shape having long sides in the Y-direction. Plural line-shaped source electrodes SE are arranged at given intervals in the X-direction. The plural source electrodes SE and the plural drain electrodes DE are alternately arranged along the X-direction. A width of each of the source electrodes SE in the X-direction is, for example, about 30 µm. A width of each of the drain electrodes DE in the X-direction is, for example, about 10 µm.

A contact hole C1D forming a connection portion between each of the drain electrodes DE and a cap layer CP (barrier layer BA) is arranged below the drain electrode DE. A planar shape of the contact hole C1D is a rectangular shape having long sides in the Y-direction. A contact hole C1S forming a connection portion between each of the source electrodes SE and the cap layer CP (barrier layer BA) is arranged below the source electrode SE. A planar shape of the contact hole C1S is a rectangular shape having long sides in the Y-direction.

The gate electrode GE is arranged between the contact hole C1D below the drain electrode DE and the contact hole C1S below the source electrode SE. The gate electrode GE has a rectangular shape having long sides in the Y-direction. Two (a pair of) gate electrodes GE are arranged below one of the source electrodes SE. Those two gate electrodes GE are arranged on both sides of the contact hole C1S below the source electrode SE. In this way, two gate electrodes GE are repetitively arranged in correspondence with the plural source electrodes SE.

The plural drain electrodes DE are coupled to each other by a drain pad (also called "terminal portion") DP. The drain pad DPa is arranged to extend in the X-direction on one end side (lower side in FIG. 3) of the drain electrode DE. In other words, the plural drain electrodes DE are arranged to protrude in the Y direction from the drain pad DPa extending in the X-direction. This configuration can be called "comb shape".

The plural source electrodes SE are coupled to each other by the source pad (also called "terminal portion") SP. The source pad SP is arranged to extend in the X-direction on the other end side (upper side in FIG. 3) of the source electrode SE. In other words, the plural source electrodes SE are arranged to protrude in the Y-direction from the source pad SP extending in the X-direction. This configuration can be called "comb shape".

The plural gate electrodes GE are coupled to each other by a gate line GL. The gate line GL is arranged to extend in the X-direction on one end side (upper side in FIG. 3) of the gate electrode GE. In other words, the plural gate electrodes GE are arranged to protrude in the Y-direction from the gate line GL extending in the X-direction. In other words, the plural gate electrodes GE are arranged to protrude in the Y-direction from the gate line GL extending in the X-direction. The gate line GL is coupled to, for example, gate pads (not shown) arranged on both sides (right side and left side in FIG. 3) of the gate line GL in the X-direction.

In this example, the source electrode SE, the drain electrode DE, and the gate electrode GE are mainly arranged in the active region AC surrounded by the device isolation region ISO. A planar shape of the active region AC is a rectangular shape having long sides in the X-direction. On the other hand, the drain pad DPa, the gate line GL, and the source pad SP are arranged in the device isolation region ISO. The gate line GL is arranged between the active region AC and the source pad SP.

A through-hole (also called "hole", "aperture", or "recess") THS is arranged under the source pad SP. A conductive film is embedded in the through-hole THS to form the connection portion VIAS. As will be described later, the connection portion VIAS is electrically coupled to the drain pad DPa. Hence, the source electrode SE and the p-type layer Dp are electrically coupled to each other through the source pad SP and the connection portion VIAS.

Also, a through-hole (also called "hole", "aperture", or "recess") THD is arranged under the drain pad DP. A conductive film is embedded in the through-hole THD to form the connection portion VIAD. As will be described later, the connection portion VIAD is electrically coupled to the n-type layer Dn directly or through the n+ layer NL. Hence, the drain electrode DE and the n-type layer Dn are electrically coupled to each other through the drain pad DP and the connection portion VIAD. The side wall insulating film SW is arranged on a side wall of the through-hole THD.

As illustrated in FIGS. 4 to 6, the MISFET according to this embodiment includes the gate electrode GE formed in the active region AC and the source electrode SE and the drain electrode DE which are formed in formation regions of the contact holes (C1S, C1D) on the cap layer CP on both sides of the gate electrode GE. A protective film (also called "insulating film", "cover film", or "surface protective film") PRO is arranged on the source electrode SE and the drain electrode DE.

As described above, the nucleation layer NUC, the buffer layer BU, the n+ layer NL, the n-type layer Dn, the p-type layer Dp, the channel underlying layer UC, the channel layer (also called "electron transit layer") CH, the barrier layer BA, the cap layer CP, and an insulating film IF1 are formed over the substrate S in the stated order. The gate electrode GE is formed within the trench T that penetrates through the insulating film IF1, the cap layer CP, and the barrier layer BA, and reaches a middle portion of the channel layer CH through the gate insulating film GI.

The substrate S can be made of a conductive semiconductor substrate made of, for example, silicon (Si). The substrate S may be made of a substrate made of nitride semiconductor such as GaN except for silicon described above, or may be made of a substrate made of AlN, SiC or sapphire. In particular, because the nitride semiconductor such as GaN has a defect to prone to n-type, if a substrate made of a different kind of material such as GaN different from that of the nitride semiconductor is used, the substrate side larger in the number of crystal defects prones to n-type. For that reason, it is more effective to apply this invention, when the substrate made of the material different from the nitride semiconductor such as GaN is used.

The nucleation layer NUC is formed for the purpose of generating crystal nuclei when a layer formed on the upper portion such as the buffer layer BU grows. Also, the nucleation layer NUC is formed for the purpose of preventing the substrate S from metamorphosing by allowing a constituent element (for example, Ga) of a layer formed on the upper portion to diffuse into the substrate S from the layer formed on the upper portion. The nucleation layer NUC can be formed of, for example, an aluminum nitride (AlN) layer. A thickness of the AlN layer is about 200 nm. A material or a thickness of the nucleation layer NUC can be appropriately selected depending on a material of the substrate S, or the intended purpose of the semiconductor device. Also, if the substrate S is made of a GaN substrate, or if the substrate S is unnecessary depending on the formation conditions of the buffer layer, the nucleation layer NUC can be omitted.

The buffer layer BU is formed for adjusting a lattice constant, improving the crystalline of the nitride semiconductor formed above, and also reducing a film stress of the stacked nitride semiconductor. With this configuration, the crystalline of the nitride semiconductor is improved. Also, the strain (internal stress) of the substrate S can be reduced, and the substrate S can be surpressed from being warped or cracked. The buffer layer BU, a super lattice structure comprising a stacked film (AlN/GaN film) of a gallium nitride (GaN) layer and an aluminum nitride (AlN) layer stacked by a plurality of periods can be used. The superlattice structure is configured so that two or more (stacked) layers each formed of nitride semiconductor layers different in the electron affinity from each other are repetitively arranged. The superlattice structure is doped with carbon (C). For example, the superlattice structure can be used in which a thickness of the GaN layer is set to about 20 nm, a thickness of the AlN layer is set to about 5 nm, and those stacked films are deposited in 40 cycles. A carbon concentration (doping amount) is, for example, about $1 \times 10^{19}$ (1E19) $cm^{-3}$. The materials and the thicknesses of the respective films configuring the stacked film can be appropriately selected depending on the intended purpose of the semiconductor device. Also, the buffer layer BU may include a layer other than the superlattice structure. For example, another material film may be formed on the superlattice structure. Also, the buffer layer BU can be formed of a single-layer film including no superlattice structure.

The superlattice structure and the above single-layer film can be made of AlN and GaN as well as InN. Also, mixed crystal of those nitride semiconductors may be used. For example, the stacked film of the superlattice structure can be formed of, for example, an AlGan layer or an InAlN layer.

In the above configuration, the superlattice structure is doped with carbon, but may be doped with other impurities. The doping impurities are preferably an element that forms a deeper level, and may be made of carbon as well as a transition metal such as iron (Fe), magnesium (Mg), or Beryllium (Be). The doping amount and the impurity element can be appropriately selected depending on the intended purpose of the semiconductor device.

The n+ layer NL can be formed of, for example, a GaN layer doped with n-type impurities. The n+ layer NL may be formed of the GaN layer as well as an AlN layer or an InN layer. Also, the mixed crystal of those nitride semiconductors may be used. The n-type impurities can be made of, for example, Si, and a concentration of the n-type impurities can be set to, for example, about $1\times10^{19}$(1E19) cm$^{-3}$. A thickness of the n+ layer NL is about 200 nm. Also, the n+ layer NL may be of a multilayer structure. In this case, a multilayer structure in which layers different in impurity concentration are provided for an upper layer and a lower layer of the layer containing the impurities may be applied. Also, a layer that is unintentionally doped with impurities may be arranged in the multilayer structure. The n-type impurities may be made of Si as well as Oxygen (O), sulfur (S) or selenium (Se). As the n-type impurities, the n+ layer NL may be doped with impurities of the amount as large as an electric conductivity occurs (for example, when the dopant is Si, and the film thickness is about 200 nm as in this embodiment, the doping amount is about $5\times10^{16}$ (5E106) cm$^{-3}$ or higher). However, because an excellent ohmic contact is obtained with the high concentration doping, the doping amount of $5\times10^{18}$(5E18) cm$^{-3}$ or higher is preferable.

The n-type layer Dn can be formed of, for example, a GaN layer doped with n-type impurities. The n-type layer Dn may be formed of an AlN layer or an InN layer in addition to the GaN layer. Also, the mixed crystal of those nitride semiconductors may be used. The concentration of the n-type impurities in the n-type layer Dn is lower than the concentration of the n-type impurities of the n+ layer NL. The n-type impurities can be made of, for example, Si, and a concentration of the n-type impurities can be set to, for example, about $3\times10^{16}$ (3E16) cm$^{-3}$. The thickness of the n-type layer Dn is about 1000 nm. The material, the impurity concentration, and the film thickness can be appropriately selected depending on a breakdown voltage. Also, the n-type layer Dn may be of a multilayer structure. In this case, a multilayer structure in which layers different in impurity concentration are provided for an upper layer and a lower layer of the layer containing the impurities may be applied. Also, a layer that is unintentionally doped with impurities may be arranged in the multilayer structure. The n-type impurities may be made of Si as well as S or Se. However, if the impurity concentration is too high, a punch-through phenomenon is likely to be occurred, resulting in a risk that a drain breakdown voltage drops. For that reason, it is preferable to adjust the impurity concentration so that the activated donor concentration becomes equal to or lower than $5\times10^{17}$(5E17) cm$^{-3}$.

The p-type layer Dp can be formed of, for example, a GaN layer doped with p-type impurities. The p-type layer Dp may be formed of an AlN layer or an InN layer in addition to the GaN layer. Also, the mixed crystal of those nitride semiconductors may be used. The concentration of the p-type impurities can be made of, for example, Mg, and a concentration of the p-type impurities can be set to, for example, about $5\times10^{17}$ (5E17) cm$^{-3}$. The thickness of the p-type layer Dp is about 1000 nm. The material, the impurity concentration, and the film thickness can be appropriately selected depending on a breakdown voltage. Also, the p-type layer Dp may be of a multilayer structure. In this case, a multilayer structure in which layers different in impurity concentration are provided for an upper layer and a lower layer of the layer containing the impurities may be applied. Also, a layer that is unintentionally doped with impurities may be arranged in the multilayer structure. The p-type impurities may be made of Mg as well as Beryllium (Be) or carbon (C). However, if the impurity concentration is too high, a punch-through phenomenon is likely to be occurred, resulting in a risk that a drain breakdown voltage drops. For that reason, it is preferable to adjust the impurity concentration so that the activated acceptor concentration becomes equal to or lower than $5\times10^{17}$(5E17) cm$^{-3}$. It is conceivable to activate about 10% of the impurity concentration. However, because an activation ratio can be varied according to the activated annealing condition, the activation ratio may be adjusted as occasion demands.

The channel underlying layer UC can be formed of, for example, an AlGaN layer. The channel underlying layer UC is unintentionally doped with impurities. A thickness of the AlGaN layer is, for example, 1000 nm, and the composition of Al is about 5%. The channel underlying layer UC can be formed of the AlGaN layer as well as GaN, AlN, or InN. Also, the mixed crystal of those nitride semiconductors may be used. The mixed crystal can be formed of, for example, an InAlN layer. A material or a thickness of the channel underlying layer UC can be appropriately selected depending on the intended purpose of the semiconductor device. In this embodiment, the nondoped channel underlying layer UC is used, however, may be appropriately doped with impurities according to the intended purpose. The doped impurities can be formed of n-type impurities or p-type impurities. The n-type impurities are, for example, Si, S, or Se, and the p-type impurities are, for example, Be, C, or Mg. However, because the breakdown voltage drops by high-concentration doping, it is preferable that the doping amount of the impurities is equal to or lower than $1\times10^{16}$ (1E16) cm$^{-3}$.

The channel underlying layer UC may be omitted. However, as described above, the normally-off operability can be improved by the channel underlying layer UC. In this embodiment, a lattice constant of the channel underlying layer UC in an in-plane direction is taken over to the channel layer CH or the barrier layer BA which are upper layers of the channel underlying layer UC by epitaxial growth. For example, if a layer larger in the lattice constant than the channel underlying layer UC, for example, a GaN layer, an $In_xGa_{(1-x)}N$ layer ($0 \leq X \leq 1$), or an InAlN layer is formed in an upper layer of the channel underlying layer UC, a compressive strain is applied to the upper layer. Conversely, a layer smaller in the lattice constant than the channel underlying layer (AlGaN layer) UC, for example, an InAlN layer which is higher in Al composition ratio is formed on the upper layer of the channel underlying layer UC, a tensile strain is applied to the upper layer. For that reason, as described above, the normally-off operability can be improved.

The channel layer CH can be formed of, for example, a GaN layer. The channel layer CH is unintentionally doped with impurities. Also, a thickness of the GaN layer is, for example, 80 nm. The channel layer CH can be made of GaN as well as AlN or InN. Also, the mixed crystal of those nitride semiconductors may be used. A material or a thickness of the channel layer CH can be appropriately selected depending on the intended purpose of the semiconductor device. In this embodiment, the nondoped channel layer CH is used, however, may be appropriately doped with impurities according to the intended purpose. The doped impurities can be formed of n-type impurities or p-type impurities. The n-type impurities are, for example, Si, S, or Se, and the p-type impurities are, for example, Be, C, or Mg.

However, because the channel layer CH is a layer in which electrons travel, if the doping amount of impurities is too large, there is a risk that the mobility decreases due to Coulomb scattering. Under the circumstances, it is preferable that the doping amount of the impurities into the channel layer CH is equal to or lower than $1\times10^{17}$(1E17) cm$^{-3}$.

Also, the channel layer CH needs to be made of a nitride semiconductor larger in the electron affinity than the channel underlying layer UC and the barrier layer BA. As described above, if the channel underlying layer UC is formed of the AlGaN layer, the channel layer CH is formed of the GaN layer, and the lattice constants of those layers are different from each other, the thickness of the channel layer CH needs to be equal to or lower than a critical film thickness at which dislocation increases.

The barrier layer BA can be formed of, for example, an $Al_{0.2}Ga_{0.8}N$ layer. Also, a thickness of the $Al_{0.2}Ga_{0.8}N$ layer is, for example, about 30 nm. The barrier layer BA can be made of GaN as well as AlN or InN. Also, the mixed crystal of those nitride semiconductors may be used. The mixed crystal can be formed of, for example, an InAlN layer. A composition ratio of Al may be appropriately adjusted. Also, the barrier layer BA having a multilayer structure in which films different in the composition ratio of Al from each other are stacked on each other may be used. Also, the barrier layer BA can be formed of a GaN layer, an AlN layer, or an InN layer. Also, the mixed crystal of those nitride semiconductors may be used. The material or the thickness of the barrier layer BA may be appropriately selected depending on the intended purpose of the semiconductor device. The barrier layer BA may be formed of a nondoped layer, and may be appropriately doped with impurities depending on the intended purpose. The doping impurities can be formed of the n-type impurities or the p-type impurities. The n-type impurities are made of, for example, Si, S, or Se, and the p-type impurities are made of, for example, Be, C, or Mg. If the doping amount of the impurities in the barrier layer BA is too large, the barrier layer BA is liable to be affected by the potential of the drain electrode DE in the vicinity of the gate electrode GE which will be described later, and the breakdown voltage may drop. Also, because the impurities in the barrier layer BA may cause the Coulomb scattering in the channel layer CH, the mobility of electrons may decrease. Under the circumstances, it is preferable that the doping amount of the impurities into the barrier layer BA is equal to or lower than $1\times10^{17}$ (1E17) cm$^{-3}$. Also, it is more preferable to use the nondoped barrier layer BA.

Also, if the channel layer CH is formed of the GaN layer, the barrier layer BA is formed of the AlGaN layer, and the lattice constants of those layers are different from each other, the thickness of the barrier layer BA needs to be equal to or lower than a critical film thickness at which dislocation increases.

Also, as described above, the barrier layer BA needs to be made of the nitride semiconductor smaller in the electron affinity than the channel layer CH. However, when the barrier layer BA having the multilayer structure is used, a layer larger in the electron affinity than the channel layer CH may be included in the multilayer, and at least one layer needs to be smaller in the electron affinity than the channel layer CH.

The cap layer CP can be formed of, for example, a GaN layer. The thickness of the GaN layer is, for example, about 2 nm. Also, the cap layer CP can be formed of the GaN layer as well as the AlN layer or the InN layer. Also, the mixed crystal (for example, AlGaN, InAlN) of those nitride semiconductors may be used. Also, the cap layer CP may be omitted.

Also, the cap layer CP needs to be made of a nitride semiconductor larger in the electron affinity than the barrier layer BA. Also, the cap layer CP may be formed of a nondoped layer, or may be appropriately doped with impurities depending on the intended purpose. The doping impurities can be formed of the n-type impurities or the p-type impurities. The n-type impurities are made of, for example, Si, S, or Se, and the p-type impurities are made of, for example, Be, C, or Mg.

Also, if the channel underlying layer UC is formed of the AlGaN layer, the cap layer CP is formed of the GaN layer, and the lattice constants of those layers are different from each other, the thickness of the cap layer CP needs to be equal to or lower than a critical film thickness at which dislocation increases.

The insulating film IF1 can be formed of, for example, a silicon nitride film. The thickness of the silicon nitride film is, for example, about 100 nm. Also, the insulating film IF1 may be formed of an insulating film other than the silicon nitride film. Also, the insulating film IF1 may be of a stacked structure including plural kinds of insulating films. The material and the thickness of the insulating film IF1 can be appropriately selected depending on the intended purpose of the semiconductor device. It is preferable that the insulating film IF1 is larger in the band gap and smaller in the electron affinity than the nitride semiconductor which is a lower layer of the insulating film IF1. As films that satisfy the above conditions, there are the silicon nitride film (SiN) as well as a silicon oxide ($SiO_2$) film, a silicon oxynitride film, an silicon oxycarbide (SiOC) film, an aluminum oxide ($Al_2O_3$, alumina) film, a hafnium oxide ($HfO_2$) film, and a zirconium oxide ($ZrO_2$) film. Also, the respective kinds of organic films satisfy the above conditions. Further, it is preferable to select films lower in interface level density formed in an interface with the nitride semiconductor which is a lower layer thereof for the purpose of current collapse suppression in the active region AC, among the above films.

The gate electrode GE is formed within a trench (also called "recess") T that penetrates through the insulating film IF1, the cap layer CP, and the barrier layer BA, and is trenched to a middle portion of the channel layer CH through the gate insulating film GI.

The gate electrode GE may be of a stacked structure having several kinds of insulating films. The thickness of the aluminum oxide film is, for example, about 50 nm. The gate insulating film GI may be formed of an insulating film other than the aluminum oxide film. Also, the insulating film IF1 may be of a stacked structure including plural kinds of insulating films. The material and the thickness of the gate insulating film GI can be appropriately selected depending on the intended purpose of the semiconductor device. It is preferable that the gate insulating film GI is larger in the band gap and smaller in the electron affinity than the nitride semiconductor which is a lower layer of the gate insulating film GI. As films that satisfy the above conditions, there are the aluminum oxide film as well as a silicon oxide (5102) film, a silicon nitride film (SiN), a silicon oxynitride film (SiON), a hafnium oxide ($HfO_2$) film, and a zirconium oxide ($ZrO_2$) film. Because the gate insulating film GI affects a voltage that can be applied to the gate electrode GE, and a threshold voltage, it is preferable to set the gate insulating film GI taking a dielectric withstand voltage, a dielectric constant, and a film thickness into consideration.

The gate electrode GE can be formed of a titanium nitride (TiN) film. The thickness of the titanium nitride film is, for example, about 200 nm. The gate electrode GE may be formed of a conductive film other than the titanium nitride film. For example, the gate electrode GE may be formed of a polycrystal silicon film doped with impurities such as boron (B) or phosphorus (P). Also, the gate electrode GE may be made of metal such as Ti, Al, Ni, or Au. Also the gate electrode GE may be made of a compound film (metal silicide film) including a metal of Ti, Al, Ni, or Au, and Si. Also, the gate electrode GE may be made of TiN as well as nitride of a metal film made of Al, Ni, or Au. Also, the gate electrode GE may be of a stacked structure including several kinds of conductive films. The material and the thickness of the gate electrode GE can be appropriately selected depending on the intended purpose of the semiconductor device.

Also, it is preferable that the gate electrode GE is selected from a material that hardly reacts with a lower film (for example, the gate insulating film GI) or an upper film (for example, an interlayer insulating film IL1).

The interlayer insulating film IL1 is arranged on the gate electrode GE. The interlayer insulating film IL1 has the through-holes THS, THD, and the contact holes C1S, C1D.

The interlayer insulating film IL1 can be formed of, for example, a silicon oxide film. The thickness of the silicon oxide film is, for example, about 2000 nm. Also, the interlayer insulating film IL1 may be formed of an insulating film other than the silicon oxide film. Also, the interlayer insulating film IL1 may be of a stacked structure including several kinds of insulating films. The material and the thickness of the interlayer insulating film IL1 can be appropriately selected depending on the intended purpose of the semiconductor device. It is preferable that the interlayer insulating film IL1 is larger in the band gap and smaller in the electron affinity than the nitride semiconductor which is a lower layer of the interlayer insulating film IL1. Also, it is preferable that the interlayer insulating film IL1 is selected from a material that hardly reacts with the gate electrode GE that contacts with the interlayer insulating film IL1. As films that satisfy the above conditions, there are the silicon oxide film as well as a silicon nitride film, a silicon oxynitride film, an aluminum oxide ($Al_2O_3$) film, a hafnium oxide ($HfO_2$) film, and a zirconium oxide ($ZrO_2$) film.

A conductive film is formed on the interlayer insulating film IL1 including the through-holes THS, THD, and the contact holes C1S, C1D. In this example, the conductive film is formed of stacked films of a TiN film and an Al film. Among the stacked films, a stacked film on the contact holes C1S and C1D forms the source electrode SE or the drain electrode DE. On the other hand, the stacked film within the through-hole THS forms the connection portion VIAS. Also, the stacked film within the through-hole THD forms the connection portion VIAD. The side wall insulating film SW is arranged on a side wall of the through-hole THD.

The source electrode SE and the drain electrode DE can be each formed of a stacked film of a TiN film and an Al layer formed on the TiN film. The thickness of the TiN film is, for example, about 50 nm, and the thickness of the Al layer is, for example, about 1000 nm. The source electrode SE and the drain electrode DE can be made of a material that comes in ohmic contact with the nitride semiconductor layer (cap layer CP) of a bottom of the contact holes (C1S, C1D). In particular, if the nitride semiconductor layer (cap layer CP) in the bottom of the contact holes (C1S, C1D), or the nitride semiconductor layer that is a lower layer of that layer is doped with the n-type impurities, the source electrode SE and the drain electrode DE easily come in ohmic contact with the nitride semiconductor layer. Hence, the source electrode SE and the drain electrode DE can be selected from an extensive material group. Also, it is preferable that the material of the source electrode SE and the drain electrode DE can be selected from a material that hardly react with the interlayer insulating film IL1 that contacts with the source electrode SE and the drain electrode DE. The source electrode SE and the drain electrode DE may be formed of a metal film made of Ti, Al, Mo (Molybdenum), Nb (niobium), or V (vanadium). Also, a mixture (alloy) of those metals, a compound film (metal silicide film) of those metals and Si, or nitride of those metals can be used. Also, the source electrode. SE and the drain electrode DE may be formed of a stacked film of those materials.

The connection portion VIAS can be formed of a stacked film of the TiN film and the Al layer formed on the TiN film as with the above-mentioned source electrode SE. The thickness of the TiN film is, for example, about 50 nm, and the thickness of the Al layer is, for example, about 1000 nm. If a diode configured by the p-type layer Dp and the n-type layer Dn operates, the connection portion VIAS functions as an anode electrode. The connection portion VIAS may be made of a material that comes in ohmic contact with the nitride semiconductor layer (p-type layer Dp) in the bottom of the through-hole THS. It is preferable that the connection portion VIAS is formed of a metal film made of Ti, Ni, Pt (platinum), Rh (rhodium), Pd (paradigm), Ir (iridium), Cu (cupper), or Ag (silver), a mixture (alloy) of those metals, a compound film (metal silicide film) of those metals and Si, or nitride of those metals. Also, the connection portion VIAS may be formed of a stacked film of those materials.

Also, in this embodiment, the bottom surface, of the through-hole THS is arranged in the middle portion of the p-type layer Dp, and the connection portion VIAS is arranged within the through-hole THS. However, the connection portion VIAS has only to be arranged to come in contact with the p-type layer Dp. For example, the bottom surface of the through-hole THS may be arranged on an upper surface of the p-type layer Dp so that the bottom of the connection portion VIAS comes in contact with the p-type layer Dp.

As with the above-mentioned drain electrode DE, the connection portion VIAD can be formed of a stacked film of the TiN film and the Al film formed on the TiN film. The thickness of the TiN film is, for example, about 50 nm, and the thickness of the Al layer is, for example, about 1000 nm. If a diode configured by the n-type layer Dn and the n-type layer Dn operates, the connection portion VIAD functions as a cathode electrode. The connection portion VIAD may be made of a material that comes in ohmic contact with the nitride semiconductor layer (n+ type layer NL) in the bottom of the through-hole THD. It is preferable that the connection portion VIAD is formed of a metal film made of Ti, Al, Mo (Molybdenum), Nb (niobium), or V (vanadium), a mixture (alloy) of those metals, a compound film (metal silicide film) of those metals and Si, or nitride of those metals. Also, the connection portion VIAD may be formed of a stacked film of those materials.

Also, in this embodiment, the connection portion VIAD is arranged to come in contact with the n+ layer NL. However, the connection portion VIAD has only to be arranged to come in contact with the n+ layer NL or the n-type layer Dn. For example, the bottom surface of the through-hole THD may be arranged in the middle portion of the n-type layer Dn so that the bottom of the connection portion VIAD comes in contact with the n-type layer Dn. Also, the connection portion VIAD may be arranged to come in contact with the upper surface of the n-type layer Dn. Alternatively, the connection portion VIAD may be arranged to come in contact with the upper surface of the n+ layer NL.

Also, the n+ layer NL may be omitted, and the connection portion VIAD may be coupled to the n-type layer Dn. If the connection portion VIAD is arranged to come in contact with the n+ layer NL, a resistance between the source electrode SE and the drain electrode DE which are coupled through the pn diode becomes small, thereby being capable of more effectively preventing the element from being broken by the avalanche breakdown.

Also, as described above, the side wall insulating film SW is arranged on the side surface of the through-hole THD. The side wall insulating film SW can be formed of, for example, a silicon nitride film. The thickness of the silicon nitride film is, for example, about 100 nm. Also, the side wall insulating film SW may be formed of an insulating film other than the silicon nitride film. Also, the side wall insulating film SW may be of a stacked structure of several kinds of insulating films.

As described above, each of the source pad SP and the drain pad DP is integrated with the source electrode SE and the drain electrode DE. Hence, the source pad SP and the drain pad DP are made of the same material of the source electrode SE and the drain electrode DE. The connection portion VIAS is arranged below the source pad SP (FIGS. 3 and 5), and the connection portion VIAD is arranged below the drain pad DP (FIGS. 3 and 6).

The protective film PRO can be formed of an insulating film such as a silicon oxynitride (SiON) film.

(Description of Manufacturing Method)

Subsequently, a description will be given of a method of manufacturing the semiconductor device according to this embodiment while the configuration of the semiconductor device will be more clarified, with reference to FIGS. 7 to 34. FIGS. 7 to 34 are cross-sectional views or plan views illustrating a process of manufacturing the semiconductor device according to this embodiment.

Figure 7:
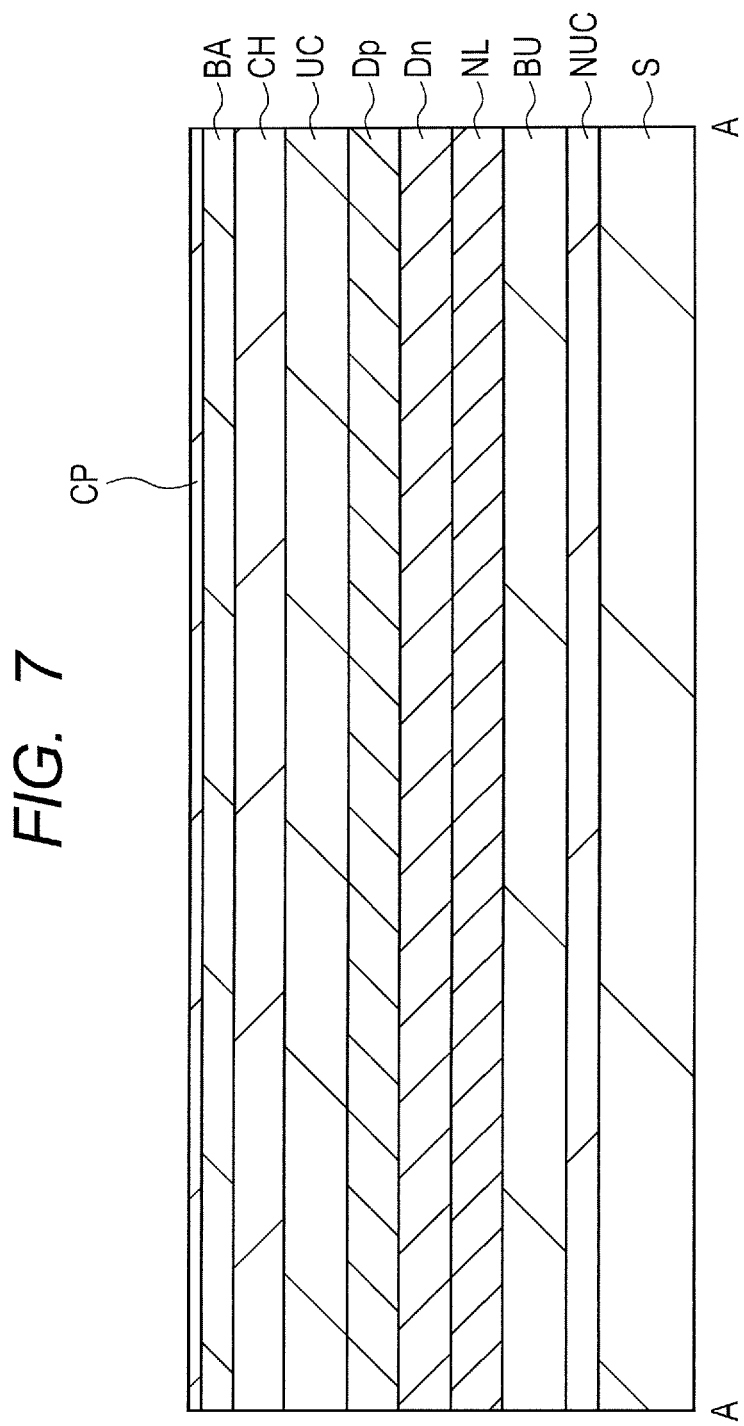
FIG. 7 is a cross-sectional view illustrating a process of manufacturing the semiconductor device according to the first embodiment.
Figure 8:
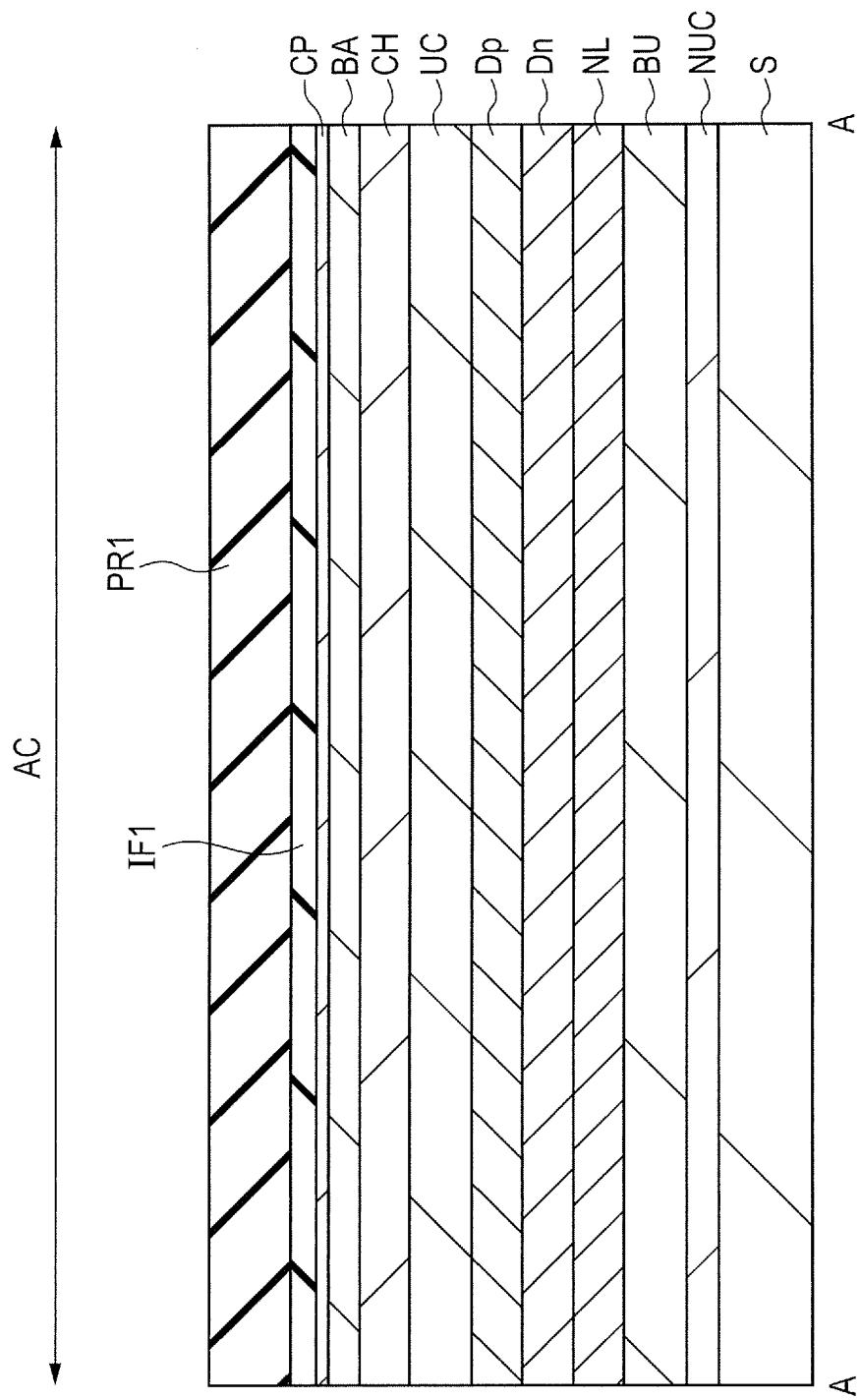
FIG. 8 is a cross-sectional view illustrating a process of manufacturing the semiconductor device according to the first embodiment, which is a cross-sectional view illustrating a manufacturing process subsequent to FIG. 7.
Figure 9:
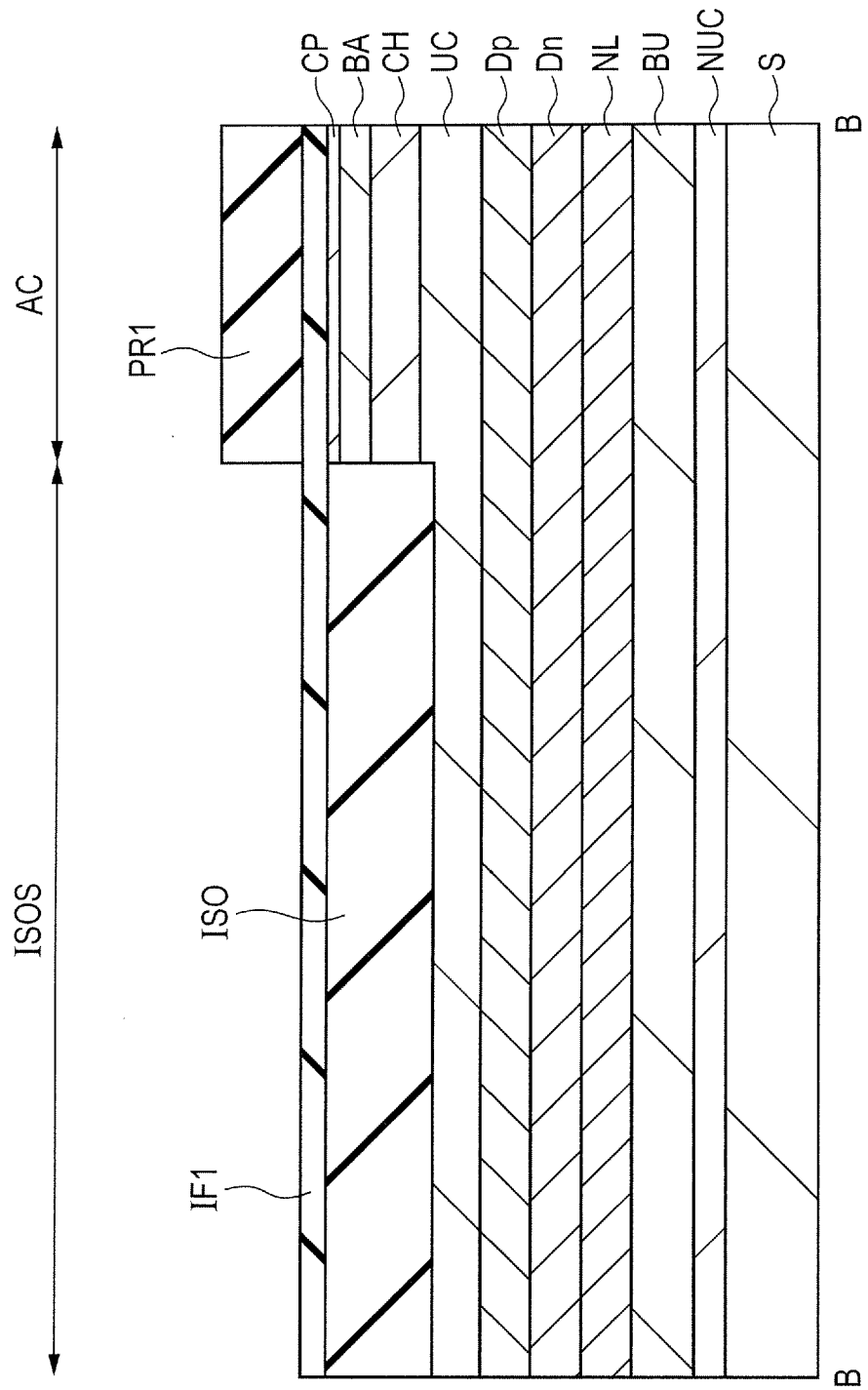
FIG. 9 is a cross-sectional view illustrating a process of manufacturing the semiconductor device according to the first embodiment.
Figure 10:
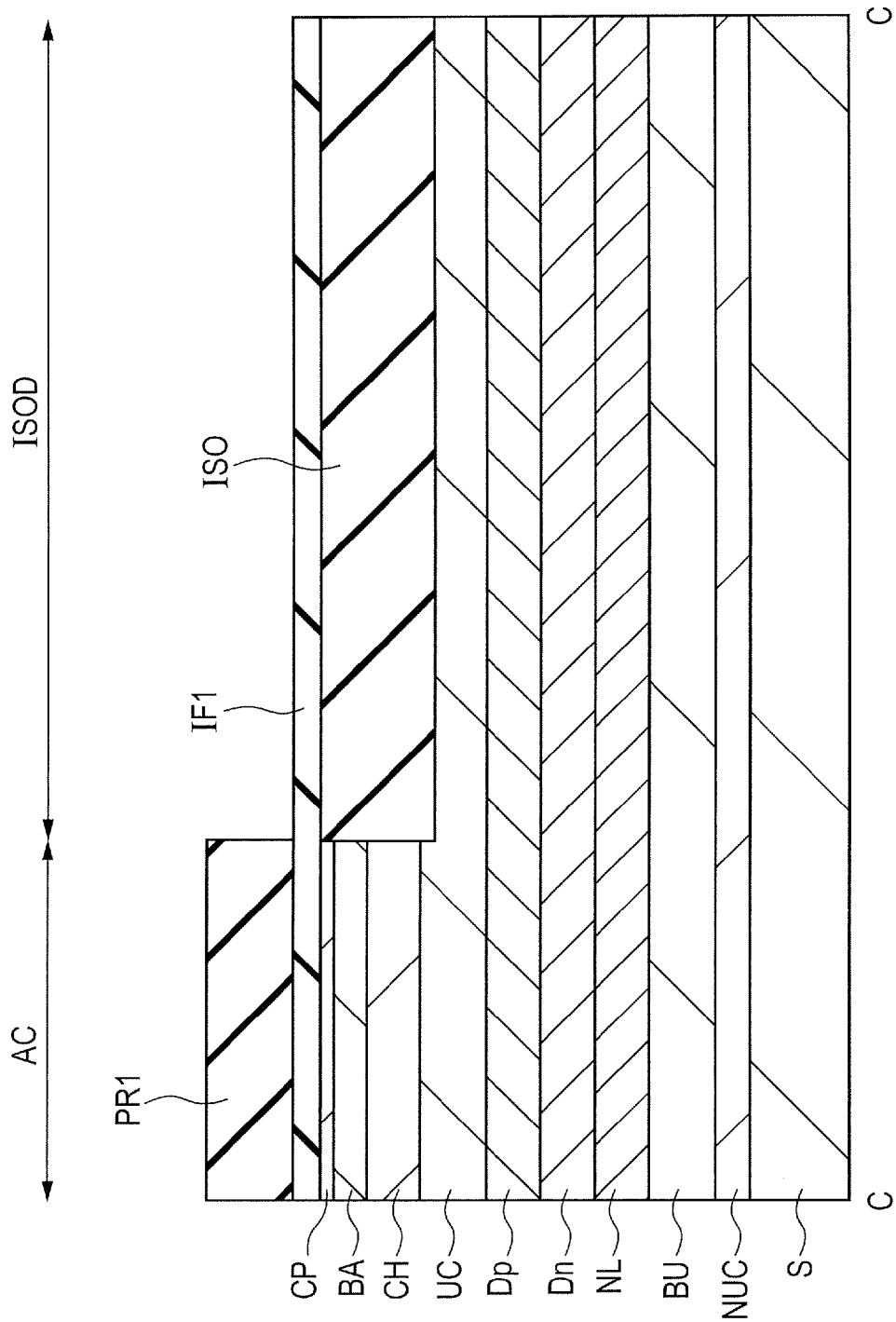
FIG. 10 is a cross-sectional view illustrating a process of manufacturing the semiconductor device according to the first embodiment.

As illustrated in FIG. 7, the nucleation layer NUC and the buffer layer BU are sequentially made on the substrate S. The substrate S is made of, for example, a semiconductor substrate made of silicon (Si) from which a (111) plane is exposed. As the nucleation layer NUC, for example, an aluminum nitride (AlN) layer is allowed to heteroepitaxially grow on an upper portion of the substrate S in a thickness of about 200 nm through a metal organic chemical vapor deposition (MOCVD) technique.

The substrate S may be made of a substrate made of SiC or saffire other than the above silicon. Further, as usual, the nucleation layer NUC and a nitride semiconductor layer (group III-V compound semiconductor layer) subsequent to the nucleation layer NUC are each formed by group III element surface growth (that is, gallium plane growth or aluminum plane growth in this case).

Then, as the buffer layer BU, a superlattice structure in which a stacked film (AlN/GaN film) including a gallium nitride (GaN) layer and an aluminum nitride (AlN) layer are repetitively stacked on each other is formed on the nucleation layer NUC. For example, the gallium nitride (GaN) layer having a thickness of about 20 nm, and the aluminum nitride (AlN) layer having a thickness of about 5 nm are alternately heteroepitaxially grown through a metal organic vapor phase epitaxy. For example, 40 stacked films are formed. In growing the stacked film, the stacked film may be grown while being doped with carbon (C). For example, the stacked film is doped with carbon so that a carbon concentration in the stacked film becomes about $1\times10^{19}$(1E19) $cm^{-3}$.

Also, as a part of the buffer layer BU, for example, the AlGaN layer may be heteroepitaxially grown on the buffer layer BU through the metal organic vapor phase epitaxy.

Then, as the n+ layer NL, the gallium nitride layer ($n^+$GaN layer) containing the n-type impurities is heteroepitaxially grown on the buffer layer BU through the metal organic vapor phase epitaxy. For example, Si is used as the n-type impurities. For example, the gallium nitride layer is deposited in about 200 nm while being doped with Si. The Si concentration in the deposited film is set to, for example, about $1\times10^{19}$(1E19)$cm^{-3}$.

Then, as the n-type layer Dn, for example, the gallium nitride layer ($n^-$GaN layer) containing the n-type impurities is heteroepitaxially grown on the n+ layer NL through the metal organic vapor phase epitaxy. For example, Si is used as the n-type impurities. For example, the gallium nitride layer is deposited in about 1000 nm while being doped with Si. The Si concentration in the deposited film is set to, for example, about $3\times10^{16}$(1E16) $cm^{-3}$.

Then, as the p-type layer Dp, for example, the gallium nitride layer ($p^-$GaN layer) containing the p-type impurities is heteroepitaxially grown on the buffer layer BU through the metal organic vapor phase epitaxy. For example, magnesium (Mg) is used as the p-type impurities. For example, the gallium nitride layer is deposited in about 1000 while being doped with Mg. The Mg concentration in the deposited film is set to, for example, about $5\times10^{17}$(5E17) $cm^{-3}$.

Then, the channel underlying layer UC is formed on the p-type layer Dp. As the channel underlying layer UC, for example, the AlGaN layer is heteroepitaxially grown on the p-type layer Dp through the metal organic vapor phase epitaxy. In this situation, the AlGaN layer is grown without being intentionally doped with the impurities. The thickness of the AlGaN layer is set to, for example, 1000 nm, and the composition of Al is set to about 3%.

Then, the channel layer CH is formed on the channel underlying layer UC. For example, the gallium nitride layer (GaN layer) is heteroepitaxially grown on the channel underlying layer UC through the metal organic vapor phase epitaxy. In this situation, the gallium nitride layer is grown without being intentionally doped with the impurities. The thickness of the channel layer CH is set to, for example, about 80 nm.

Then, as the barrier layer BA, for example, the AlGaN layer is heteroepitaxially grown on the channel layer CH through the metal organic vapor phase epitaxy. For example, a composition ratio of Al is set to 0.2, a composition ratio of Ga is set to 0.8, and an $Al_{0.2}Ga_{0.8}N$ layer is formed in the thickness of about 30 nm.

In this way, the stacked body of the channel underlying layer UC, the channel layer CH, and the barrier layer BA is formed. In the stacked body, a two-dimensional electron gas (2DEG) is generated in the vicinity of an interface between the channel layer CH and the barrier layer BA.

Then, the cap layer CP is formed on the barrier layer BA. For example, the gallium nitride layer (GaN layer) is heteroepitaxially grown on the barrier layer BA through the metal organic vapor phase epitaxy. In this situation, the gallium nitride (GaN) layer is grown without being intentionally doped with the impurities. The thickness of the cap layer CP is set to, for example, 2 nm.

Then, as illustrated in FIGS. 8 to 11, as the insulating film IF1, the silicon nitride film is deposited on the cap layer CP in the thickness of, for example, about 100 nm through a PECVD (plasma enhanced chemical vapor deposition) technique.

Then, a photoresist film PR1 that opens the device isolation region is formed on the insulating film IF1 through photolithography processing. Then, nitrogen ions are implanted into the surface with the photoresist film PR1 as a mask, to thereby form the device isolation region ISO. In this way, ion species such as nitrogen (N) or boron (B) are implanted into the device isolation region ISO, to thereby change a crystalline state, and provide a higher resistance.

Figure 11:
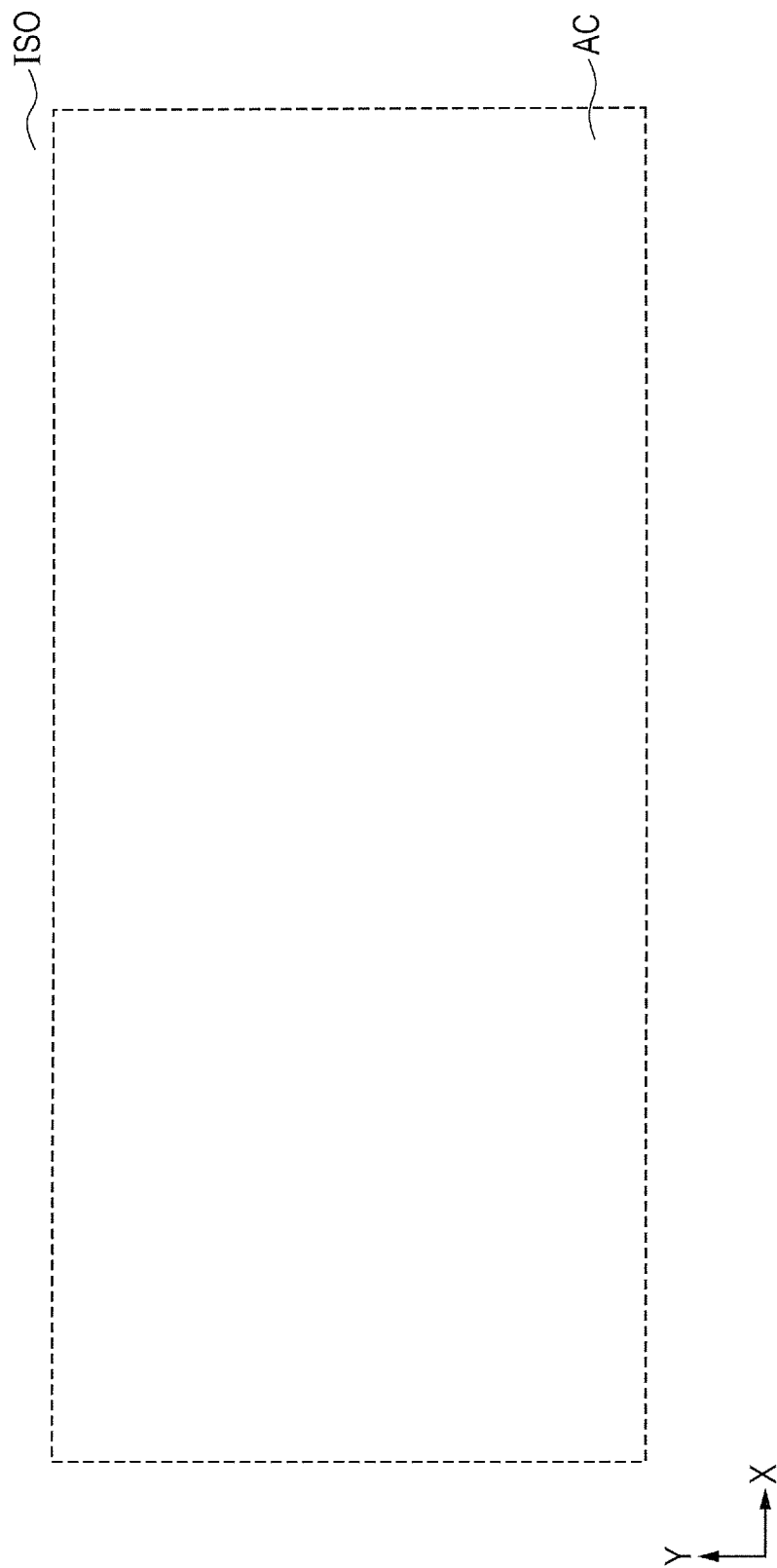
FIG. 11 is a plan view illustrating a process of manufacturing the semiconductor device according to the first embodiment.

For example, the nitrogen ions are implanted into the stacked body including the channel underlying layer UC, the channel layer CH, and the barrier layer BA through the insulating film IF1 with a density of about $5\times10^{14}$ (5E14) $cm^{-2}$. The implanting energy is set to, for example, about 220 keV. The implantation conditions of nitrogen ions are adjusted so that a depth of implantation, that is, a bottom of the device isolation region ISO is located at a position lower than the bottom of the channel layer CH, and located at a position higher than the bottom of the p-type layer Dp. An area surrounded by the device isolation region ISO forms the active region AC. As illustrated in FIG. 11, the active region AC is formed into a substantially rectangular shape having long sides in the X-direction. Thereafter, the photoresist film PR1 is removed through a plasma stripping process.

Then, as illustrated in FIGS. 12 to 15, the insulating film IF1 is patterned through the photolithography technique and the etching technique. For example, a photoresist film (not shown) is formed on the insulating film IF1, and the photoresist film (not shown) in a gate electrode formation region is removed through the photolithography processing. In other words, the photoresist film (not shown) having an opening in the gate electrode formation region is formed on the insulating film IF1. Then, the insulating film IF1 is etched with the photoresist film (not shown) as a mask. When the insulating film IF1 is formed of the silicon nitride film, dry etching is conducted with the use of a fluorine-based gas such as SF6. Thereafter, the photoresist film (not shown) is removed through the plasma stripping process. In this way, the insulating film IF1 having an opening in the gate electrode formation region is formed on the cap layer CP.

Figure 12:
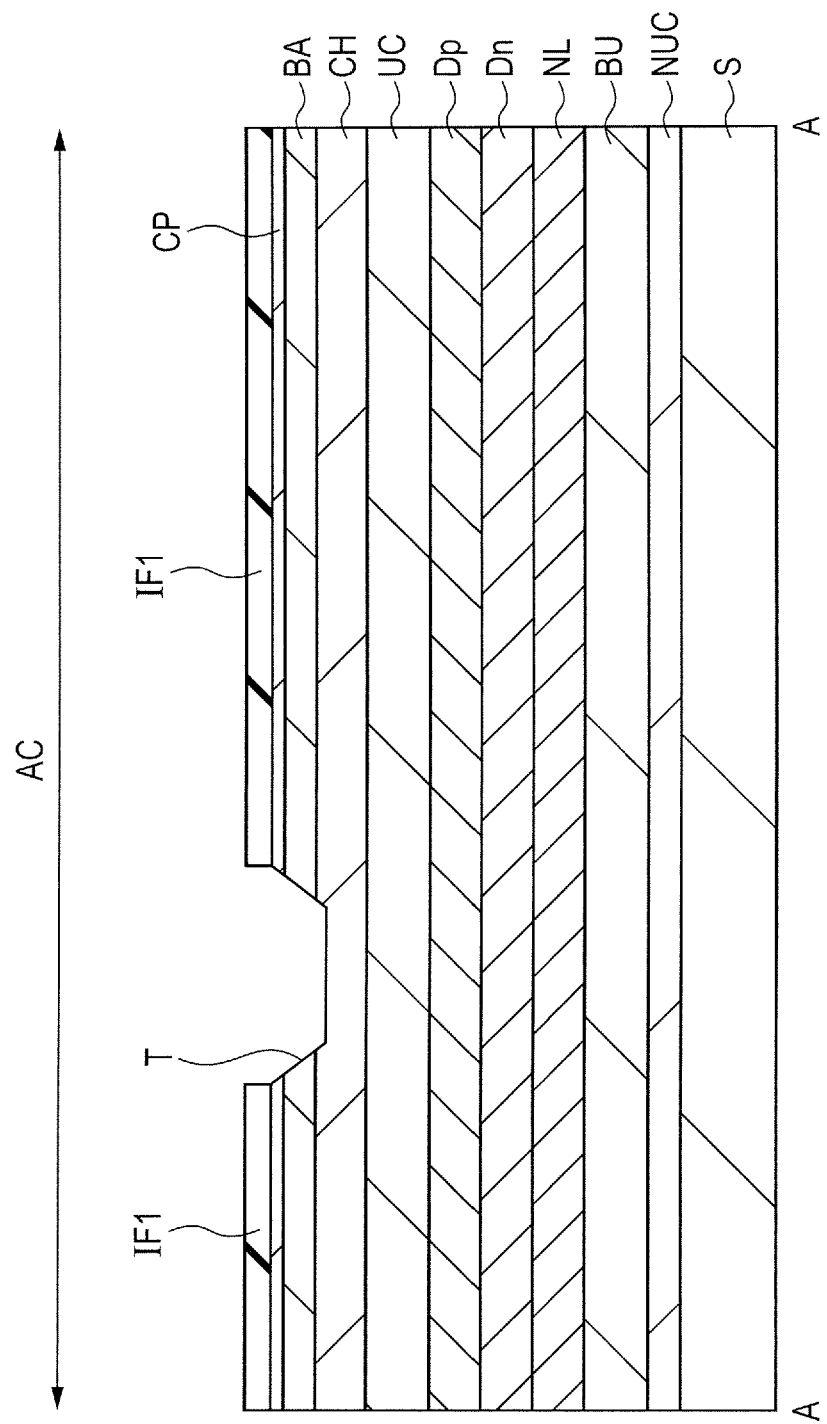
FIG. 12 is a cross-sectional view illustrating a process of manufacturing the semiconductor device according to the first embodiment, which is a cross-sectional view illustrating a manufacturing process subsequent to FIG. 8.
Figure 13:
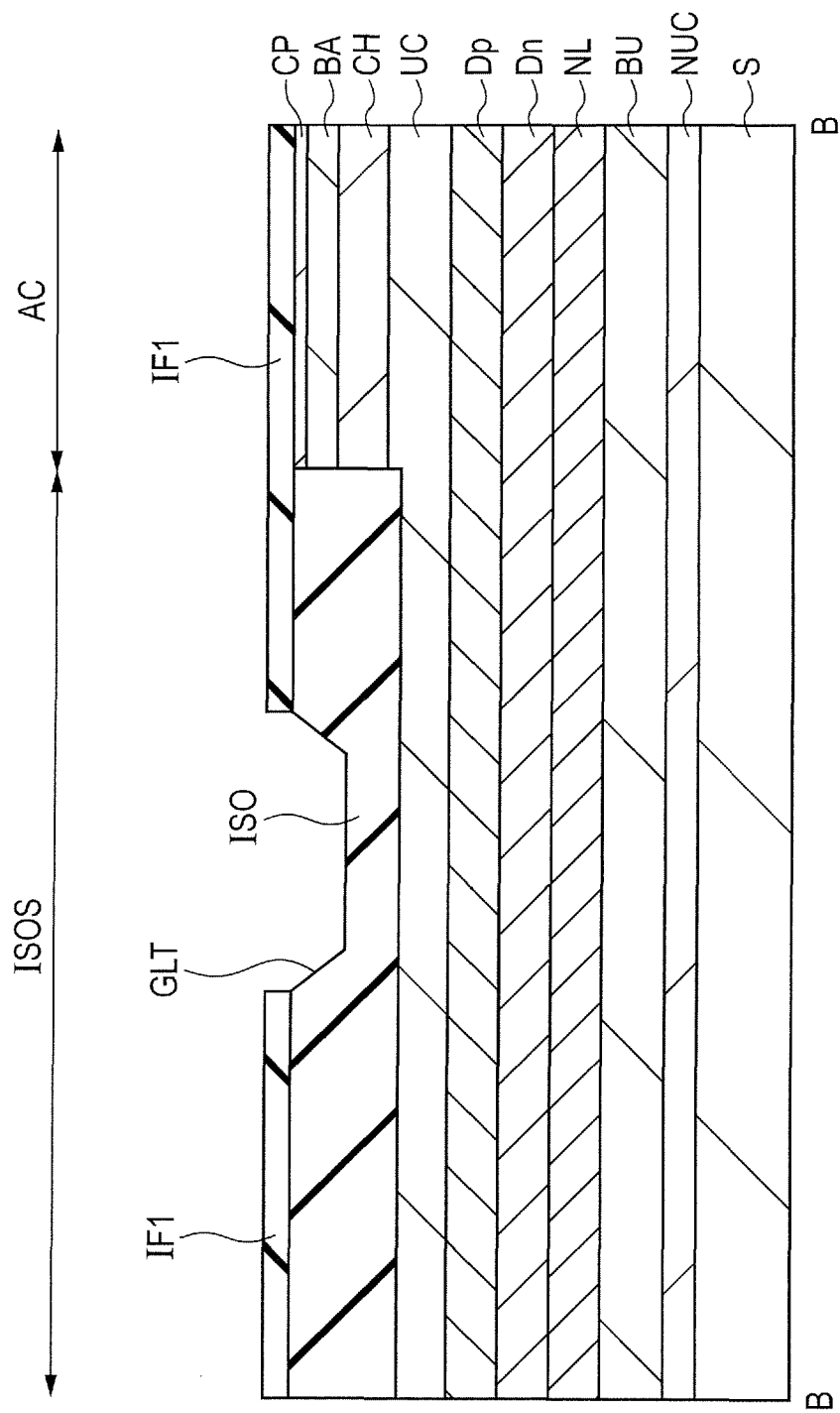
FIG. 13 is a cross-sectional view illustrating a process of manufacturing the semiconductor device according to the first embodiment, which is a cross-sectional view illustrating a manufacturing process subsequent to FIG. 9.
Figure 14:
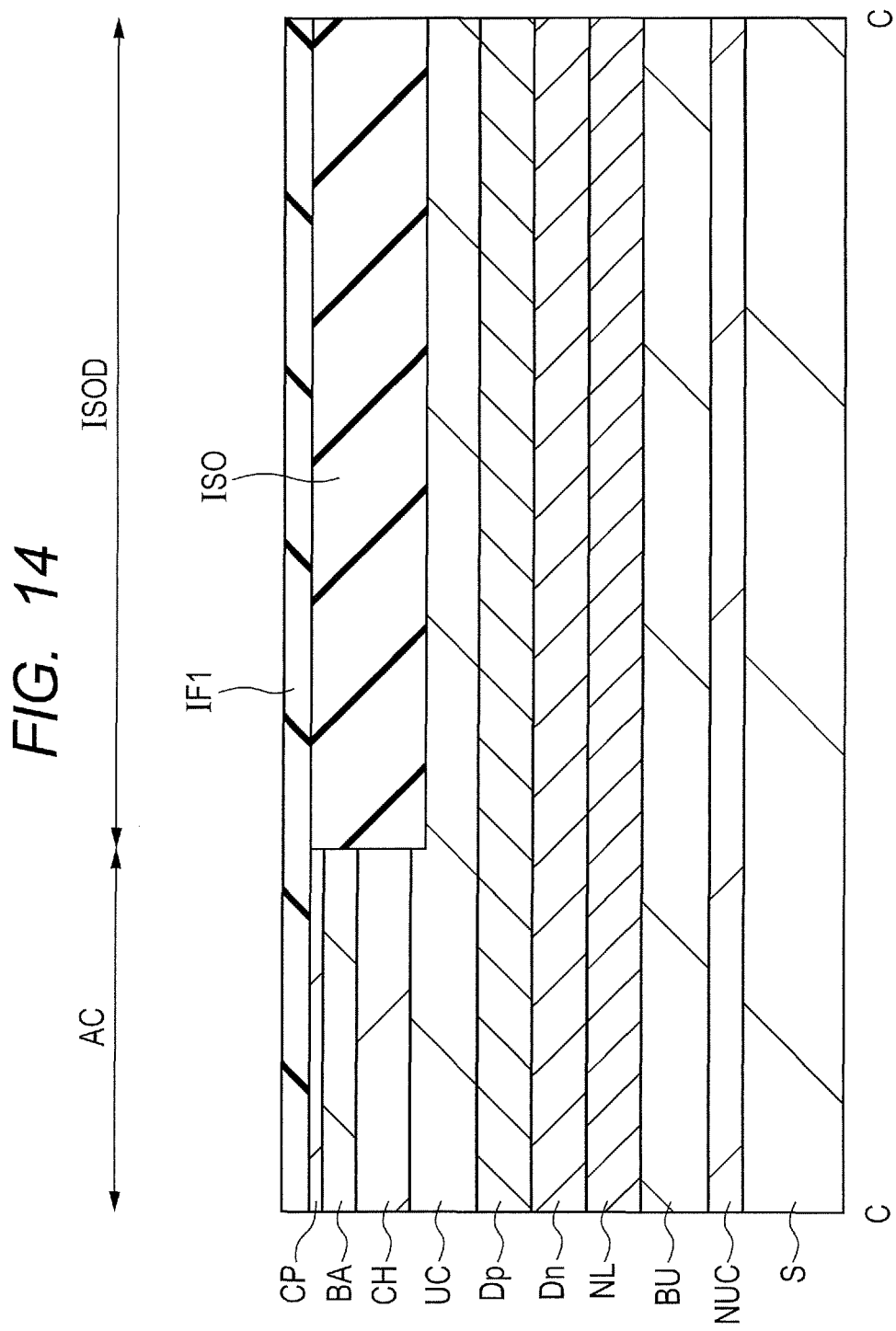
FIG. 14 is a cross-sectional view illustrating a process of manufacturing the semiconductor device according to the first embodiment, which is a cross-sectional view illustrating a manufacturing process subsequent to FIG. 10.
Figure 15:
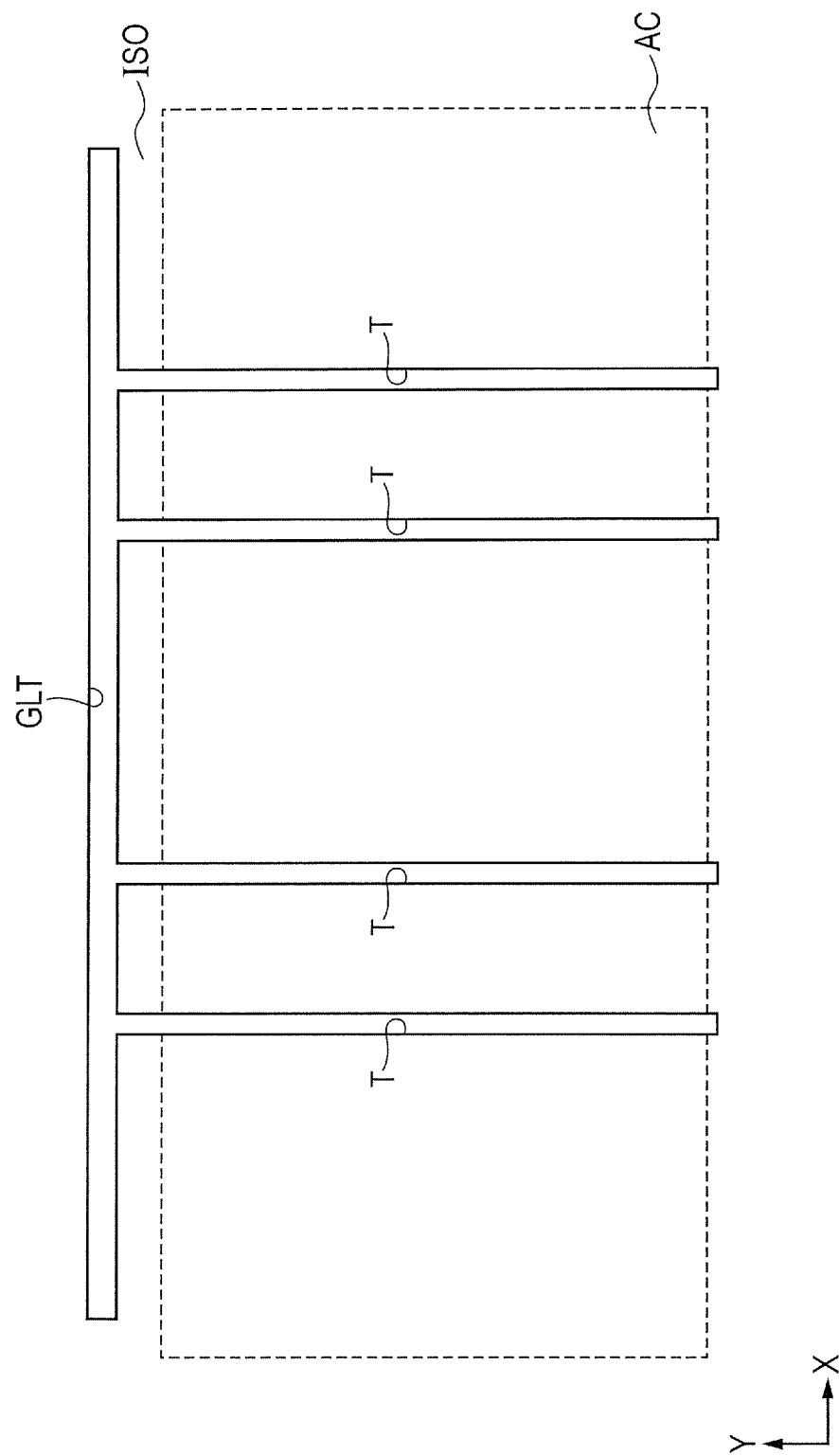
FIG. 15 is a plan view illustrating a process of manufacturing the semiconductor device according to the first embodiment.

Then, the cap layer CP, the barrier layer BA, and the channel layer CH are dry etched with the insulating film IF1 as a mask, to thereby form the trench. T that penetrates through the cap layer CP and the barrier layer BA, and reaches the middle portion of the channel layer CH (FIG. 12). As the etching gas, a chlorine-based gas such as $BCl_3$ is used. In this situation, a trench GLT for the gate line GL is formed in the device isolation region ISO (FIG. 13).

Then, as illustrated in FIGS. 16 to 19, the gate electrode GE is formed over the insulating film IF1 including the interior of the trench T through the gate insulating film GI. For example, an aluminum oxide film is deposited over the insulating film IF1 including the interior of the trench T as the gate insulating film GI in the thickness of about 50 nm through an ALD (atomic layer deposition) technique.

The gate insulating film GI may be formed of the aluminum oxide film as well as a silicon oxide film or a high dielectric constant film higher in dielectric constant than the silicon oxide film. The high dielectric constant film may be formed of a hafnium-based dielectric film such as an $HfO_2$ film (hafnium oxide film), a hafnium aluminate film, an HfON film (hafnium oxynitride film), an HfSiO film (hafnium silicate film), an HfSiON film (hafnium silicon oxynitride film), or an HfAlO film.

Then, as a conductive film, for example, a TiN (titanium nitride) film is deposited on, for example, the gate insulating film GI in the thickness of about 200 nm through a sputtering technique. Then, a photoresist film PR2 is formed in the gate electrode formation region through the photolithography technique, and a TiN film is etched with the photoresist film PR2 as a mask to form the gate electrode GE. In conducting this etching, the aluminum oxide film which is an underlayer of the TiN film may be etched. For example, in processing the TiN film, dry etching is conducted with the use of a chlorine-based gas such as $Cl_2$, and in processing the aluminum oxide film, dry etching is conducted with the use of the chlorine-based gas such as $BCl_3$.

Figure 16:
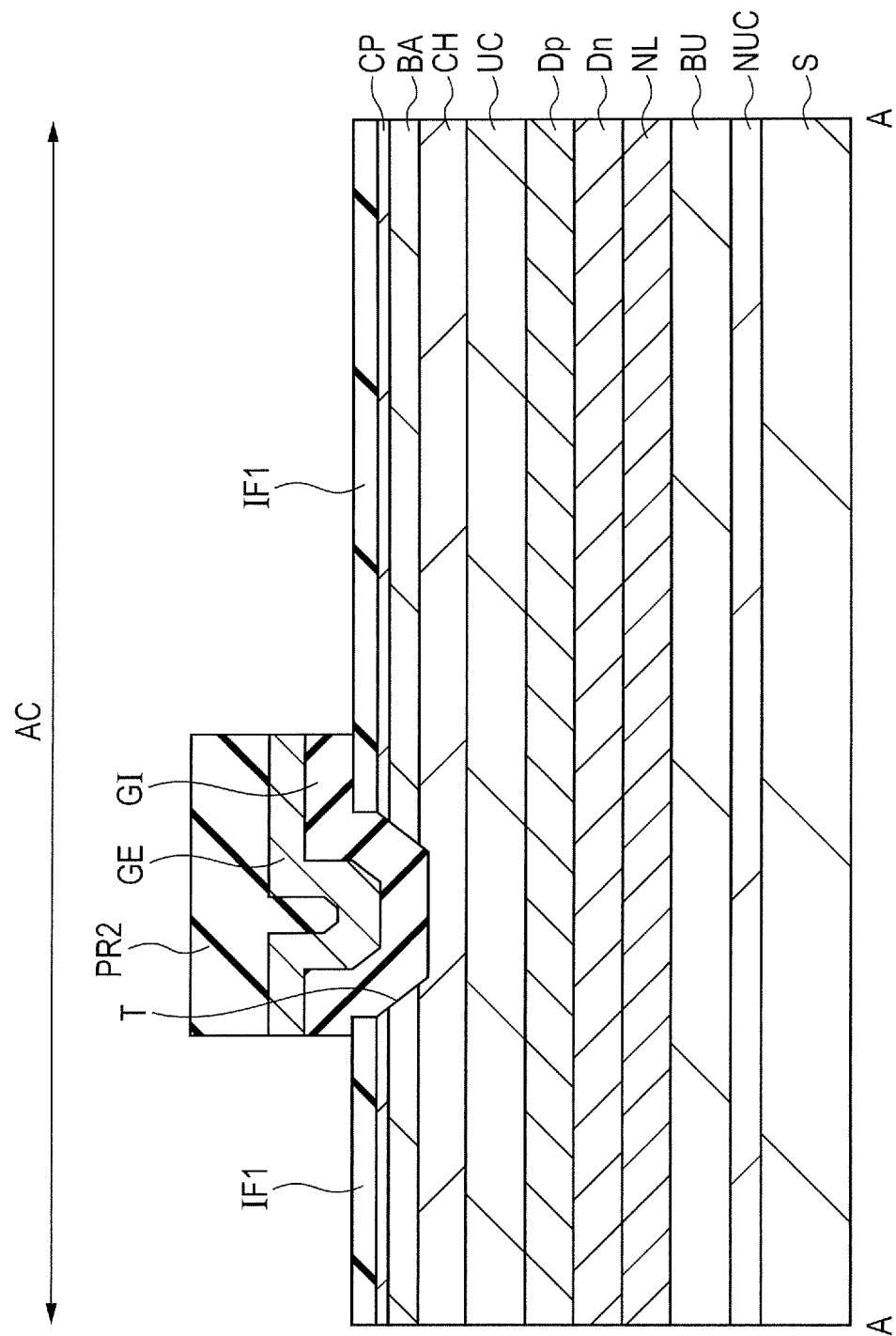
FIG. 16 is a cross-sectional view illustrating a process of manufacturing the semiconductor device according to the first embodiment, which is across-sectional view illustrating a manufacturing process subsequent to FIG. 12.
Figure 17:
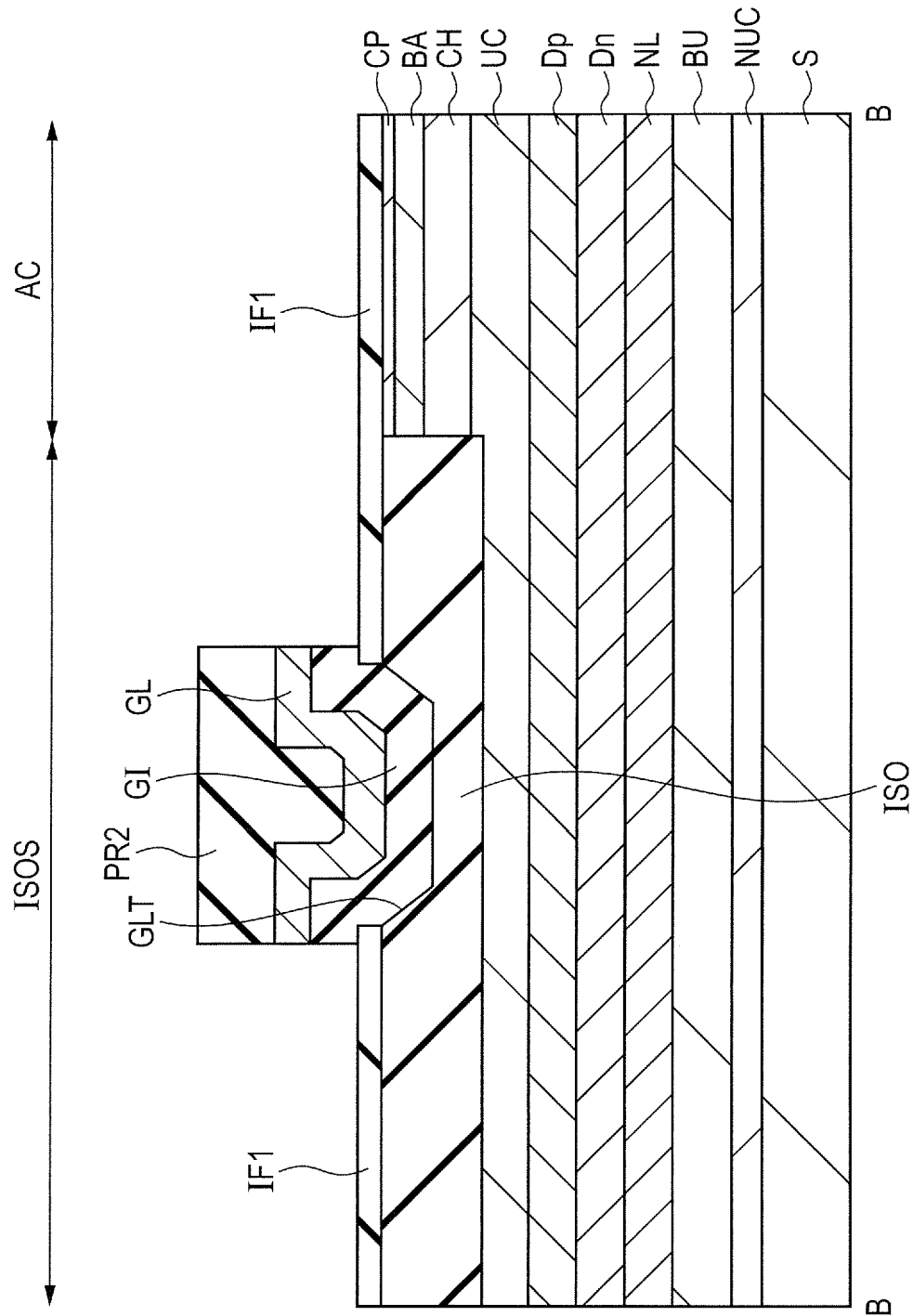
FIG. 17 is a cross-sectional view illustrating a process of manufacturing the semiconductor device according to the first embodiment, which is a cross-sectional view illustrating a manufacturing process subsequent to FIG. 13.
Figure 18:
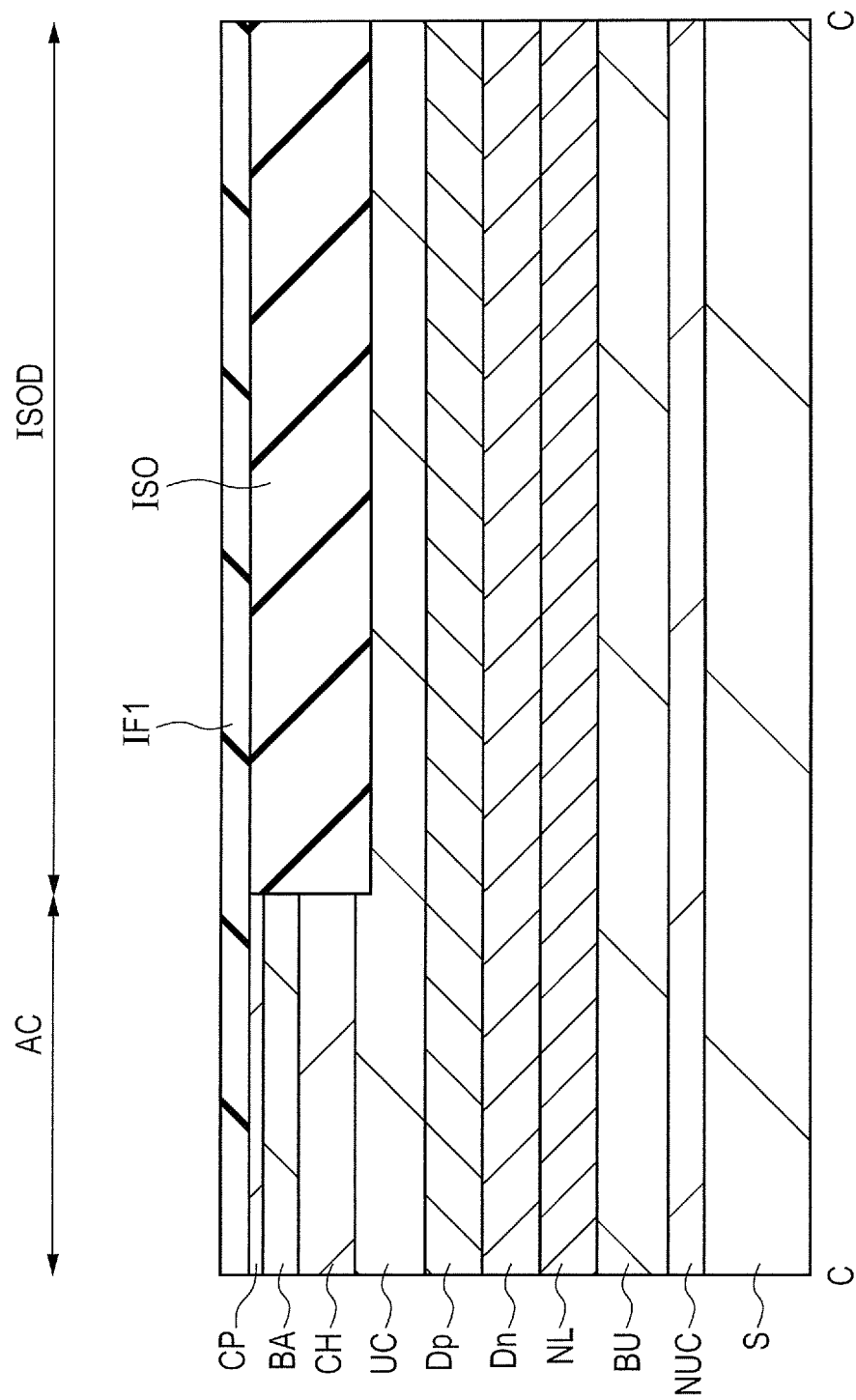
FIG. 18 is a cross-sectional view illustrating a process of manufacturing the semiconductor device according to the first embodiment, which is a cross-sectional view illustrating a manufacturing process subsequent to FIG. 14.
Figure 19:
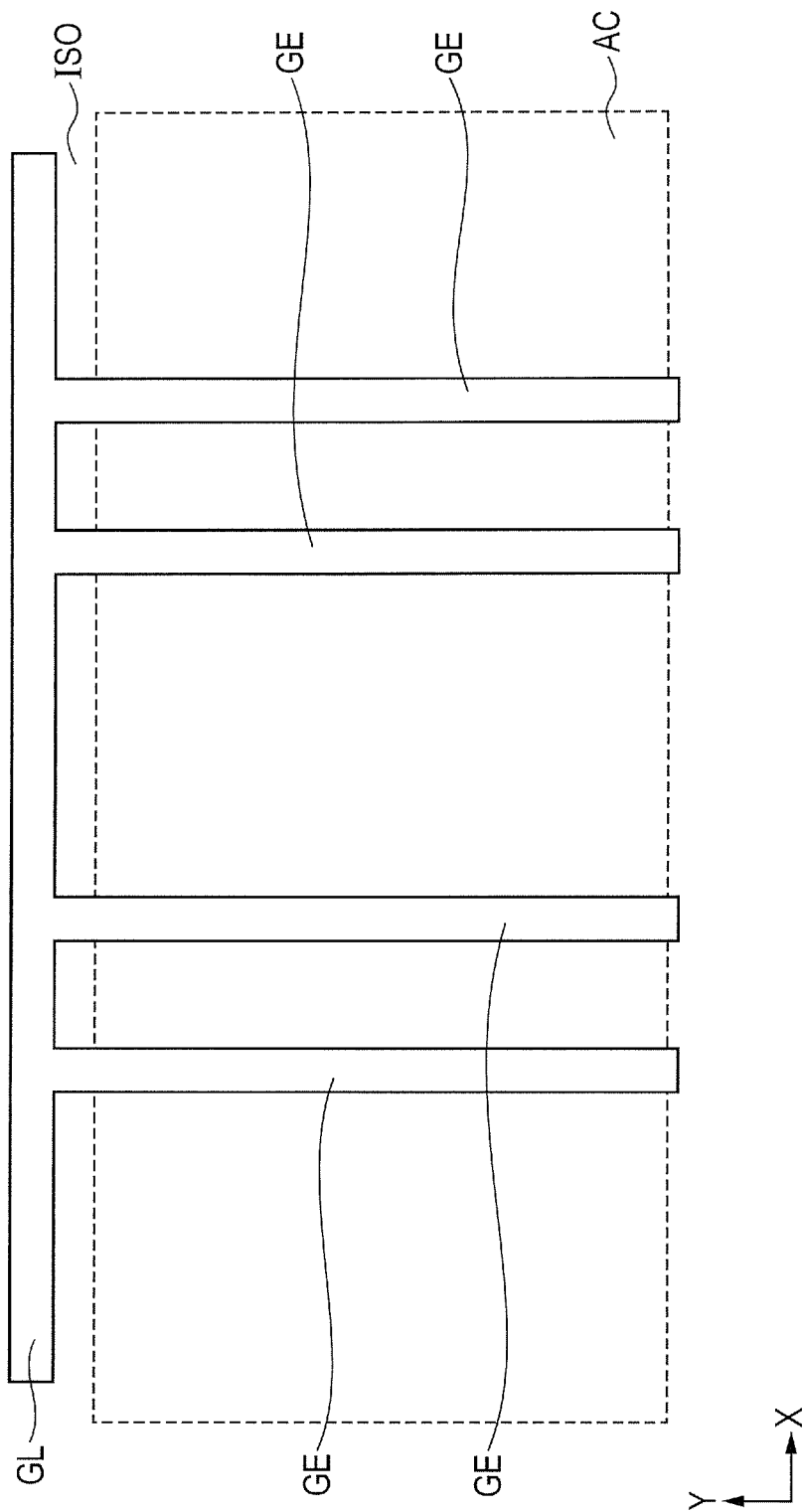
FIG. 19 is a plan view illustrating a process of manufacturing the semiconductor device according to the first embodiment.

Also, in conducting this etching, the gate electrode GE may be patterned into a shape overhanging toward one direction (a right side, a drain electrode DE side in FIG. 16). The overhanging portion is called "field plate electrode portion". The field plate electrode portion is a region of a part of the gate electrode GE extending from an end of the trench T on the drain electrode DE side toward the drain electrode DE side.

Figure 20:
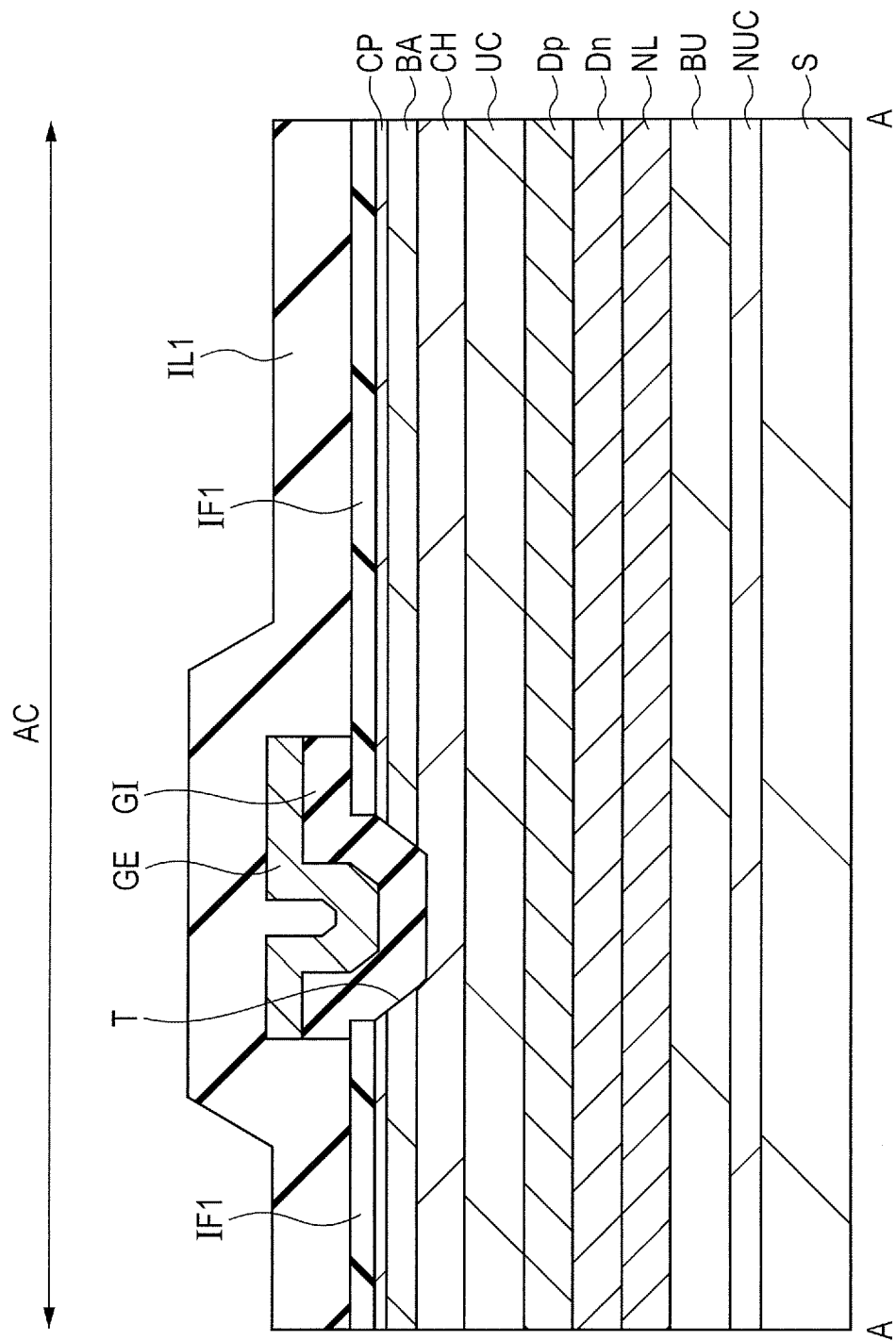
FIG. 20 is across-sectional view illustrating a process of manufacturing the semiconductor device according to the first embodiment, which is a cross-sectional view illustrating a manufacturing process subsequent to FIG. 16.
Figure 21:
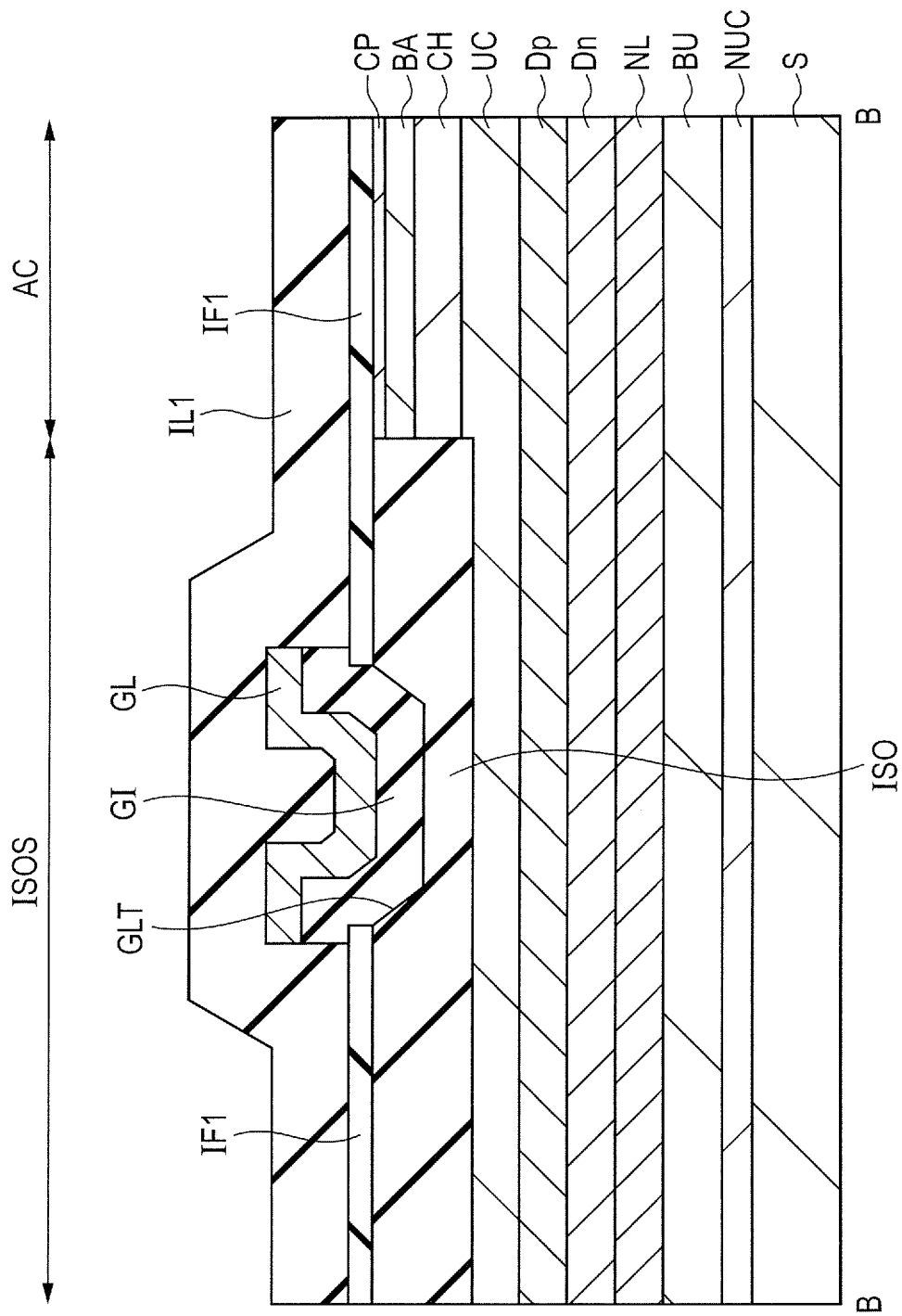
FIG. 21 is a cross-sectional view illustrating a process of manufacturing the semiconductor device according to the first embodiment, which is a cross-sectional view illustrating a manufacturing process subsequent to FIG. 17.
Figure 22:
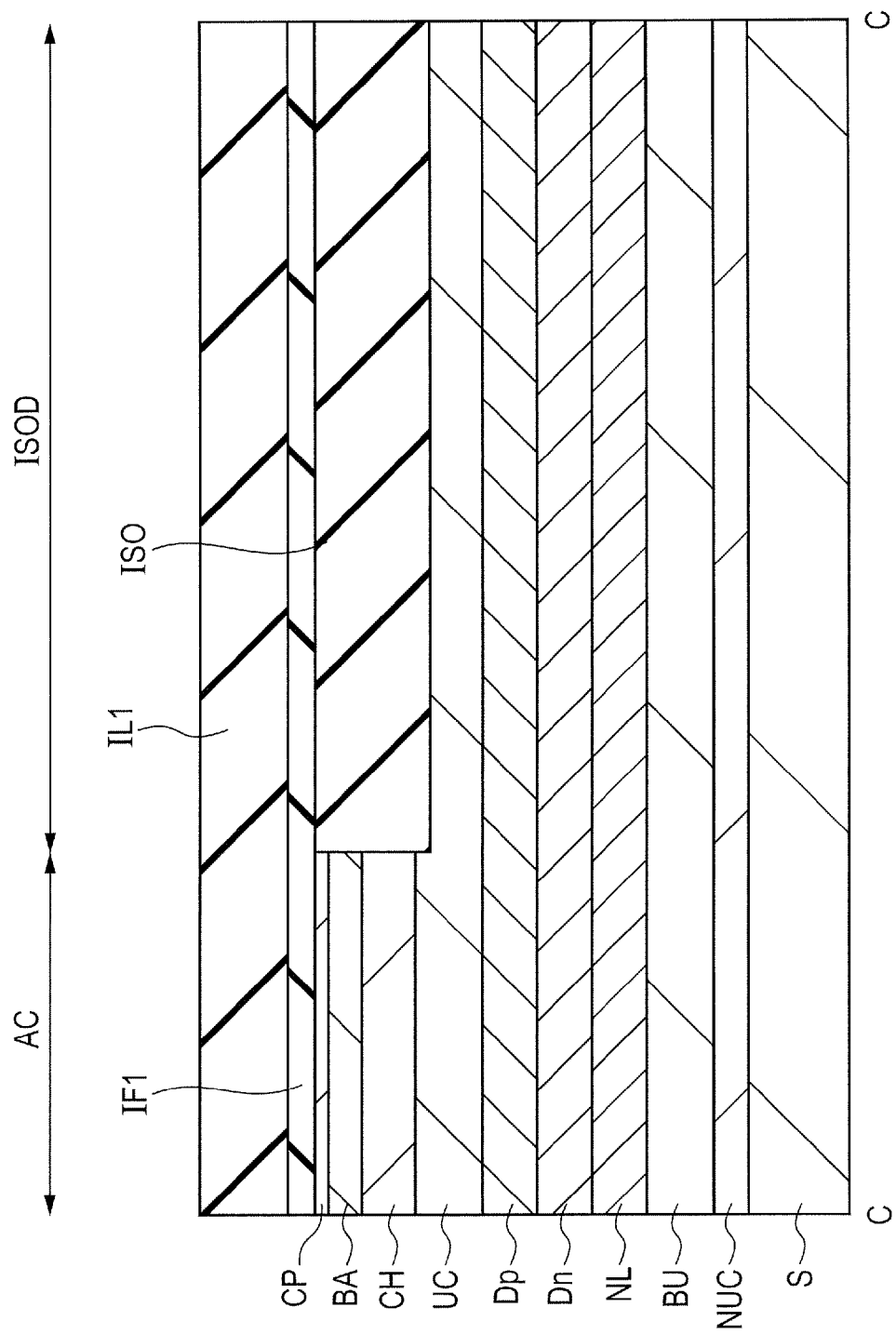
FIG. 22 is a cross-sectional view illustrating a process of manufacturing the semiconductor device according to the first embodiment, which is a cross-sectional view illustrating a manufacturing process subsequent to FIG. 18.

Then, as illustrated in FIGS. 20 to 22, as the interlayer insulating film IL1, for example, a silicon oxide film is deposited in the thickness of about 2000 nm on the insulating film IF1 and the gate electrode GE through the PECVD technique.

Then, as illustrated in FIGS. 23 to 26, the contact holes C1S, C1D, and the through-holes THS, THD. are formed in the interlayer insulating film IL1 and the insulating film IF1 through the photolithography technique and the etching technique. The contact holes C1S and C1D are formed in a source electrode connection region and a drain electrode connection region, respectively. Also, the through-hole THS is formed in a source pad formation region. Also, the through-hole THD is formed in a drain pad formation region.

Figure 23:
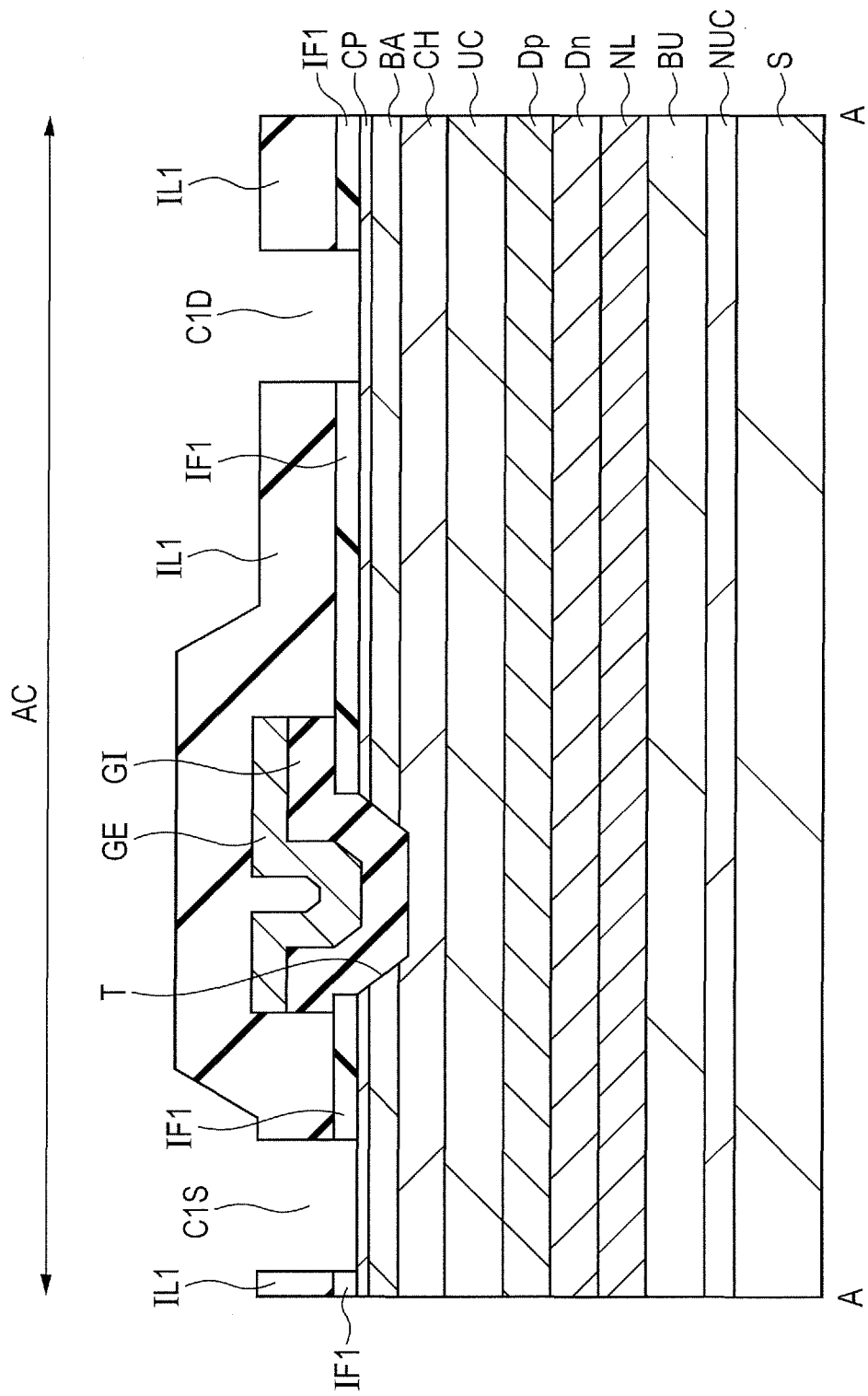
FIG. 23 is a cross-sectional view illustrating a process of manufacturing the semiconductor device according to the first embodiment, which is a cross-sectional view illustrating a manufacturing process subsequent to FIG. 20.

For example, a first photoresist film having respective openings in the source electrode connection region and the drain electrode connection region is formed on the interlayer insulating film IL1. Then, the interlayer insulating film IL1 and the insulating film IF1 are etched with the first photoresist film as a mask, to thereby form the contact holes C1S and C1D (FIG. 23).

When the interlayer insulating film IL1 is formed of the silicon oxide film, and the insulating film IF1 is formed of the silicon nitride film, in etching those films, dry etching is conducted with the use of a fluorine-based gas such as $SF_6$.

Figure 24:
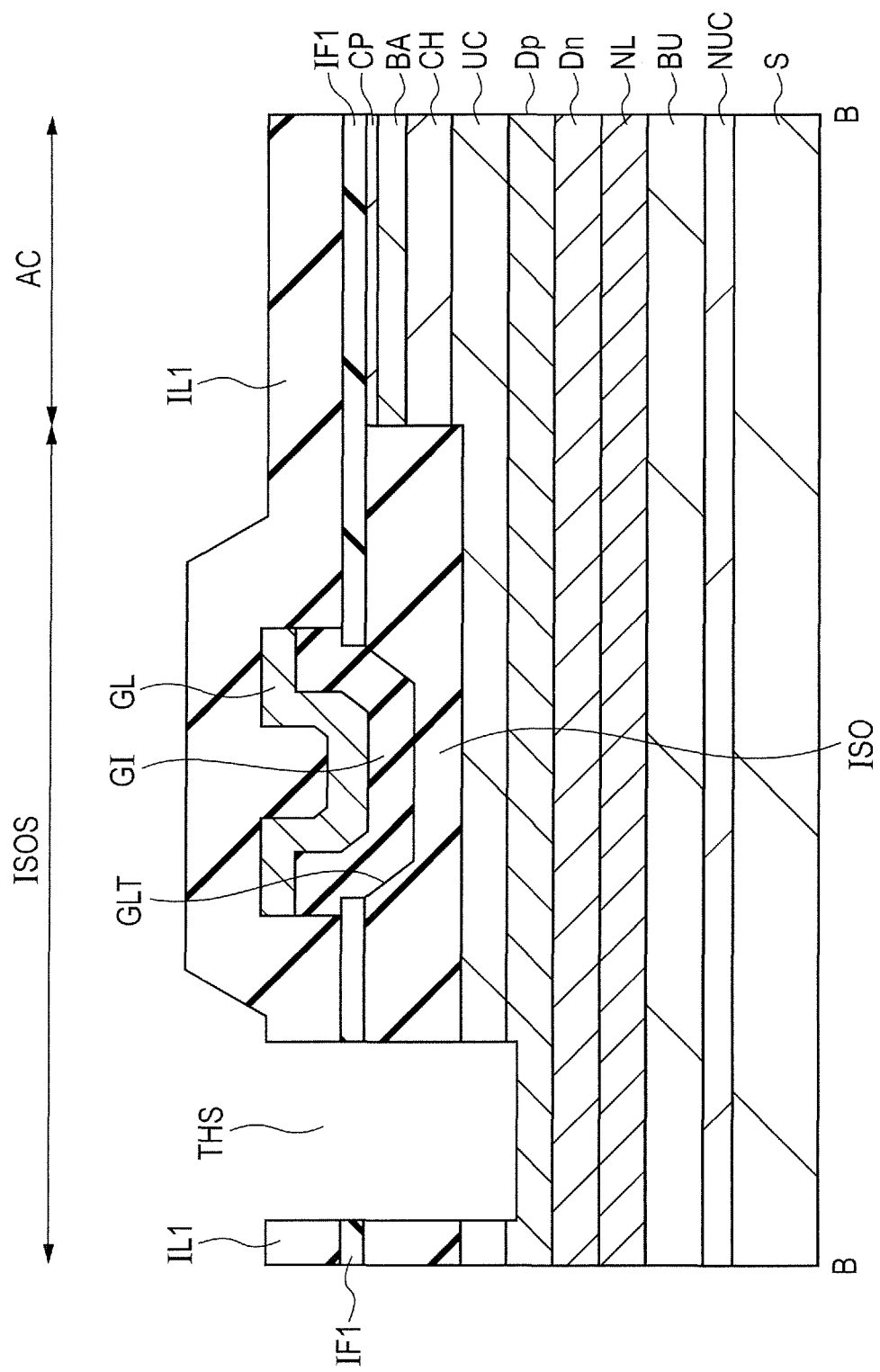
FIG. 24 is a cross-sectional view illustrating a process of manufacturing the semiconductor device according to the first embodiment, which is a cross-sectional view illustrating a manufacturing process subsequent to FIG. 21.

Then, after the first photoresist film has been removed, a second photoresist film that covers insides of the contact holes C1S and C1D, and has an opening in the formation region of the through-hole THS is formed on the interlayer insulating film IL1. Then, a part of the interlayer insulating film IL1, the insulating film IF1, the device isolation region ISO, the channel underlying layer UC, and the p-type layer Dp is etched with the second photoresist film as a mask, to thereby form the through-hole THS. In other words, the through-hole THS that penetrates through the interlayer insulating film IL1, the insulating film IF1, the device isolation region ISO, and the channel underlying layer UC, and reaches the middle portion of the p-type layer Dp is formed (FIG. 24).

Figure 25:
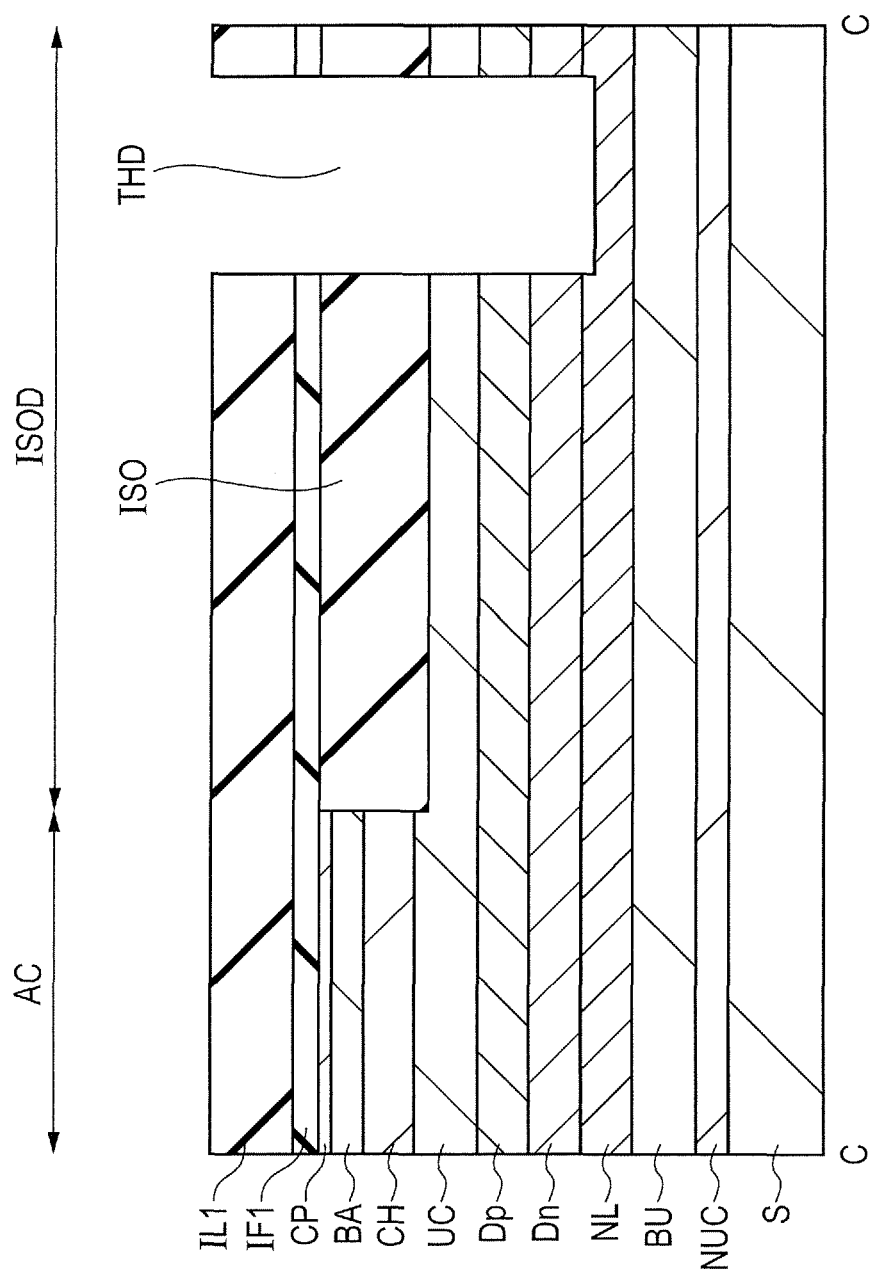
FIG. 25 is a cross-sectional view illustrating a process of manufacturing the semiconductor device according to the first embodiment, which is a cross-sectional view illustrating a manufacturing process subsequent to FIG. 22.
Figure 26:
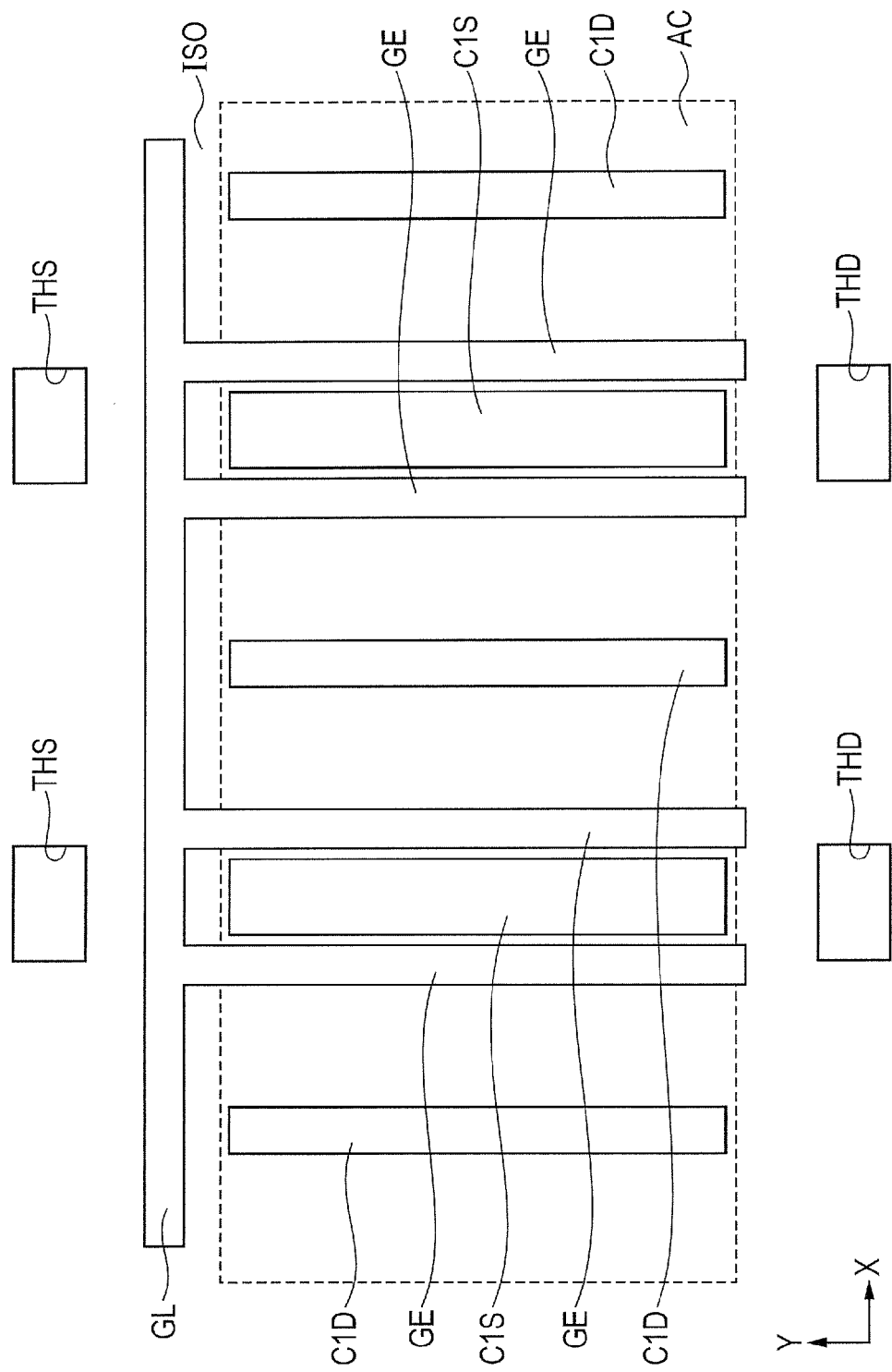
FIG. 26 is a plan view illustrating a process of manufacturing the semiconductor device according to the first embodiment.

Then, after the second photoresist film has been removed, a third photoresist film that covers insides of the contact holes C1S and C1D and the through-hole THS, and has an opening in the formation region of the through-hole THD is formed on the interlayer insulating film IL1. Then, a part of the interlayer insulating film IL1, the insulating film IF1, the device isolation region ISO, the channel underlying layer UC, the p-type layer Dp, the n-type layer Dn, and the n+ layer NL is etched with the third photoresist film as a mask, to thereby form the through-hole THD. In other words, the through-hole THD that penetrates through the interlayer insulating film IL1, the insulating film IF1, the device isolation region ISO, the channel underlying layer UC, and the p-type layer Dp, and reaches the middle portion of the n-type layer Dn is formed (FIG. 25).

When the interlayer insulating film IL1 is formed of the silicon oxide film, and the insulating film IF1 is formed of the silicon nitride film, those films are removed by, dry etching with the use of a fluorine-based gas such as SF6. Then, in forming the through-hole THS, further, the device isolation region ISO, the channel underlying layer (AlGaN layer) UC, and the drain pad DP are partway removed by dry etching with the use of a chlorine-based gas such as $BCl_3$. Also, in forming the through-hole THD, further, the device isolation region ISO, the channel underlying layer (AlGaN layer) UC, the p-type layer Dp, and the n-type layer Dn are partway removed by dry etching with the use of the chlorine-based gas such as $BCl_3$.

The forming order of the contact holes C1S, C1D, and the through-holes THS, THD is not limited to the above example, but the through-hole THS may be formed after the formation of the through-hole THD and the contact holes C1S and C1D may be further formed. Also, after the interlayer insulating film IL1 in the formation region of the through-hole THS, the formation region of the through-hole THD, the source electrode connection region, and the drain electrode connection region has been removed, the through-hole THS and the through-hole THD may be sequentially formed. Further, the insulating film IF1 of the source electrode connection region and the drain electrode connection region may be removed. In this way, the forming process of the contact holes C1S, C1D, and the through-holes THS, THD can be variously conducted.

The cap layer CP is exposed from bottom surfaces of the contact holes C1S and C1D formed in the above process, the p-type layer Dp is exposed from a bottom surface of the through-hole THS, and the n+ layer NL is exposed from a bottom surface of the through-hole THD. A planar shape of the contact holes C1S and C1D is, for example, about 8 μm×1000 μm. Also, a planar shape of the through-holes THS and THD is, for example, about 8 μm×1000 μm.

Figure 27:
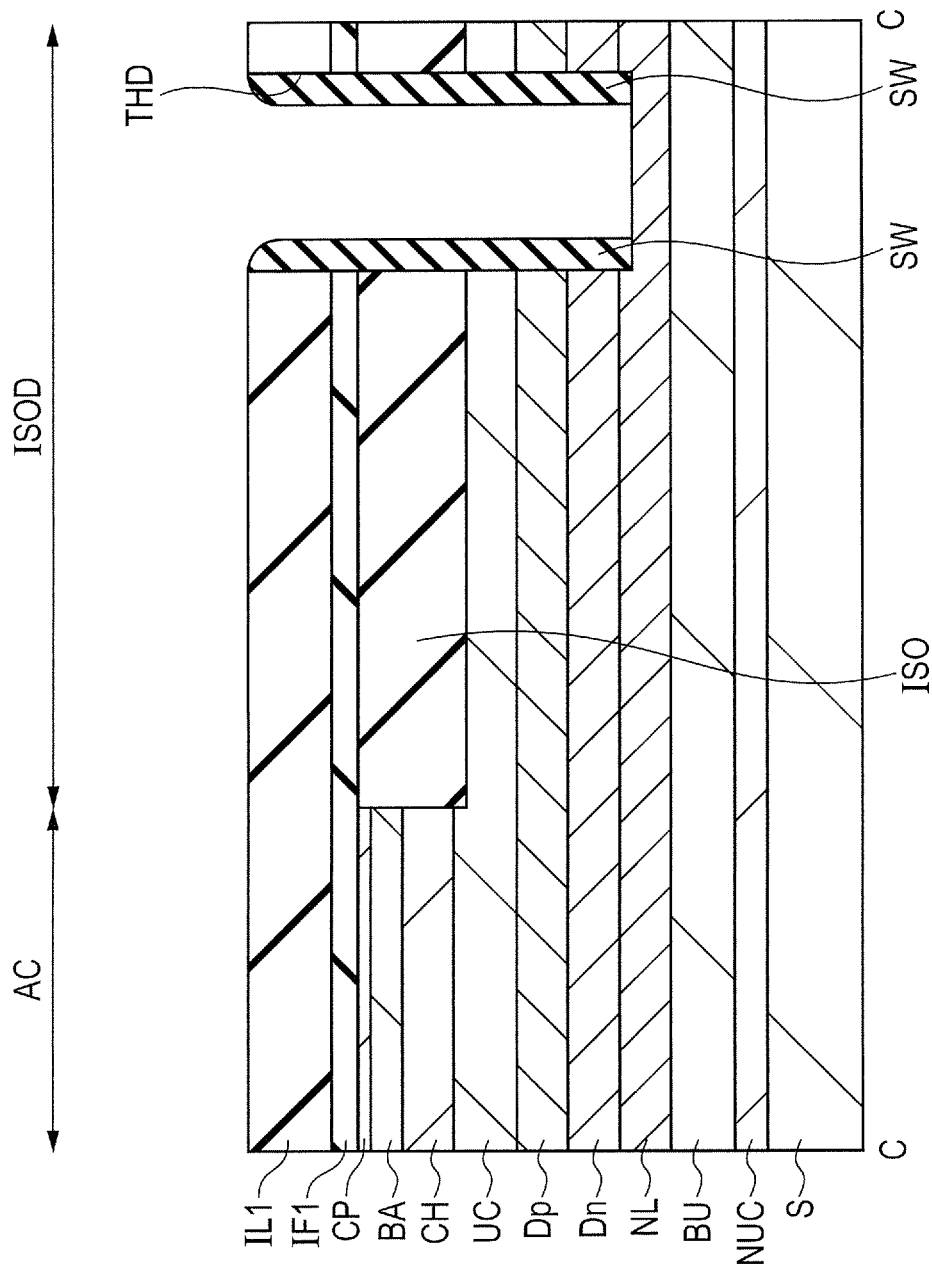
FIG. 27 is a cross-sectional view illustrating a process of manufacturing the semiconductor device according to the first embodiment, which is a cross-sectional view illustrating a manufacturing process subsequent to FIG. 25.
Figure 28:
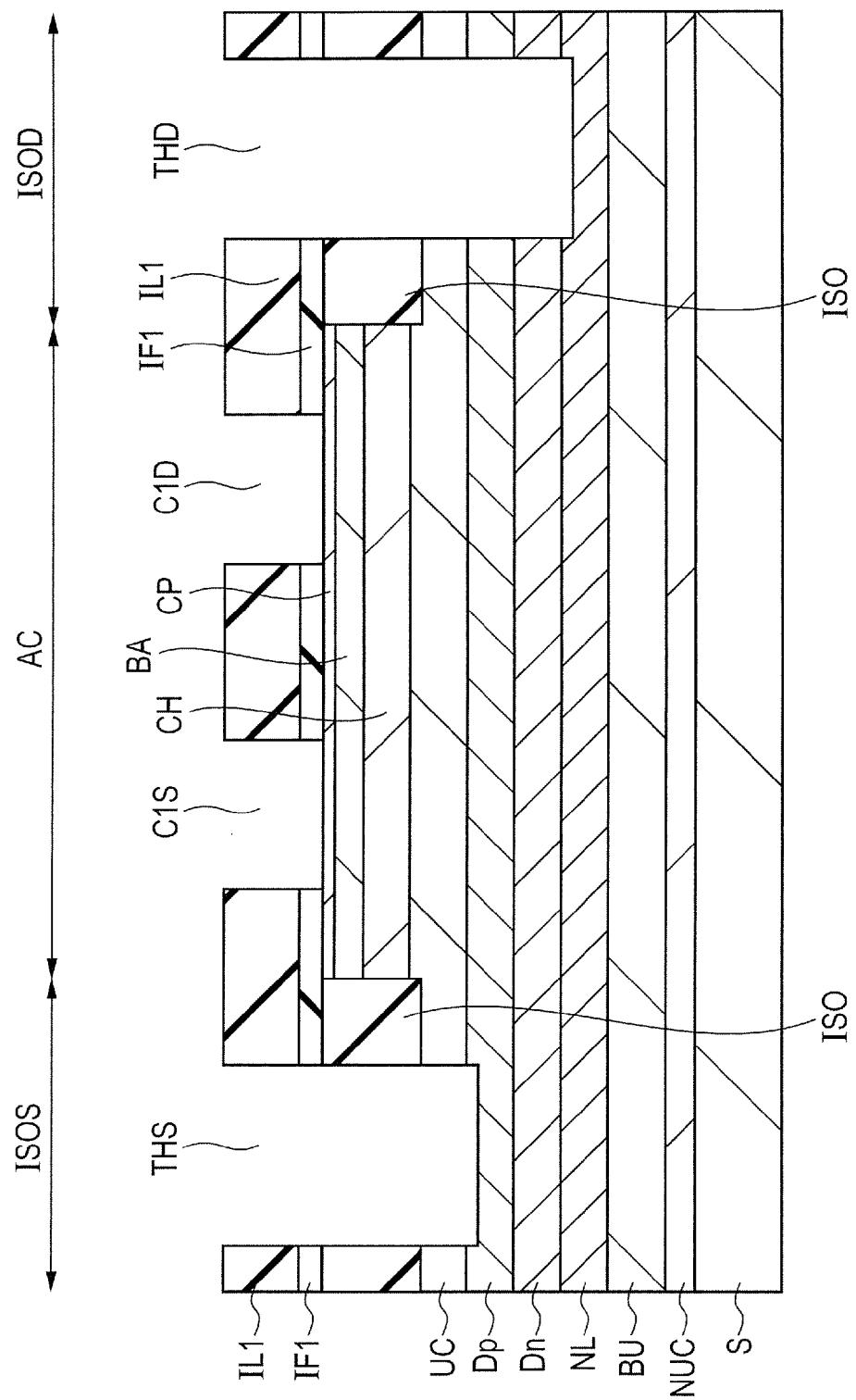
FIG. 28 is a cross-sectional view illustrating a process of manufacturing the semiconductor device according to the first embodiment, which is a cross-sectional view schematically illustrating a process of forming a side wall insulating film.
Figure 29:
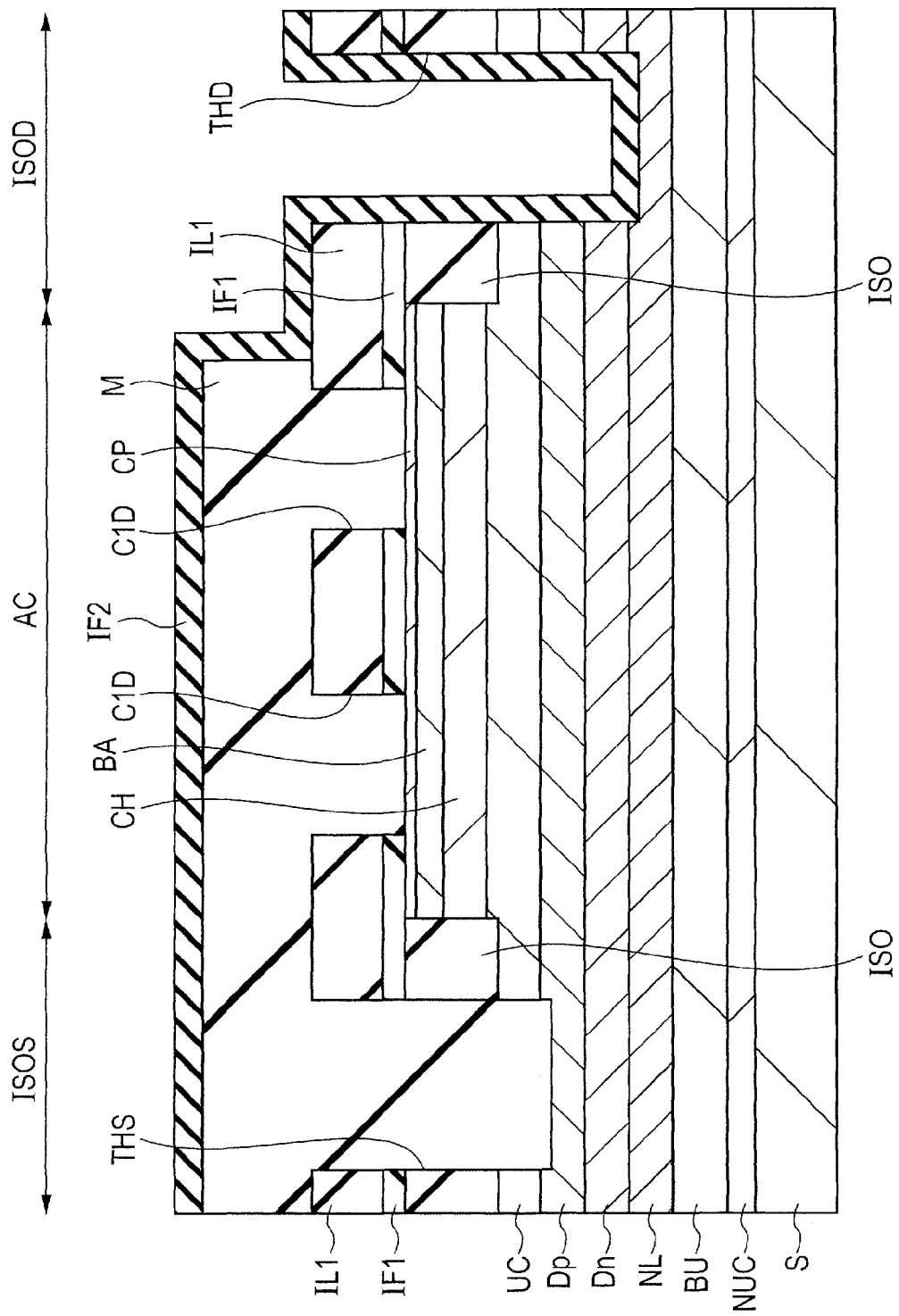
FIG. 29 is a cross-sectional view illustrating a process of manufacturing the semiconductor device according to the first embodiment, which is a cross-sectional view schematically illustrating a process of forming the side wall insulating film.
Figure 30:
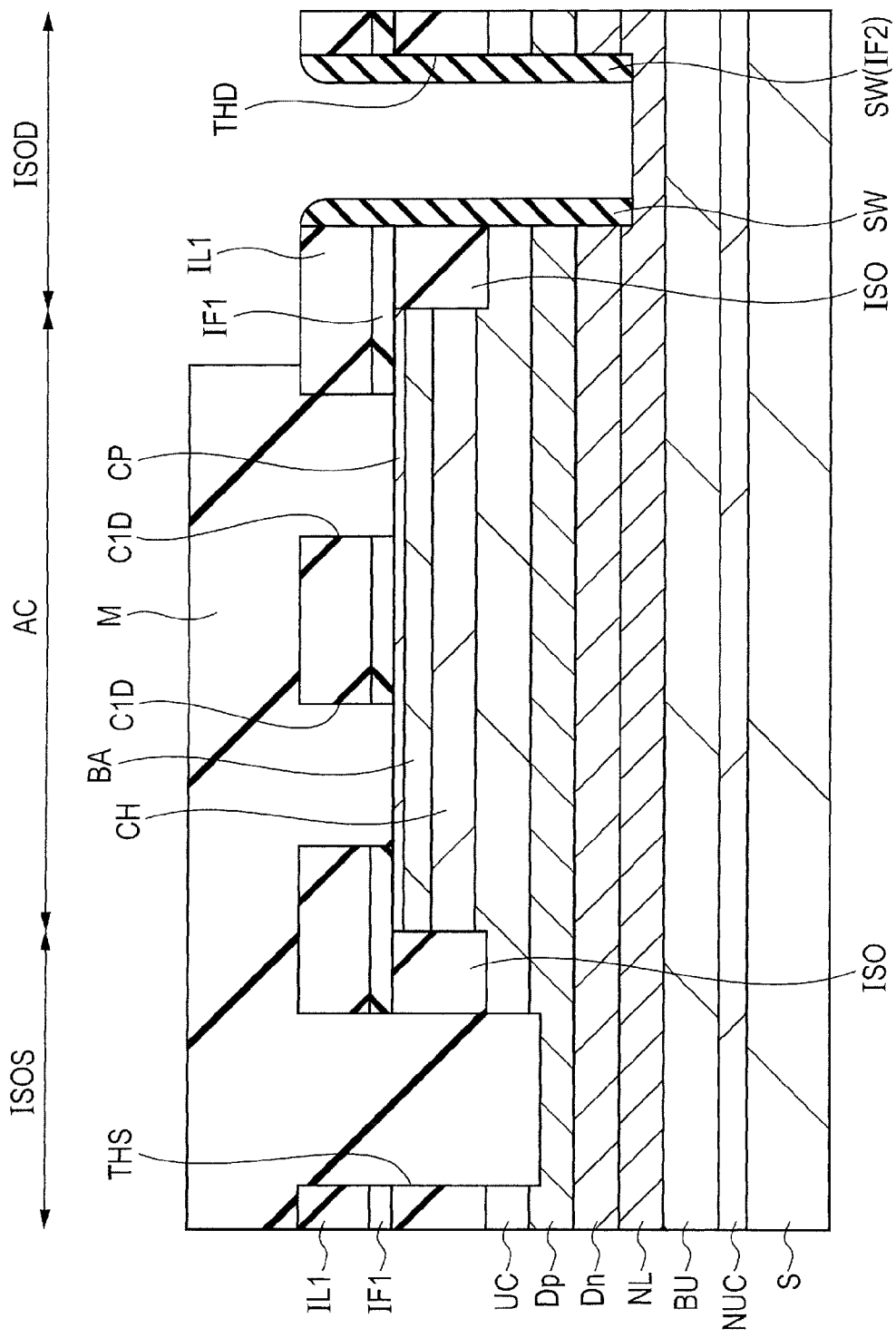
FIG. 30 is a cross-sectional view illustrating a process of manufacturing the semiconductor device according to the first embodiment, which is a cross-sectional view schematically illustrating a process of forming the side wall insulating film.
Figure 31:
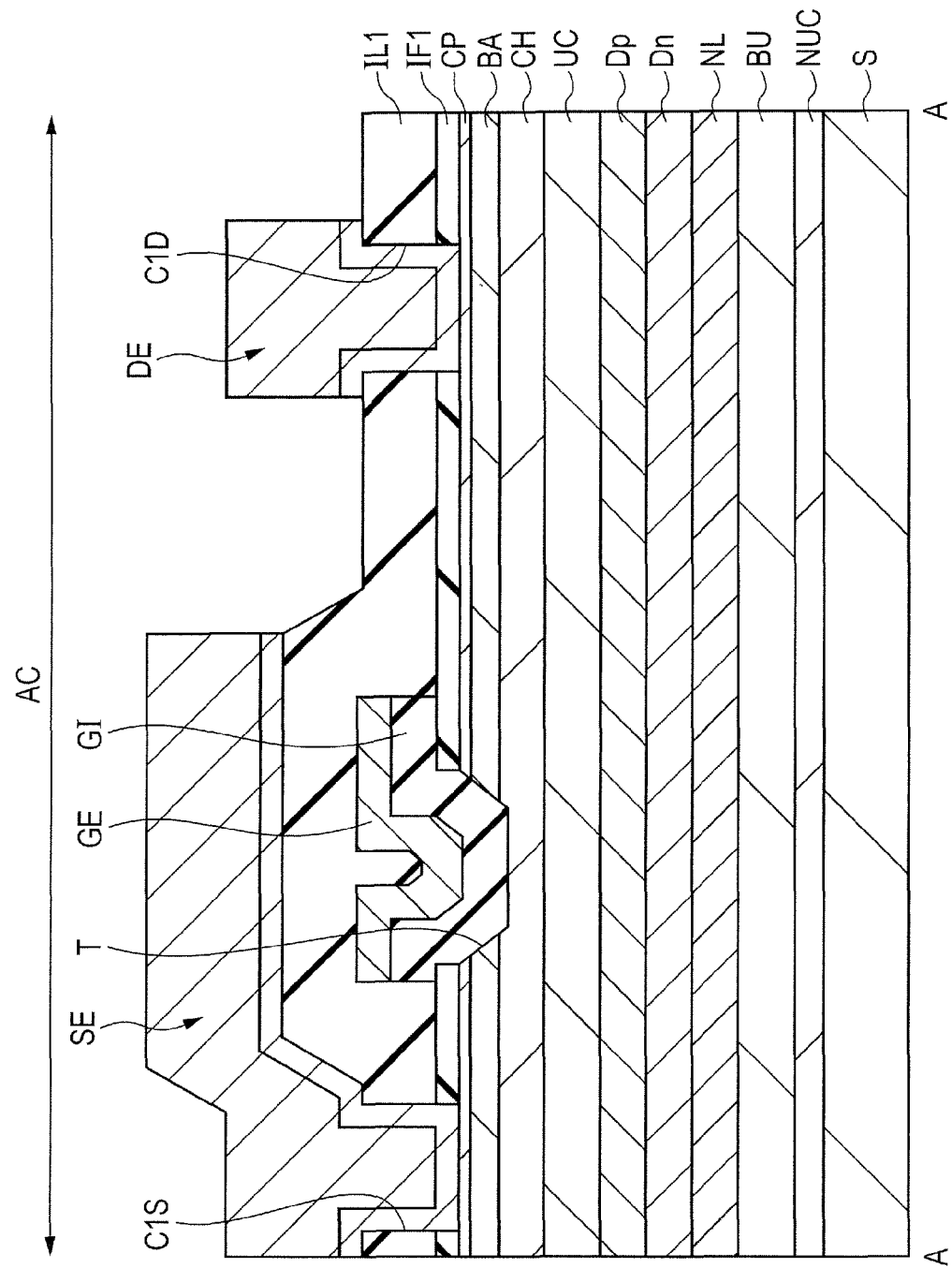
FIG. 31 is a cross-sectional view illustrating a process of manufacturing the semiconductor device according to the first embodiment, which is a cross-sectional view illustrating a manufacturing process subsequent to FIG. 23.

Then, as illustrated in FIG. 27, the side wall insulating film SW is formed on a side wall of the through-hole THD. FIGS. 28 to 30 are cross-sectional views illustrating a process of manufacturing the semiconductor device according to this embodiment, which are cross-sectional views schematically illustrating a process of forming the side wall insulating film SW. As illustrated in FIG. 28, the substrate S having the contact holes C1S, C1D, and the through-holes THS, THD formed is prepared, and as illustrated in FIG. 29, the contact holes C1S, C1D, and the through-hole THS are covered with a mask film M. The mask film M can be formed of, for example, a silicon oxide film ($SiO_2$ film). With this configuration, only the through-hole THD is exposed. Then, an insulating film IF2 is formed on a side wall and a bottom surface of the through-hole THD, the mask film M, and the interlayer insulating film IL1. The insulating film IF2 can be formed of a silicon nitride film that is about 100 nm in thickness. Then, as illustrated in FIG. 30, the insulating film IF2 is etched. In this etching process, the insulating film IF2 is removed from a surface thereof by a given thickness by anisotropically dry etching. Through this process, the insulating film IF2 can, remain on the side wall of the through-hole THD in, a side wall shape (side wall film shape) to provide the side wall insulating film SW. The n+ layer NL is exposed from a center portion of the bottom surface of the through-hole THD. Thereafter, the mask film M is removed by etching.

Then, as illustrated in FIGS. 31 to 34, the source electrode SE and the drain electrode DE are formed on the cap layer CP on both sides of the gate electrode GE. Also, the source pad SP coupled to the source electrode SE is formed, and the drain pad DP coupled to the drain electrode DE is formed.

For example, a conductive film is formed on the interlayer insulating film IL1 including the insides of the contact holes C1S, C1D, and the through-holes THS, THD. For example, as the conductive film, the stacked film (Al/TiN) including a titanium nitride (TiN) film, and an aluminum (Al) film formed on an upper portion thereof is formed through the sputtering technique. The titanium nitride film is, for example, about 50 nm in thickness, and the aluminum film is, for example, about 1000 nm in thickness.

Figure 34:
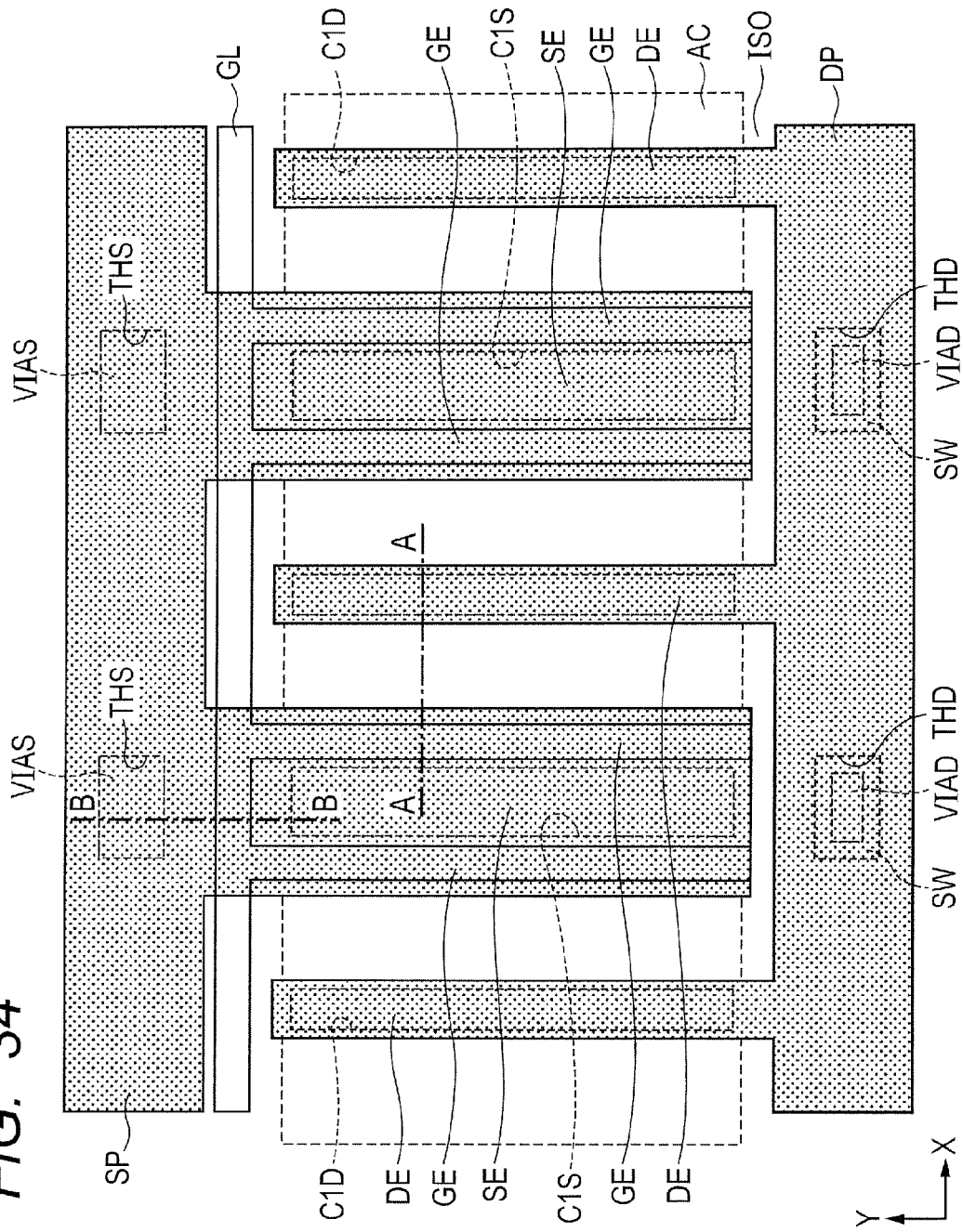
FIG. 34 is a plan view illustrating a process of manufacturing the semiconductor device according to the first embodiment.

Then, a photoresist film (not shown) is formed in the formation regions of the source electrode SE, the drain electrode DE, the source pad SP, and the drain pad DP through the photolithography technique, and the conductive film (Al/TiN) is etched with a photoresist film (not shown) as a mask. For example, the conductive film is dry etched with the use of the chlorine-based gas such as $BCl_3$. Through this process, the connection portion VIAS is formed with the conductive film embedded in the through-hole THD, and the source electrode SE, the drain electrode DE, the source pad SP, and the drain pad DP are further formed. A planar shape of the source electrode SE and the drain electrode DE is a rectangular shape (line shape) having long sides in the Y-direction, as illustrated in FIG. 34. A width of the source electrode SE in the X-direction is about 30 μm, and a width of the drain electrode DE in the X-direction is about 10 μM. Also, a planar shape of the source pad SP and the drain pad DP is a rectangular shape (line shape) having long sides in the X-direction, as illustrated in FIG. 34. The source pad SP is arranged to connect the plural source electrodes SE, and the drain pad DP is arranged to connect the plural drain electrodes DE.

Figure 32:
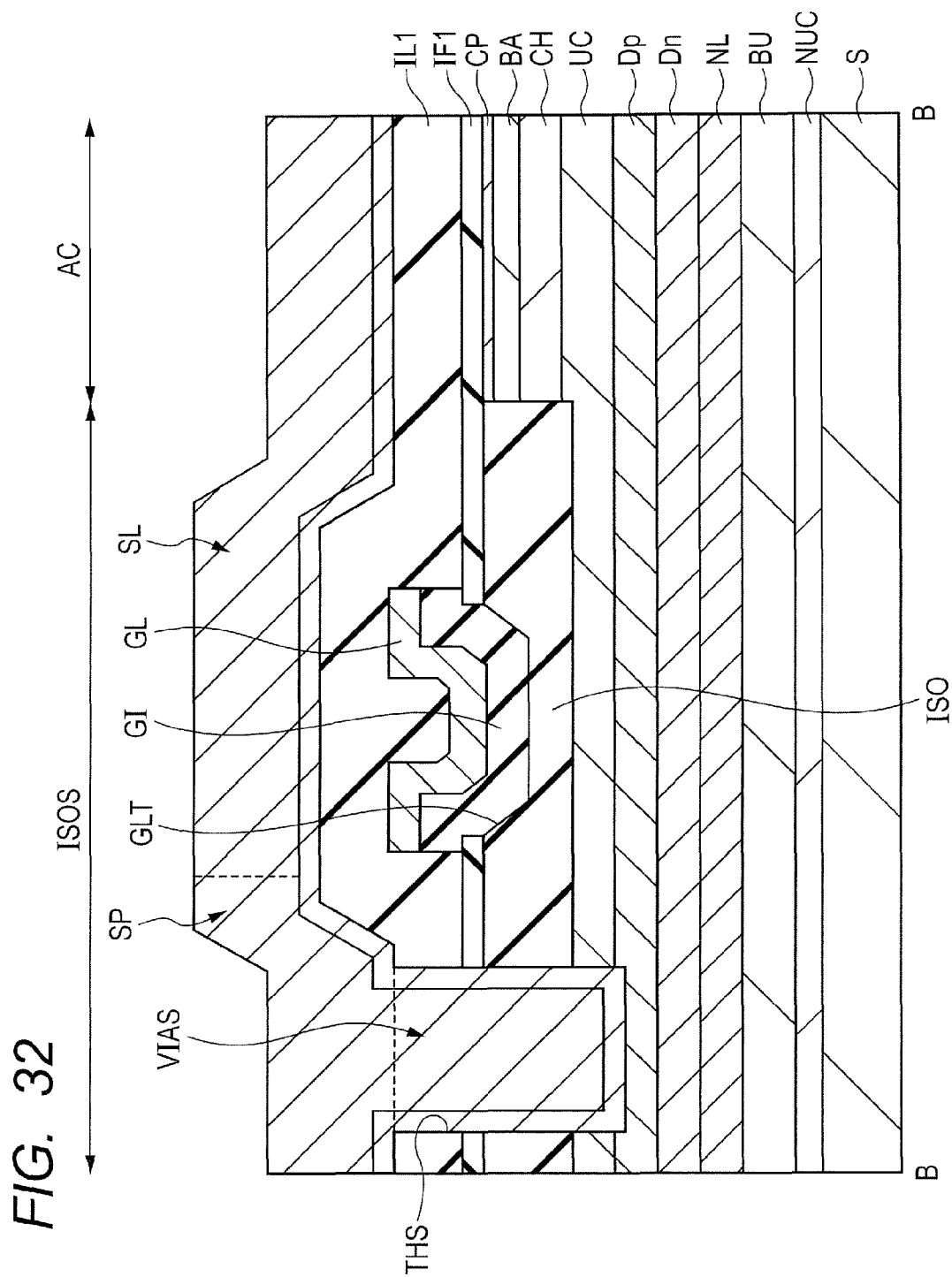
FIG. 32 is a cross-sectional view illustrating a process of manufacturing the semiconductor device according to the first embodiment, which is a cross-sectional view illustrating a manufacturing process subsequent to FIG. 24.
Figure 33:
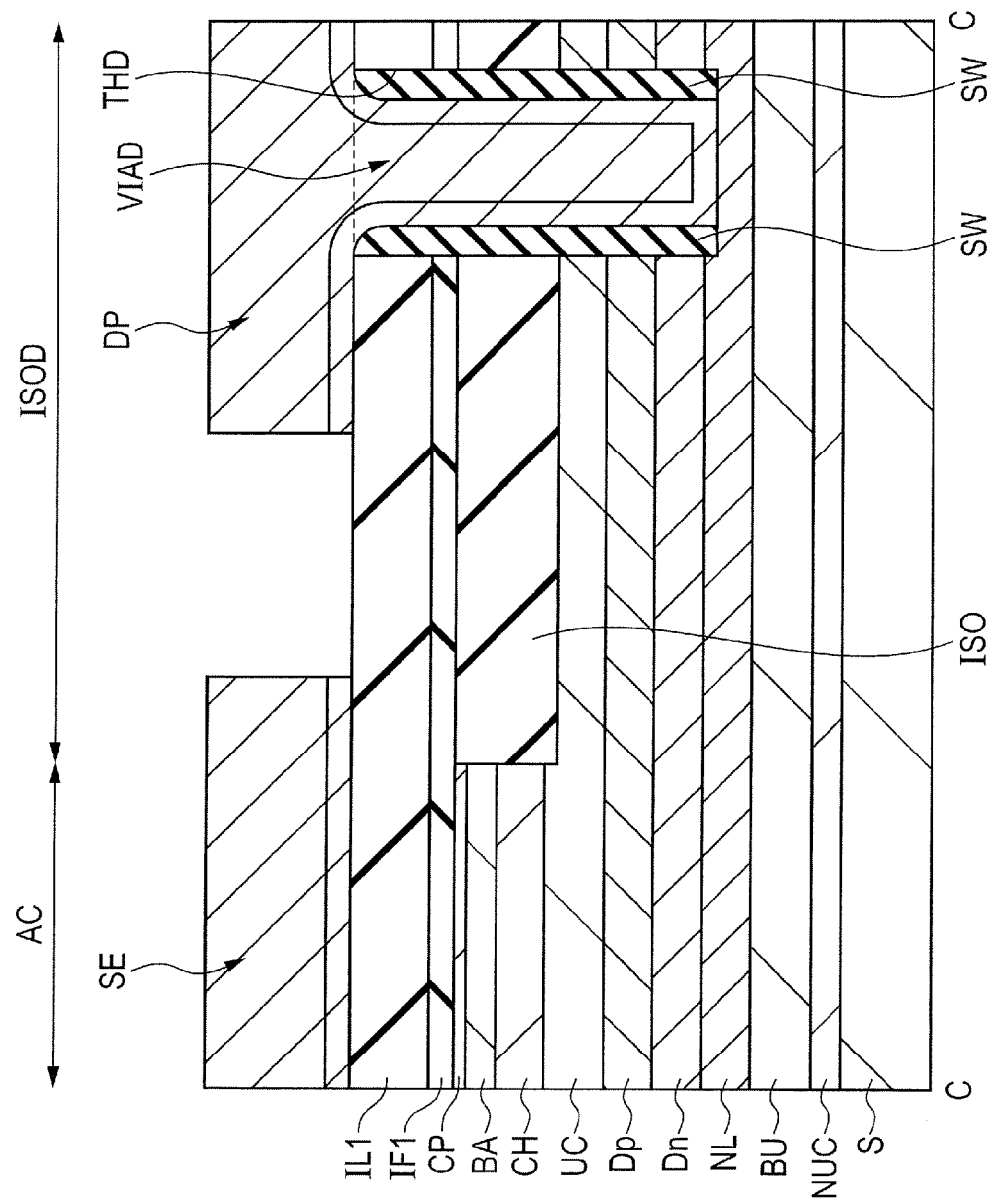
FIG. 33 is a cross-sectional view illustrating a process of manufacturing the semiconductor device according to the first embodiment, which is a cross-sectional view illustrating a manufacturing process subsequent to FIG. 27.

The connection portion VIAS (through-hole THS) is located below the source pad SP, and the source pad SP and the p-type layer Dp are electrically coupled to each other through the connection portion VIAS (FIG. 32). Also, the connection portion VIAD (through-hole THD) is located below the drain pad DP, and the drain pad DP and the n-type layer Dn are electrically coupled to each other through the connection portion VIAD and the n+ layer NL (FIG. 33).

Then, the protective film (also called "insulating film" or "surface protective film") PRO is formed on the interlayer insulating film IL1, as well as on the source electrode SE, the drain electrode DE, the source pad SP, and the drain pad DP. As the protective film PRO, for example, a silicon oxynitride (SiON) film is deposited, for example, on the interlayer insulating film IL1 through the CVD technique.

Through the above process, the semiconductor device according to this embodiment can be formed. The above process is exemplary, and the semiconductor device according to this embodiment may be manufactured through a process other than the above process.

As described above, according to this embodiment, the n-type layer Dn and the p-type layer Dp (pn diode) are arranged between the buffer layer BU and the channel underlying layer UC. The n-type layer Dn is coupled to the drain electrode (cathode electrode) DE, and the p-type layer Dp is coupled to the source electrode (anode electrode) SE. With this configuration, when a positive voltage is applied to the source electrode SE side, a forward current of the pn diode flows. As a result, an avalanche breakdown can be inhibited from being generated, and the MISFET (element) can be inhibited from being broken.

Also, in the operation of the element using the nitride semiconductor such as GaN, only electrons operate as conduction carriers as described above. However, when a high voltage of a design value or higher is applied to the drain electrode DE, an electric field between the gate electrode GE and the drain electrode DE increases, and the avalanche breakdown is likely to be generated in the gate electrode GE end or the drain electrode DE end. When the avalanche breakdown of this type is generated, holes are generated within the element. However, the effective mass of the holes in the nitride semiconductor such as GaN is large (for example, about 0.8 in the case of GaN), and a valence band discontinuity amount in the heterojunction is large. For that reason, the holes that have been generated once are hardly escaped from the gate electrode GE, and liable to be accumulated. An electric field is further intensified with the accumulation of the holes, as a result of which an avalanche current increases, and the element is finally broken.

On the contrary, in this embodiment, as described above, the n-type layer Dn and the p-type layer Dp (pn diode) are arranged between the buffer layer BU and the channel underlying layer UC, and for example, the pn junction of the pn diode is subjected to avalanche breakdown with a voltage (for example, about 600V) lower than the design value (for example, about 750V) of the avalanche breakdown voltage of the element portion (the pn junction is not broken), thereby being capable of preventing the destruction of the element.

Also, with the provision of the n-type layer Dn and the p-type layer Dp (pn diode) within the element, a protective diode externally attached to the element can be omitted. Also, when the element and the pn diode are arranged to overlap with each other, a device area can be reduced, and the higher integration of the element can be performed, as compared with a case in which the element and the pn diode are arrayed two-dimensionally.

Also, with the provision of the pn diode made of the nitride semiconductor within the element, operation at high temperature (for example, about 300° C. to 500° C.) is enabled as compared with a case in which the pn diode made of Si is arranged within the element. That is, because an energy band gap (1.1 eV) of Si is narrow, free carriers are generated at a temperature of 200° C. or higher, to thereby make diode operation impossible. On the contrary, in the nitride semiconductor, for example, GaN, the energy band gap is large, that is, 3.4 eV, and the element operation and the pn diode operation are enabled even at high temperature (for example, 200° C. or higher).

Also, in this embodiment, since the connection portion VIAS within the through-hole THS is arranged within the device isolation region ISO outside of the active region AC in which electrons conduct, and under the formation area of the source pad SP, the miniaturization and the higher integration of the semiconductor element can be performed. Also, since the connection portion VIAD within the through-hole THD is arranged within the device isolation region ISO outside of the active region AC in which the electrons conduct, and under the formation region of the drain pad DP, the miniaturization and the higher integration of the semiconductor element can be performed. Further, because the larger active region AC in which electrons can conduct can be ensured, an on-resistance per unit area can be reduced.

Second Embodiment

In the first embodiment, the connection portion VIAS is arranged in the device isolation region ISO (ISOS). Alternatively, the connection portion VIAS may be arranged in the active region AC. For example, in in this embodiment, the connection portion VIAS is arranged below the source electrode SE.

Hereinafter, a description will be given of a semiconductor device according to this embodiment in detail with reference to the accompanying drawings.
(Structure Description)

Figure 35:
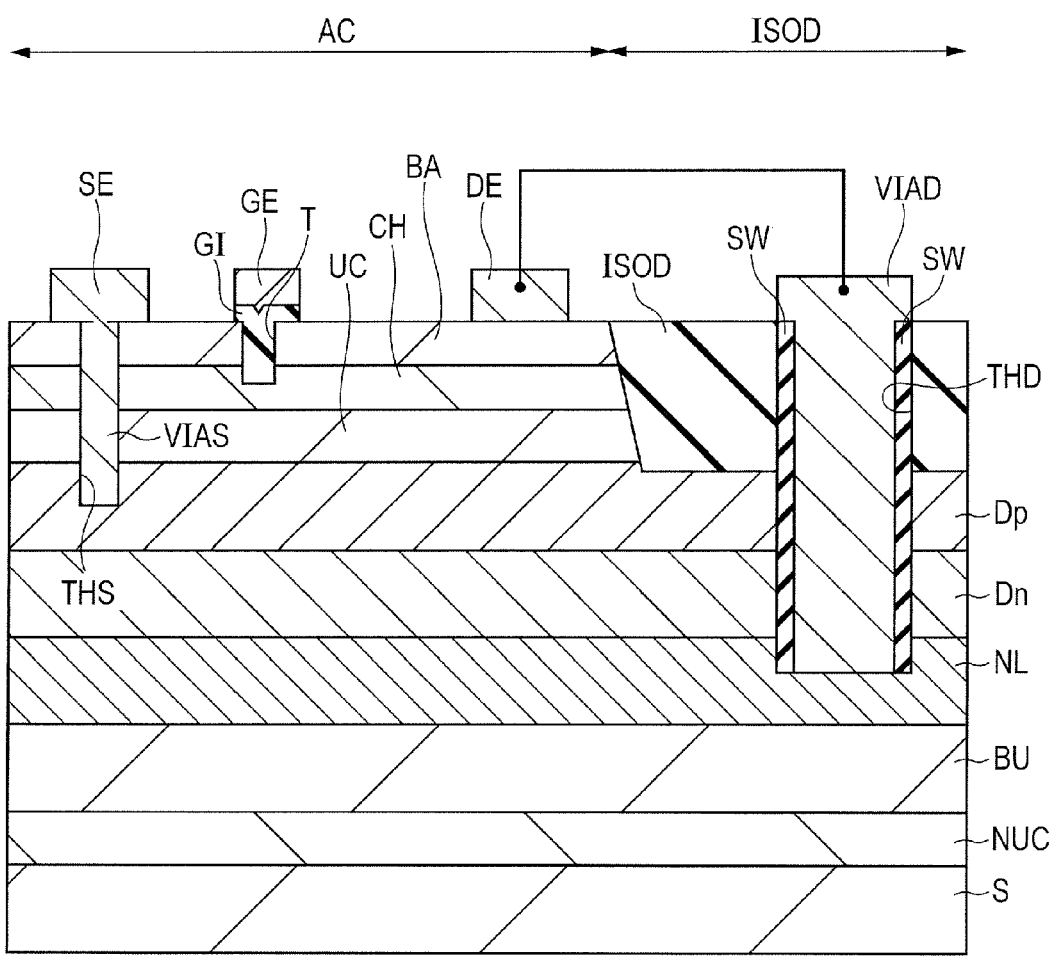
FIG. 35 is a cross-sectional view schematically illustrating a configuration of a semiconductor device according to a second embodiment.

FIG. 35 is a cross-sectional view schematically illustrating a configuration of a semiconductor device according to this embodiment. A semiconductor device (semiconductor element) according to this embodiment is an MIS type field effect transistor made of a nitride semiconductor. The semiconductor device can be used as a high electron mobility transistor (HEMT) type power transistor. The semiconductor device according to this embodiment is a so-called recessed gate type semiconductor device.

In the semiconductor device according to this embodiment, as in the first embodiment, a nucleation layer NUC, a buffer layer BU, an n+ layer NL, an n-type layer Dn, a p-type layer Dp, a channel underlying layer UC, a channel layer (also called "electron transit layer") CH, and a barrier layer BA are made over a substrate S in the stated order. The nucleation layer NUC is formed of a nitride semiconductor layer. The buffer layer BU is formed of a nitride semiconductor layer of a single layer or plural layers in which impurities forming a deep level are doped to the nitride semiconductor. In this example, a superlattice structure having plural nitride semiconductor layers is used. The n+ layer NL is formed of a nitride semiconductor layer in which n-type impurities are doped to the nitride semiconductor. The n-type layer Dn is formed of a nitride semiconductor layer in which n-type impurities are doped to the nitride semiconductor, which is a layer lower in a concentration of the n-type impurities than the n+ layer NL. The p-type layer Dp is formed of a nitride semiconductor layer in which p-type impurities are doped to the nitride semiconductor. The channel underlying layer UC is a layer that determines a lattice constant in a planar view of an upper layer, a layer smaller in the lattice constant in the planar direction than the channel underlying layer UC is subject to a tensile strain, and a layer larger in the lattice constant in the planar direction than the channel underlying layer UC is subject to a compressive strain. The channel layer CH is formed of a nitride semiconductor layer larger in the electron affinity than the channel underlying layer UC. The barrier layer BA is formed of a nitride semiconductor layer smaller in the electron affinity than the channel layer CH. An insulating film (not shown) is formed on the barrier layer BA. A cap layer may be provided between an insulating film (protective film) and the barrier layer BA. The cap layer is formed of a nitride semiconductor layer larger in the electron affinity than the barrier layer BA.

The MISFET according to this embodiment has a gate electrode GE formed through a gate insulating film GI, and a source electrode SE and a drain electrode DE which are formed on the barrier layer BA between both sides of the gate electrode GE, above the channel layer CH. The MISFET is formed in an active region AC partitioned by device isolation regions ISO. Also, the gate electrode GE is formed within a trench T that penetrates through the barrier layer BA, and reaches the middle portion of the channel layer CH through the gate insulating film GI.

According to this embodiment, the n-type layer Dn and the p-type layer Dp (pn diode) are arranged between the buffer layer EU and the channel underlying layer UC. The n-type layer Dn is coupled to the drain electrode (cathode electrode) DE through the connection portion VIAD, and the p-type layer Dp is coupled to the source electrode (anode electrode) SE through the connection portion VIAS. The n+ layer NL is arranged below the n-type layer Dn, and the n-type layer Dn and the drain electrode (cathode electrode) DE are coupled to each other through the n+ layer NL. In this way, the n-type layer Dn and the p-type layer Dp (pn diode) are arranged as a result of which an avalanche breakdown can be inhibited from being generated, and the MISFET (element) can be inhibited from being broken.

Figure 36:
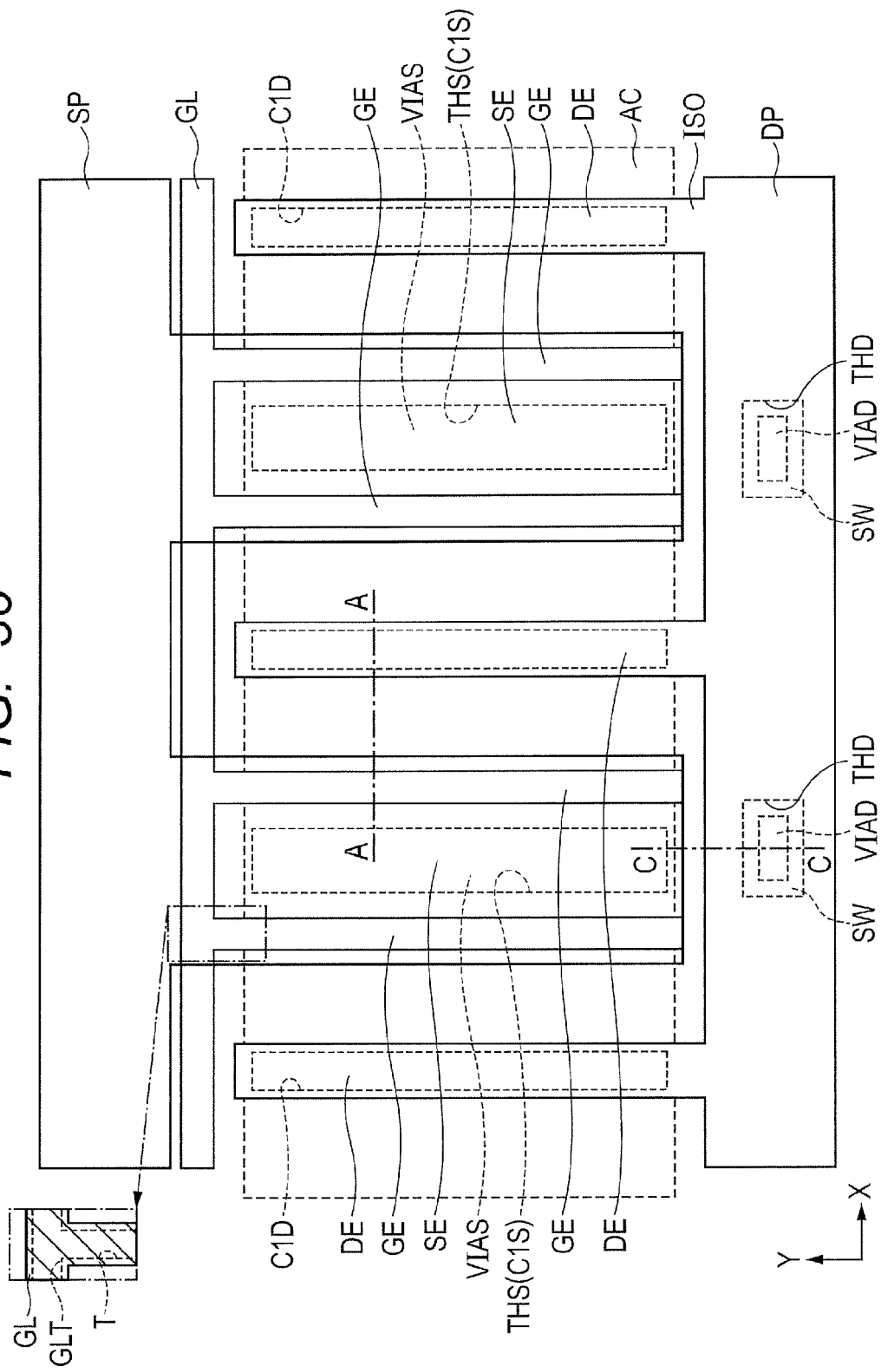
FIG. 36 is a plan view illustrating the configuration of the semiconductor device according to the second embodiment.
Figure 37:
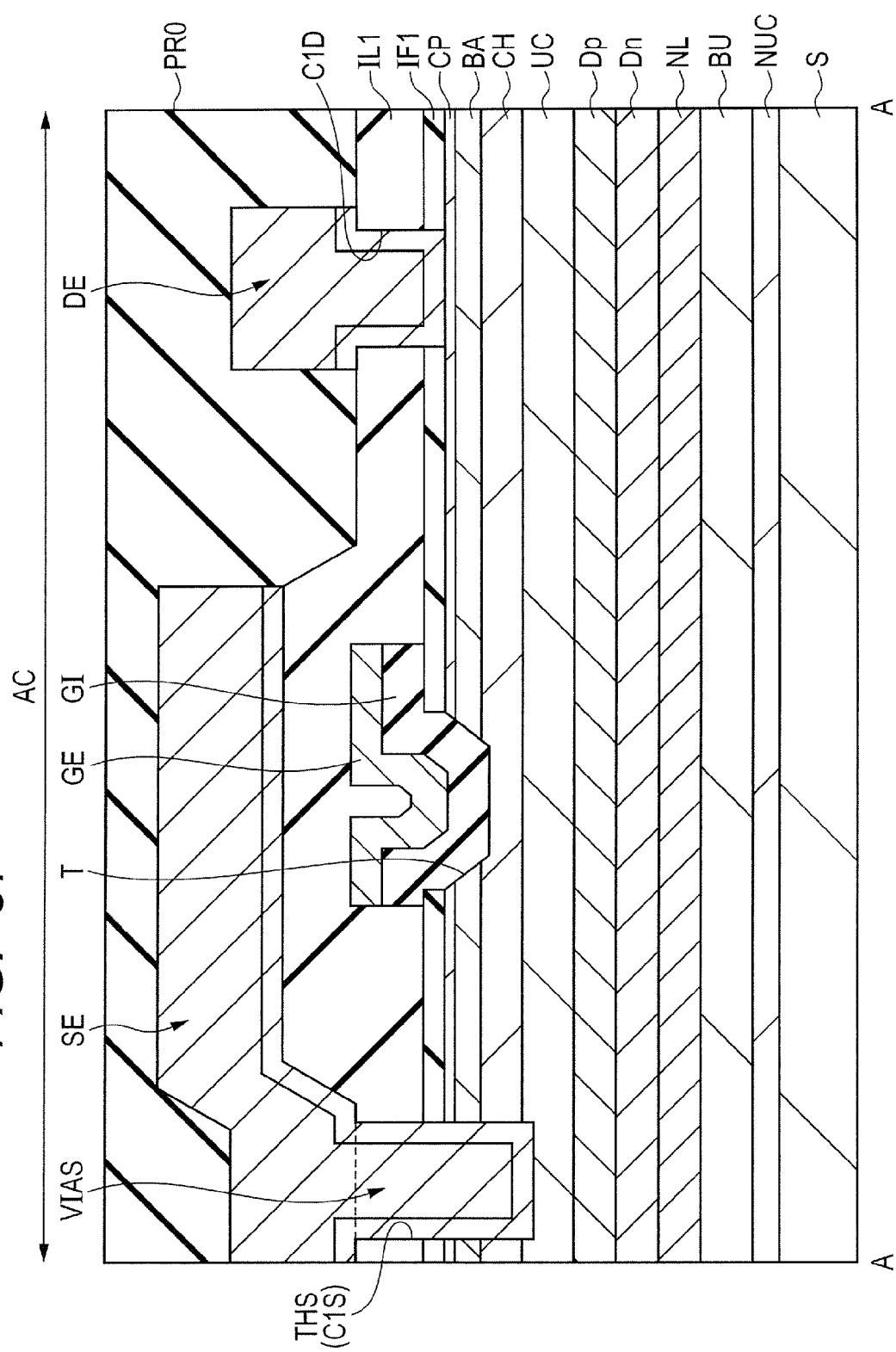
FIG. 37 is a cross-sectional view illustrating the configuration of the semiconductor device according to the second embodiment.
Figure 38:
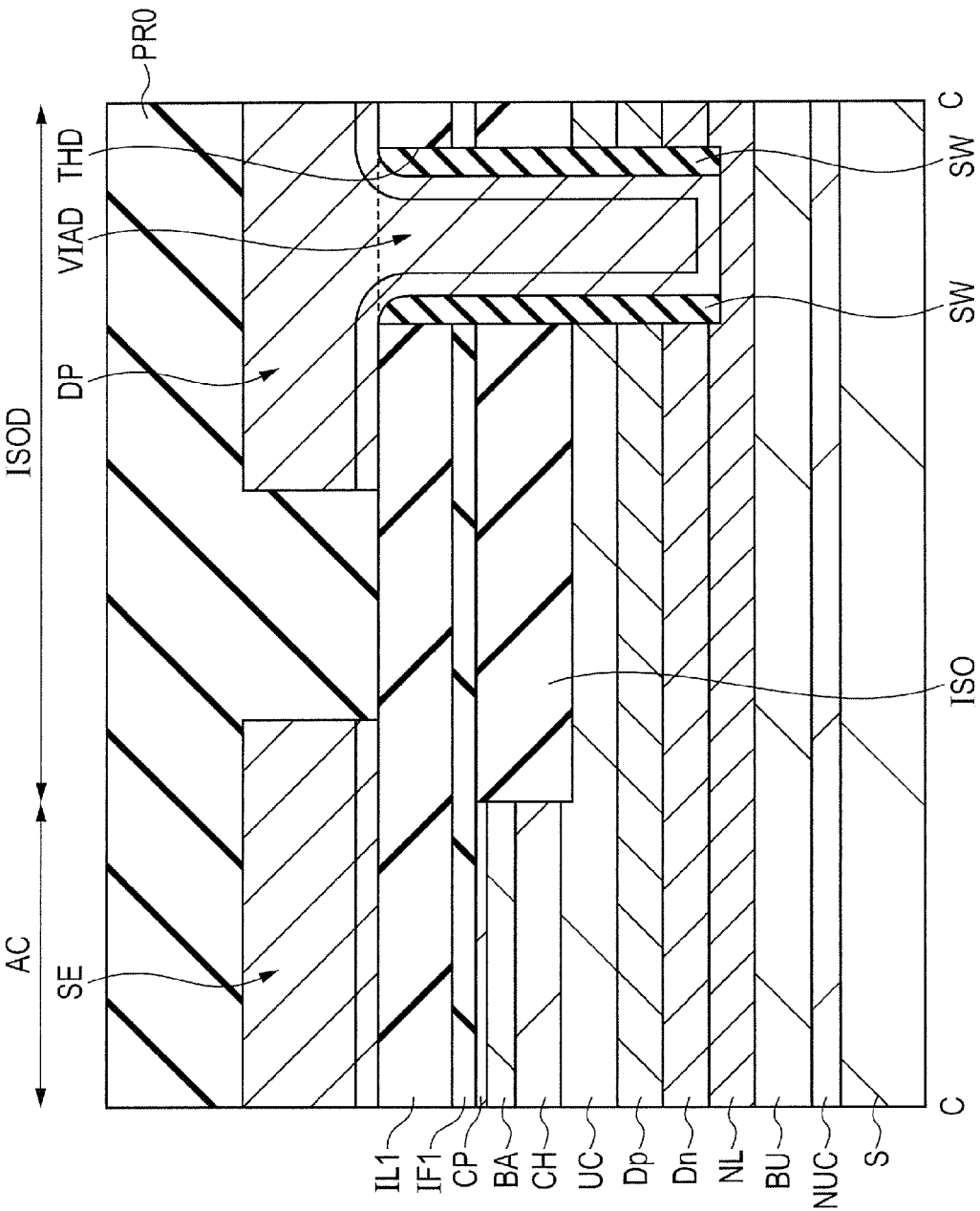
FIG. 38 is a cross-sectional view illustrating a process of manufacturing the semiconductor device according to the second embodiment.

The semiconductor device according to the second embodiment will be described in more detail with reference to FIGS. 36 to 38. FIG. 36 is a plan view illustrating a configuration of the semiconductor device according to this embodiment. FIGS. 37 and 38 are cross-sectional views illustrating the configuration of the semiconductor device according to this embodiment. FIG. 37 corresponds to a cross-section taken along a line A-A in FIG. 36, and FIG. 38 corresponds to a cross-section taken along a line C-C in FIG. 36. The configurations other than the formation position of the connection portion VIAS are identical with those in the first embodiment, and therefore a detailed description of the same configurations as those in the first embodiment will be omitted.

As illustrated in FIG. 36, plural line-shaped drain electrodes DE are arranged at given intervals in the X-direction, and plural line-shaped source electrodes SE are arranged at given intervals in the X-direction. As in the first embodiment, the plural source electrodes SE and the plural drain electrodes DE are alternately arranged along the X-direction.

As in the first embodiment, a contact hole C1D that forms a connection portion between the drain electrode DE and the cap layer CP is arranged below the drain electrode DE. Also, in the device isolation region ISOD, connection portion (also called "via") VIAS that penetrates through the device isolation region ISOD, and reaches the n+ layer NL below the device isolation region ISOD is arranged. The connection portion VIAD and the drain electrode DE are electrically coupled to each other (FIG. 38). In order to prevent an electric connection between the connection portion VIAD and the p-type layer Dp, a side wall insulating film SW is arranged on a side wall portion of the connection portion VIAD. A connection portion VIAS that electrically connects the source electrode SE and the p-type layer Dp is arranged below the source electrode SE (FIG. 37). The connection portion VIAS is arranged within the through-hole THS, and a planar shape of the connection portion VIAS is a rectangular shape having long sides in the Y-direction. Hence, the connection portion VIAS is electrically coupled to the source electrode SE.

The gate electrode GE is arranged between the contact hole C1D below the drain electrode DE and the through-hole THS below the source electrode SE. As in the first embodiment, the gate electrode GE is of a rectangular shape having long sides in the Y-direction. Two (a pair of) gate electrodes GE are arranged below one of the source electrodes SE. Those two gate electrodes GE are arranged on both sides of the through-hole THS below the source electrode SE. In this way, two gate electrodes GE are repetitively arranged in correspondence with the plural source electrodes SE.

As in the first embodiment, the plural drain electrodes DE are coupled to each other by a drain pad DP, and the plural source electrodes SE are coupled to each other by a source pad SP. A protective film (also called "insulating film", "cover film", or "surface protective film") PRO is arranged over the source electrode SE and the drain electrode DE.

The constituent materials of the nucleation layer NUC, the buffer layer BU, the n+ layer NL, the n-type layer Dn, the p-type layer Dp, the channel underlying layer UC, the channel layer (also called "electron transit layer") CH, the barrier layer BA, the cap layer CP, and the insulating film IF1 are identical with those described in the first embodiment.

Also, the respective constituent materials of the gate insulating film GI, the gate electrode GE, the interlayer insulating film IL1, and the protective film PRO are identical with those described in the first embodiment.

Also, the respective constituent materials of the source electrode SE, the drain electrode DE, the source pad SP, the drain pad DP, and the connection portions VIAS, VIAD are identical with those described in the first embodiment.

As described above, according to this embodiment, since the n-type layer Dn and the p-type layer Dp (pn diode) are arranged between the buffer layer BU and the channel underlying layer UC, the avalanche breakdown can be inhibited from being generated, and the breaking of the MISFET (element) can be suppressed. Also, since the element and the pn diode are arranged to overlap with each other, the device area can be reduced, and the higher integration of the element can be performed. Also, with the provision of the pn diode made of the nitride semiconductor within the element, operation at high temperature (for example, 200° C. or higher) can be conducted. Also, since the connection portion VIAD within the through-hole THD is arranged within the device isolation region ISO outside of the active region AC in which the electrons conduct, and under the formation region of the drain pad DP, the miniaturization and the higher integration of the semiconductor element can be performed. Further, because the larger active region AC in which electrons can conduct can be ensured, an on-resistance per unit area can be reduced. Also, since the connection portion VIAD is arranged within the device isolation region ISO outside of the active region AC in which the electrons conduct, the miniaturization and the higher integration of the semiconductor element can be performed. Further, the on-resistance per unit area can be reduced.

(Description of Manufacturing Method)

Subsequently, a description will be given of a method of manufacturing the semiconductor device according to this embodiment while the configuration of the semiconductor device will be more clarified, with reference to FIGS. 39 to 44. FIGS. 39 to 44 are cross-sectional views illustrating a process of manufacturing the semiconductor device according to this embodiment.

Figure 39:
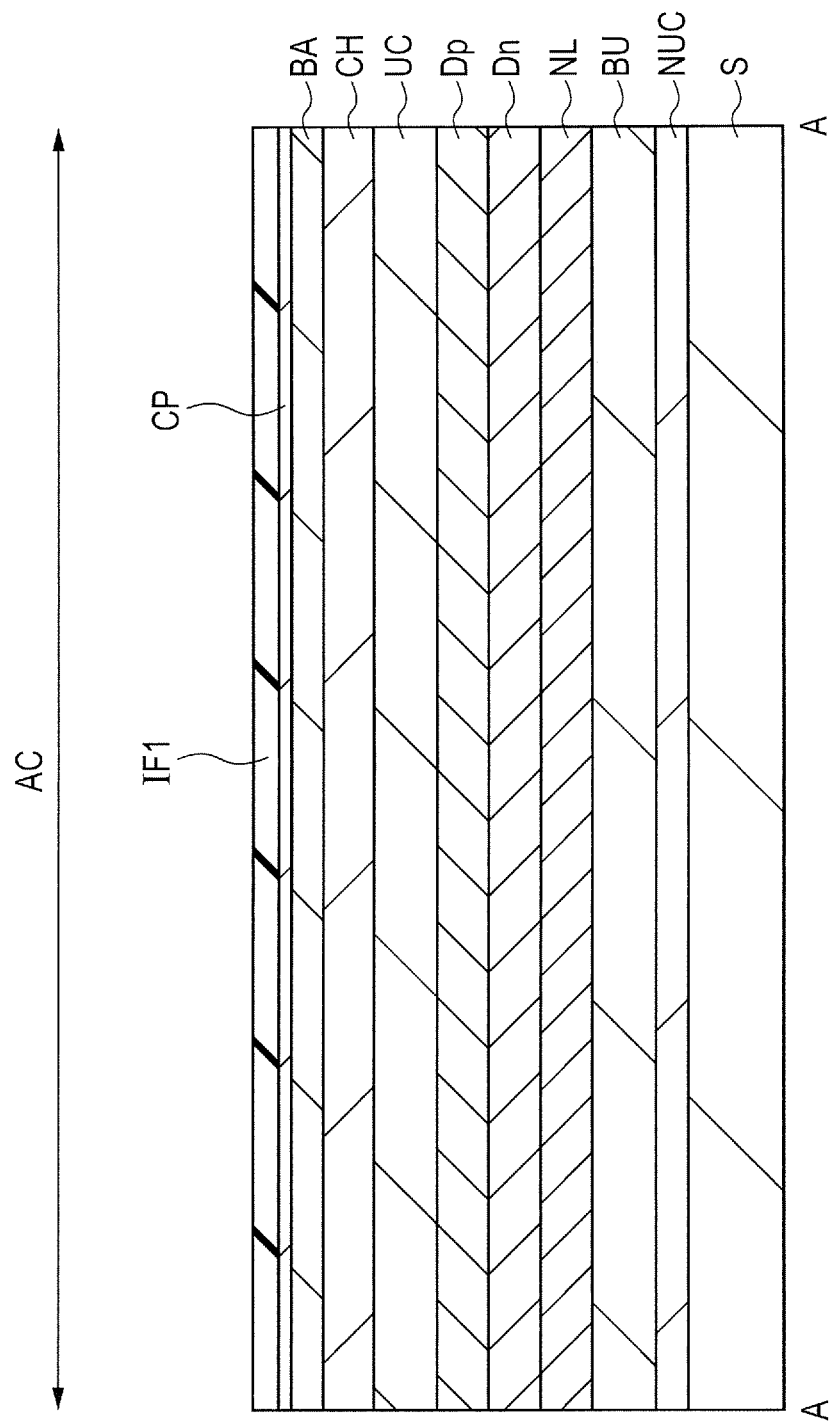
FIG. 39 is a cross-sectional view illustrating a process of manufacturing the semiconductor device according to the second embodiment.

As illustrated in FIG. 39, the nucleation layer NUC and the buffer layer BU are sequentially made on the substrate S. Those layers are made of the materials described in the first embodiment, and can be formed in the same manner as that in the first embodiment.

Then, as the n+ layer NL, the gallium nitride layer (n+GaN layer) containing the n-type impurities is heteroepitaxially grown on the buffer layer BU through the metal organic vapor phase epitaxy. For example, Si is used as the n-type impurities. For example, the gallium nitride layer is deposited in about 200 nm while being doped with Si. The Si concentration in the deposited film is set to, for example, about $1\times10^{19}$(1E19) cm$^{-3}$.

Then, as the n-type layer Dn, for example, the gallium nitride layer (n−GaN layer) containing the n-type impurities is heteroepitaxially grown on the n+ layer NL through the metal organic vapor phase epitaxy. For example, Si is used as the n-type impurities. For example, the gallium nitride layer is deposited in about 1000 nm while being doped with Si. The Si concentration in the deposited film is set to, for example, about $3 \times 10^{16}$ (1E16) cm$^{-3}$.

Then, as the p-type layer Dp, for example, the gallium nitride layer (p⁻GaN layer) containing the p-type impurities is heteroepitaxially grown on the buffer layer BU through the metal organic vapor phase epitaxy. For example, magnesium (Mg) is used as the p-type impurities. For example, the gallium nitride layer is deposited in about 1000 nm while being doped with Mg. The Mg concentration in the deposited film is set to, for example, about $5 \times 10^{17}$ (5E17) cm$^{-3}$.

Then, the channel underlying layer UC, the channel layer CH, the barrier layer BA, the cap layer CP, and the insulating film IF1 are sequentially formed on the p-type layer Dp. Those layers are made of materials described in the first embodiment, and can be formed in the same manner as that in the first embodiment. Then, the device isolation region ISO is formed in the same manner as that in the first embodiment.

Figure 40:
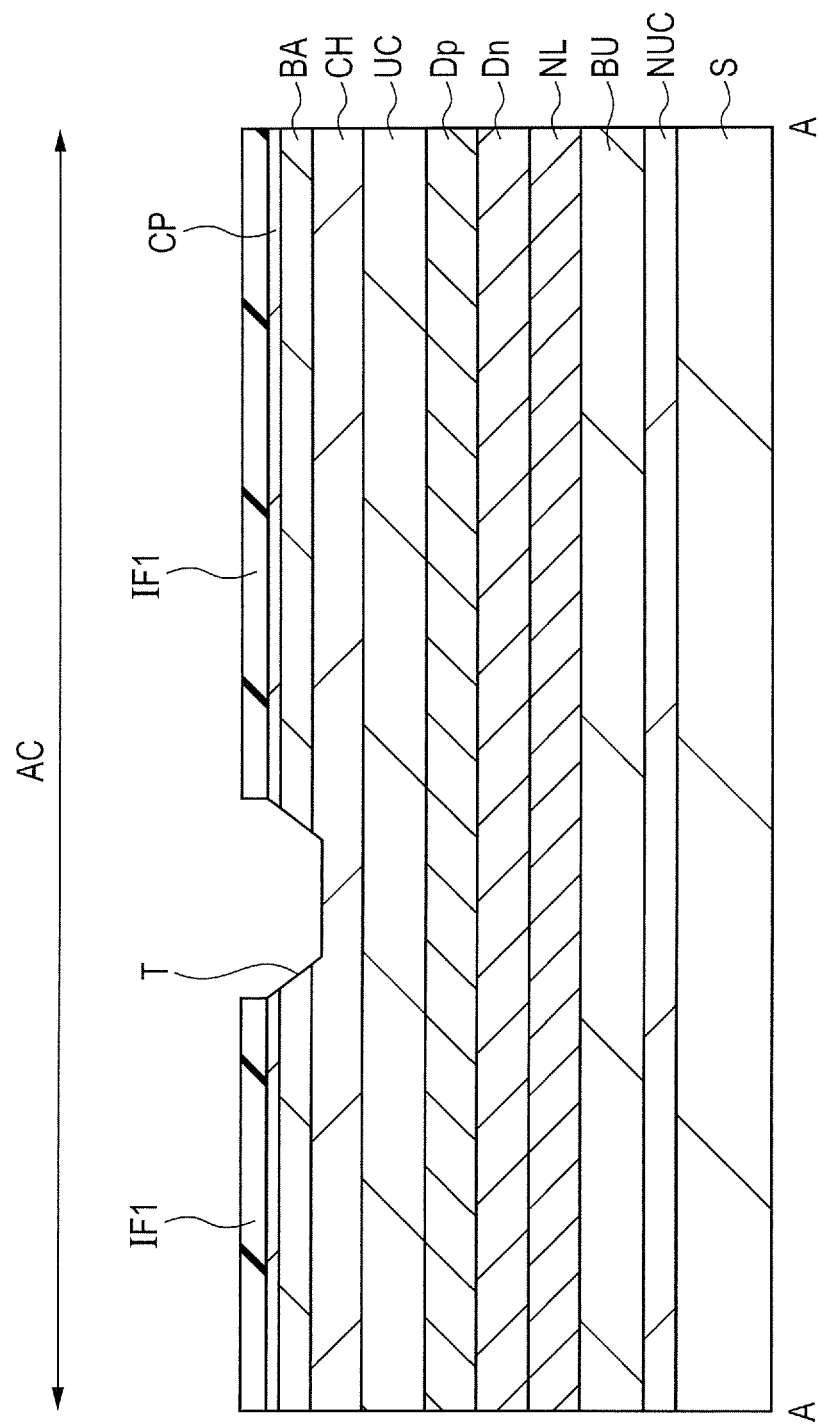
FIG. 40 is across-sectional view illustrating a process of manufacturing the semiconductor device according to the second embodiment, which is a cross-sectional view illustrating a manufacturing process subsequent to FIG. 39.

Then, as illustrated in FIG. 40, in the same manner as that in the first embodiment, an opening is formed in the gate electrode formation region of the insulating film IF1, and the cap layer CP, the barrier layer BA, and the channel layer CH are dry etched with the insulating film IF1 as a mask to form a trench T that penetrates through the cap layer CP and the barrier layer BA, and reaches the middle portion of the channel layer CH. In this situation, as in the first embodiment, a groove (GLT) for the gate line GL is formed in the device isolation region ISO (refer to FIG. 13).

Figure 41:
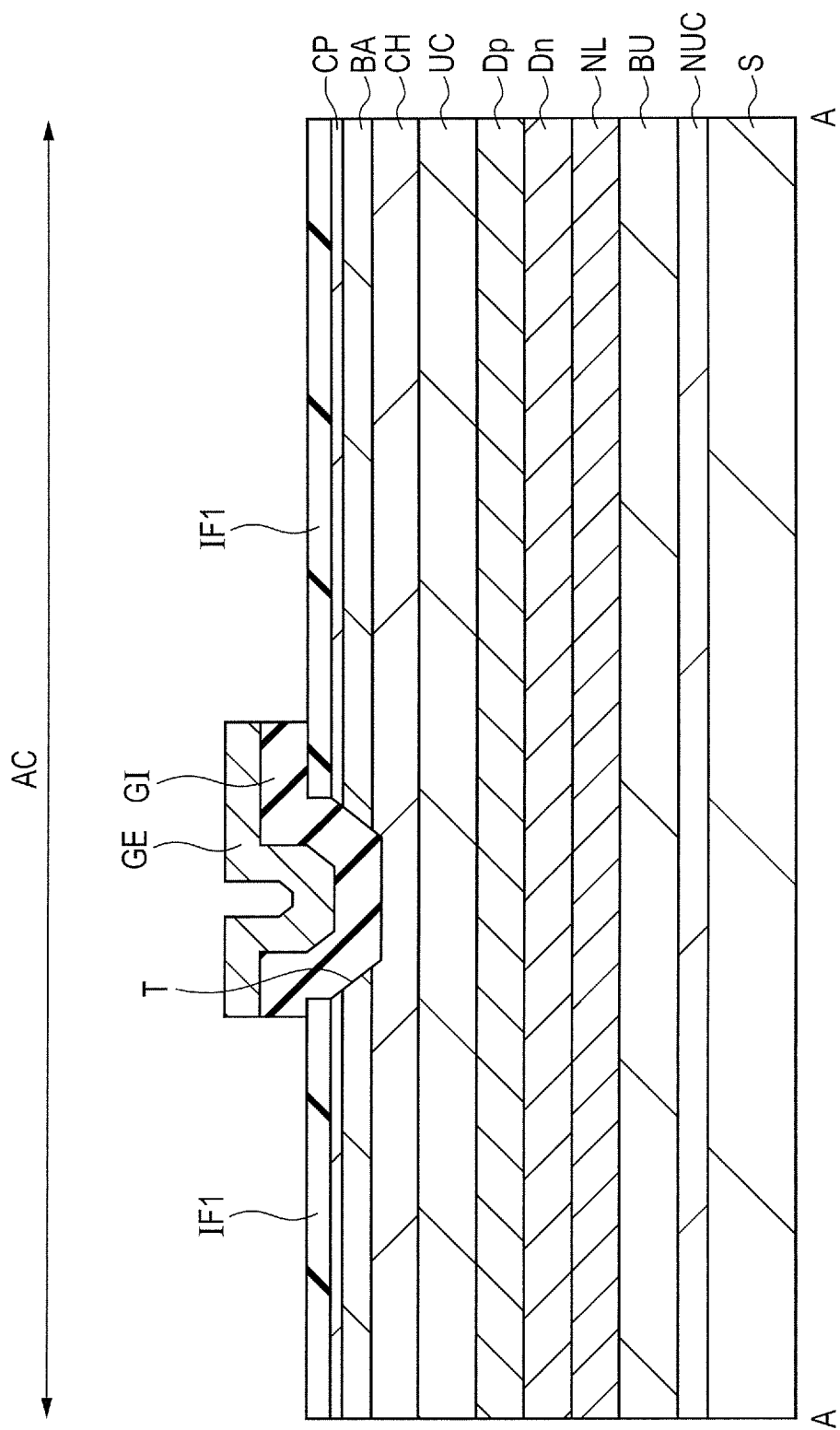
FIG. 41 is a cross-sectional view illustrating a process of manufacturing the semiconductor device according to the second embodiment, which is across-sectional view illustrating a manufacturing process subsequent to FIG. 40.

Then, as illustrated in FIG. 41, the gate electrode GE is formed over the insulating film IF1 including the interior of the trench T through the gate insulating film GI. The gate insulating film GI and the gate electrode GE are made of the materials described in the first embodiment, and can be formed in the same manner as that in the first embodiment.

Figure 42:
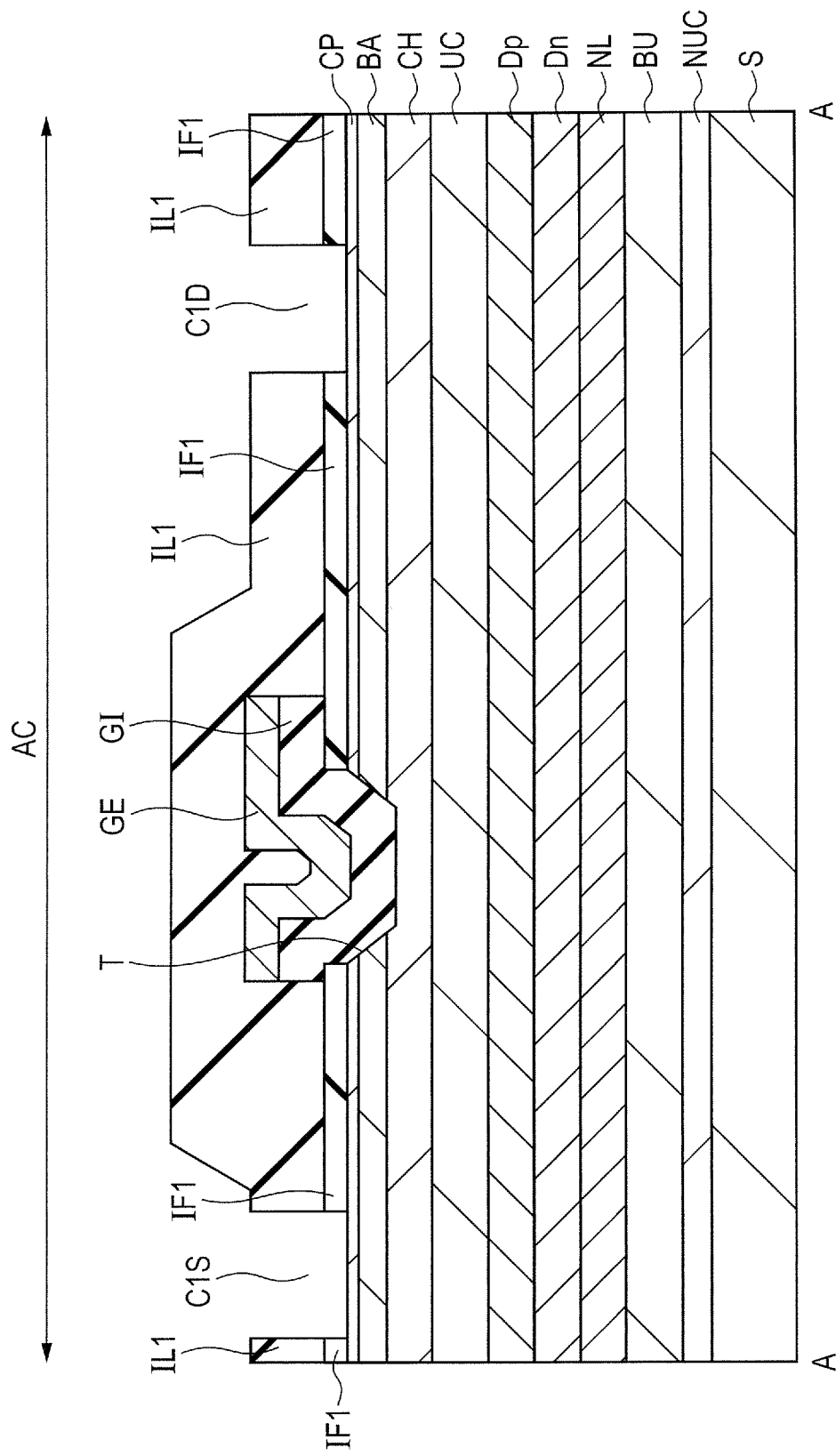
FIG. 42 is a cross-sectional view illustrating a process of manufacturing the semiconductor device according to the second embodiment, which is a cross-sectional view illustrating a manufacturing process subsequent to FIG. 41.
Figure 43:
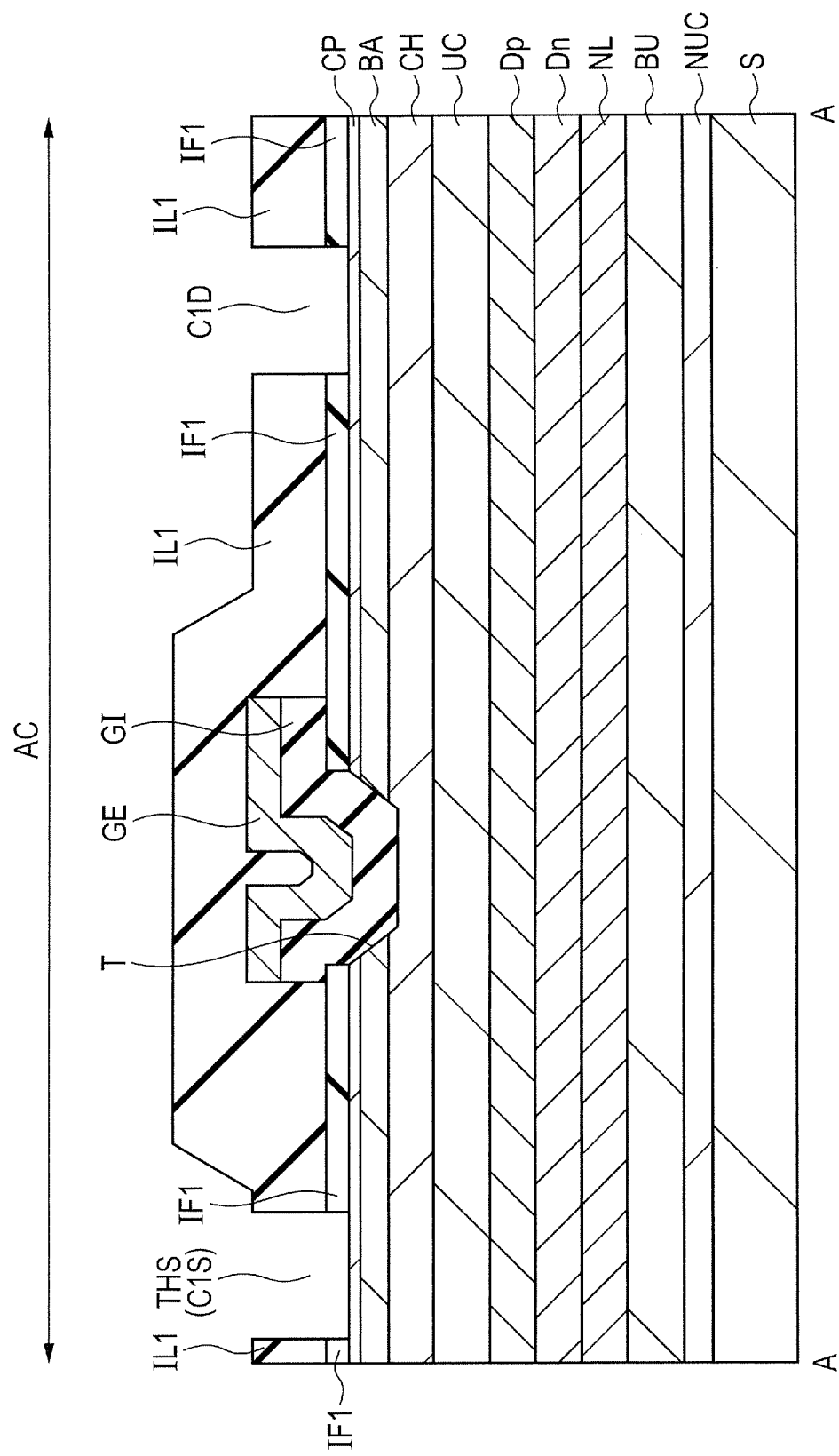
FIG. 43 is across-sectional view illustrating a process of manufacturing the semiconductor device according to the second embodiment, which is a cross-sectional view illustrating a manufacturing process subsequent to FIG. 42.

Then, as illustrated in FIG. 42, the interlayer insulating film IL1 is formed over the insulating film IF1 and the gate electrode GE in the same manner as that in the first embodiment. Then, the contact holes C1S and C1D are formed in the interlayer insulating film IL1 and the insulating film IF1 through the photolithography technique and the etching technique. Then, as illustrated in FIG. 43, the through-hole THS is formed. Then, although not shown, the through-hole THD is formed in the same manner as that in the first embodiment (refer to FIG. 25).

For example, the first photoresist film having respective openings in the source electrode connection region and the drain electrode connection region is formed on the interlayer insulating film M. Then, the interlayer insulating film IL1 and the insulating film IF1 are etched with the first photoresist film as a mask, to thereby form the contact holes C1S and C1D.

Then, after the first photoresist film has been removed, a second photoresist film that covers insides of the contact hole C1D, and has an opening in the contact hole C1S is formed on the interlayer insulating film IL1. Then, a part of the cap layer CP, the barrier layer BA, the channel layer CH, the channel underlying layer UC, and the p-type layer Dp is etched with the second photoresist film as a mask, to thereby form the through-hole THS.

Then, after the second photoresist film has been removed, a third photoresist film that covers insides of the contact hole C1D and the through-hole THS, and has an opening in the formation region of the through-hole THD is formed on the interlayer insulating film IL1. Then, a part of the interlayer insulating film IL1, the insulating film IF1, the device isolation region ISO, the channel underlying layer UC, the p-type layer Dp, the n-type layer Dn, and the n+ layer NL is etched with the third photoresist film as a mask, to thereby form the through-hole (THD, refer to FIG. 25). In other words, the through-hole THD that penetrates through the interlayer insulating film IL1, the insulating film IF1, the device isolation region ISO, the channel underlying layer UC, the p-type layer Dp, and the n-type layer Dn, and reaches the middle portion of the n+ layer NL is formed. The etching conditions for forming the contact hole C1D, the through-hole THS, and the through-hole THD can be identical with those in the first embodiment. The forming order of the contact hole C1D, and the through-hole THS is not limited to the above example, and various processes are available. Then, in the same manner as that in the first embodiment, the side wall insulating film SW is formed on the side wall of the through-hole THD. (refer to FIG. 27).

Figure 44:
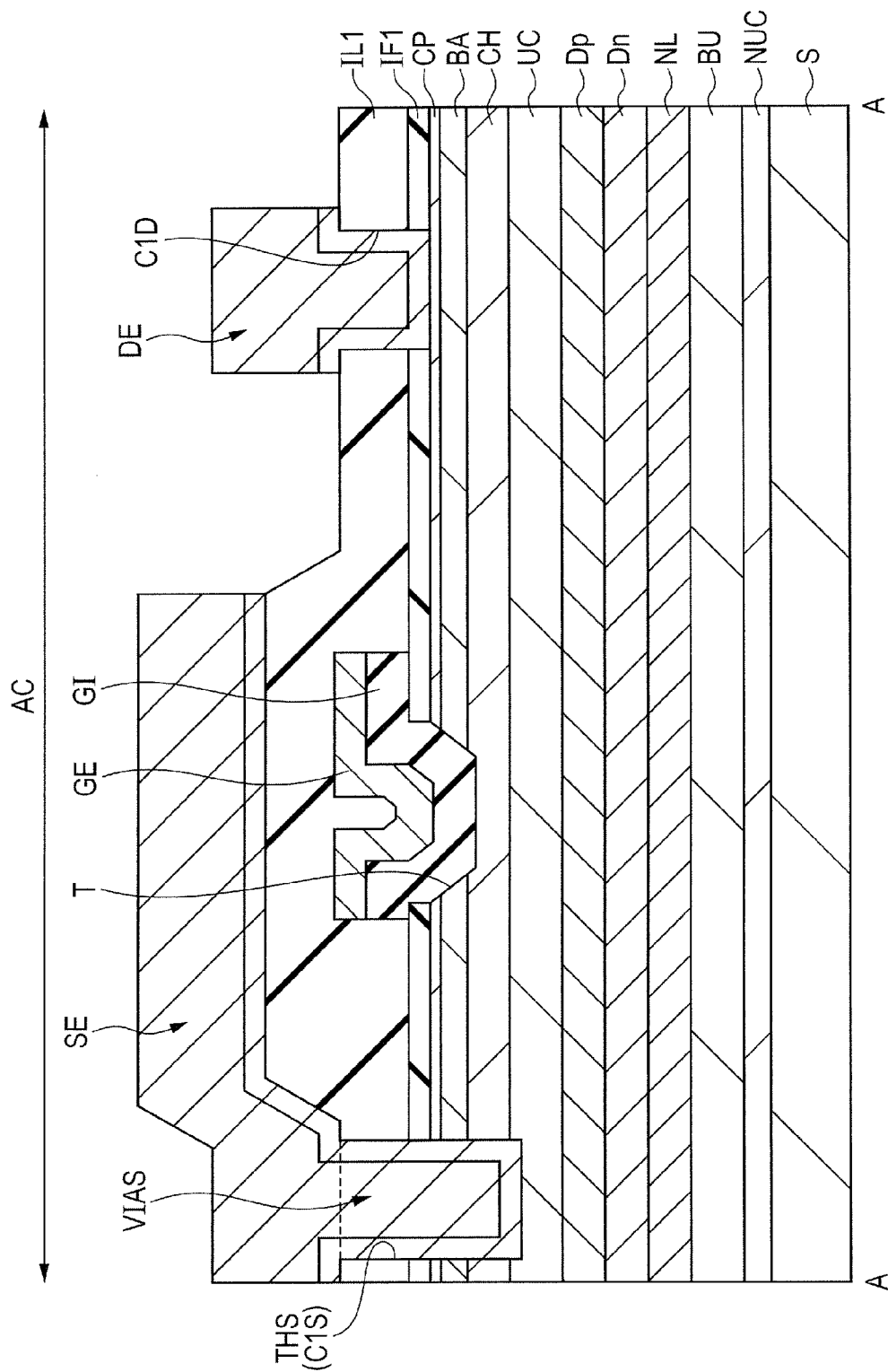
FIG. 44 is a cross-sectional view illustrating a process of manufacturing the semiconductor device according to the second embodiment, which is a cross-sectional view illustrating a manufacturing process subsequent to FIG. 43.

Then, as illustrated in FIG. 44, a conductive film is formed on the interlayer insulating film IL1 including the insides of the contact hole C1D and the through-holes THS, THD, to thereby form the source electrode SE, the drain electrode DE, the source pad. SP, the drain electrode DE, and the connection portions VIAS, VIAD. Those components are made of the materials described in the first embodiment, and can be formed in the same manner as that in the first embodiment.

Then, as in the first embodiment, the protective film PRO is formed on the source electrode SE, the drain electrode DE, the source pad SP, and drain pad DP as well as the interlayer insulating film IL1 (FIGS. 37 and 38).

Through the above process, the semiconductor device according to this embodiment can be formed. The above process is exemplary, and the semiconductor device according to this embodiment may be manufactured through a process other than the above process.

In this embodiment, only the connection portion VIAS of the connection portions VIAS and VIAD is arranged in the active region AC. Alternatively, the connection portion VIAD may be also arranged in the active region AC. For example, the through-hole THD may be arranged below the contact hole C1D, and the connection portion VIAD may be arranged inside of the through-hole THD. However, as described above, in order to prevent an electric connection between the connection portion VIAD and the p-type layer Dp, the side wall insulating film SW is arranged on the side wall of the through-hole THD. For that reason, when the connection portion VIAD is arranged in the active region AC, there is a need to increase a width of the drain electrode DE. Also, because two-dimensional electron gas exists below the drain electrode DE, most of a horizontal drain withstand voltage needs to be compensated by only the side wall insulating film, and the side wall insulating film needs to be thickened. As a result, the width of the drain electrode DE needs to further increase. Hence, in order to ensure the larger active region AC, it is desirable that the connection portion VIAD is arranged in the device isolation region ISO. As an example, when a potential of 600V is applied to the drain electrode DE, a withstand voltage of 600V is required for the side wall insulating film SW. When a sum of the film thickness and the margin, is set to 1.2 the width of 2.4 μm is increased on both sides thereof.

Third Embodiment

The first and second embodiments exemplify the recessed gate type semiconductor device, but a semiconductor device of other configurations may be applied. For example, as in this embodiment, a junction gate type transistor in which a gate junction layer is arranged below the gate electrode may be employed.

Hereinafter, a semiconductor device according to this embodiment will be described in detail with reference to the accompanying drawings.

(Structure Description)

Figure 45:
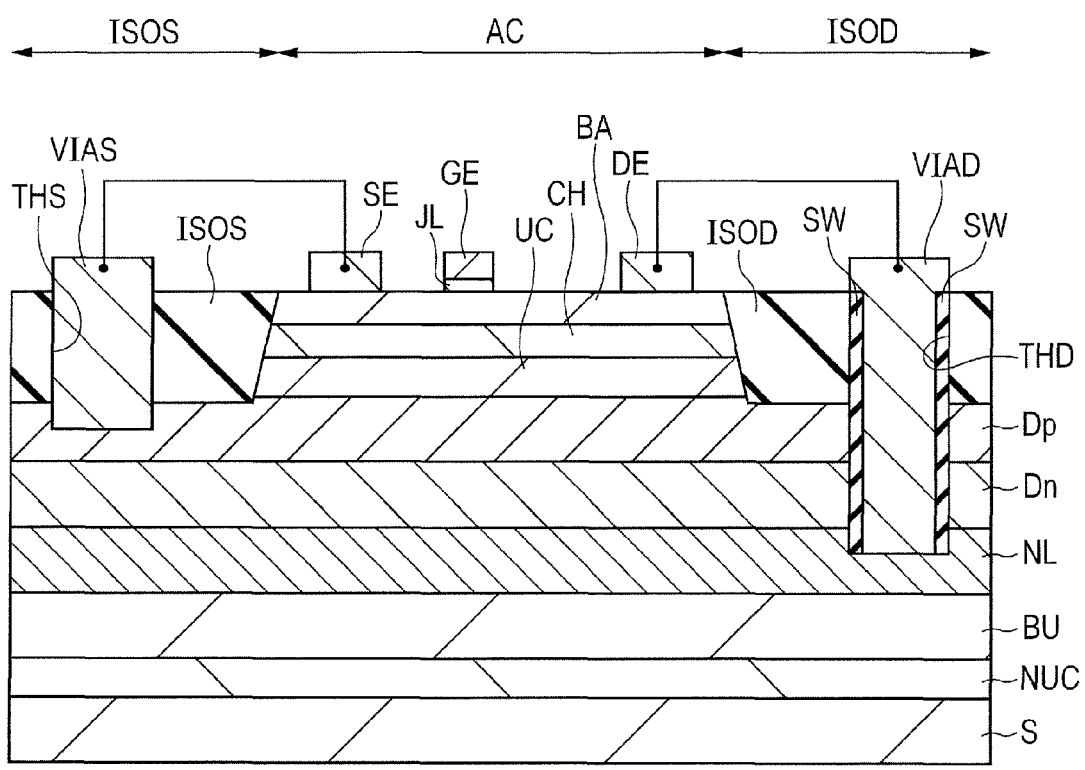
FIG. 45 is a cross-sectional view schematically illustrating a configuration of a semiconductor device according to a third embodiment.

FIG. 45 is a cross-sectional view schematically illustrating a configuration of a semiconductor device according to this embodiment. A semiconductor device (semiconductor element) according to this embodiment is a power transistor made of a nitride semiconductor. This semiconductor device can be used as a high electron mobility transistor (HEMT) type power transistor.

In the semiconductor device according to this embodiment, as in the first embodiment, a nucleation layer NUC, a buffer layer BU, an n+ layer NL, an n-type layer Dn, a p-type layer Dp, a channel underlying layer UC, a channel layer (also called "electron transit layer") CH, and a barrier layer BA are made over a substrate S in the stated order. The nucleation layer NUC is formed of a nitride semiconductor layer. The buffer layer BU is formed of a nitride semiconductor layer of a single layer or plural layers in which impurities forming a deep level are doped to the nitride semiconductor. In this example, a superlattice structure having plural nitride semiconductor layers is used. The n+ layer NL is formed of a nitride semiconductor layer in which n-type impurities are doped to the nitride semiconductor. The n-type layer Dn is formed of a nitride semiconductor layer in which n-type impurities are doped to the nitride semiconductor, which is a layer lower in a concentration of the n-type impurities than the n+ layer NL. The p-type layer Dp is formed of a nitride semiconductor layer in which p-type impurities are doped to the nitride semiconductor. The channel underlying layer UC is a layer that determines a lattice constant in a planar view of an upper layer, a layer smaller in the lattice constant in the planar direction than the channel underlying layer UC is subject to a tensile strain, and a layer larger in the lattice constant in the planar direction than the channel underlying layer UC is subject to a compressive strain. The channel layer CH is formed of a nitride semiconductor layer larger in the electron affinity than the channel underlying layer UC. The barrier layer BA is formed of a nitride semiconductor layer smaller in the electron affinity than the channel layer CH.

The semiconductor element according to this embodiment has a gate electrode GE formed through a gate junction layer JL above the barrier layer BA, and a source electrode SE and a drain electrode DE which are formed on the barrier layer BA between both sides of the gate electrode GE. The semiconductor element is formed in an active region AC partitioned by device isolation regions ISO. The gate junction layer JL is formed of a nitride semiconductor layer larger in electron affinity than the barrier layer BA. Also, it is preferable that the gate junction layer JL and the gate electrode GE are Schottky coupled to each other.

A two-dimensional electron gas (2DEG) is generated on the channel layer CH side in the vicinity of an interface between the channel layer CH and the barrier layer BA. Under the gate junction layer JL, because a conduction band of the channel layer CH is pulled up due to a negative charge attributable to acceptor ions, the two-dimensional electron gas (2DEG) is not formed. For that reason, in the semiconductor element according to this embodiment, an off-state can be maintained in a state where a positive potential (threshold potential) is not applied to the gate electrode GE, and an on-state can be maintained in a state where a positive potential (threshold potential) is applied to the gate electrode GE. In this way, normally-off operation can be conducted.

In this embodiment, the n-type layer Dn and the p-type layer Dp (pn diode) are arranged between the buffet layer BU and the channel underlying layer UC, the n-type layer Dn is coupled to the drain electrode (cathode electrode). DE through the connection portion VIAD, and the p-type layer Dp is coupled to the source electrode (anode electrode) SE through the connection portion VIAS. The n+ layer NL is arranged below the n-type layer Dn, and the n-type layer Dn and the drain electrode (cathode electrode) DE are also coupled to each other through the n+ layer NL. The n-type layer Dn and the p-type layer Dp (pn diode) are thus arranged with the results that the avalanche breakdown can be inhibited from being generated, and the breaking of the MISFET (element) can be suppressed.

FIGS. 46 to 53 are cross-sectional views illustrating a process of manufacturing the semiconductor device according to this embodiment. Among FIGS. 46 to 53, referring to FIGS. 51 to 53 which are cross-sectional views illustrating a final process, the semiconductor device according to this embodiment will be further described. A plan view of the semiconductor device according to this embodiment is identical with that in the first embodiment (FIG. 3) except for the trench (T, GLT). For example, FIG. 51 corresponds to a cross-section taken along a line A-A in FIG. 3, FIG. 52 corresponds to a cross-section taken along a line B-B in FIG. 3, and FIG. 53 corresponds to a cross-section taken along a line C-C in FIG. 3. In this embodiment, because the configurations other than the gate electrode portion are identical with those in the first embodiment, a detailed description of the same configurations as those in the first embodiment will be omitted.

Figure 51:
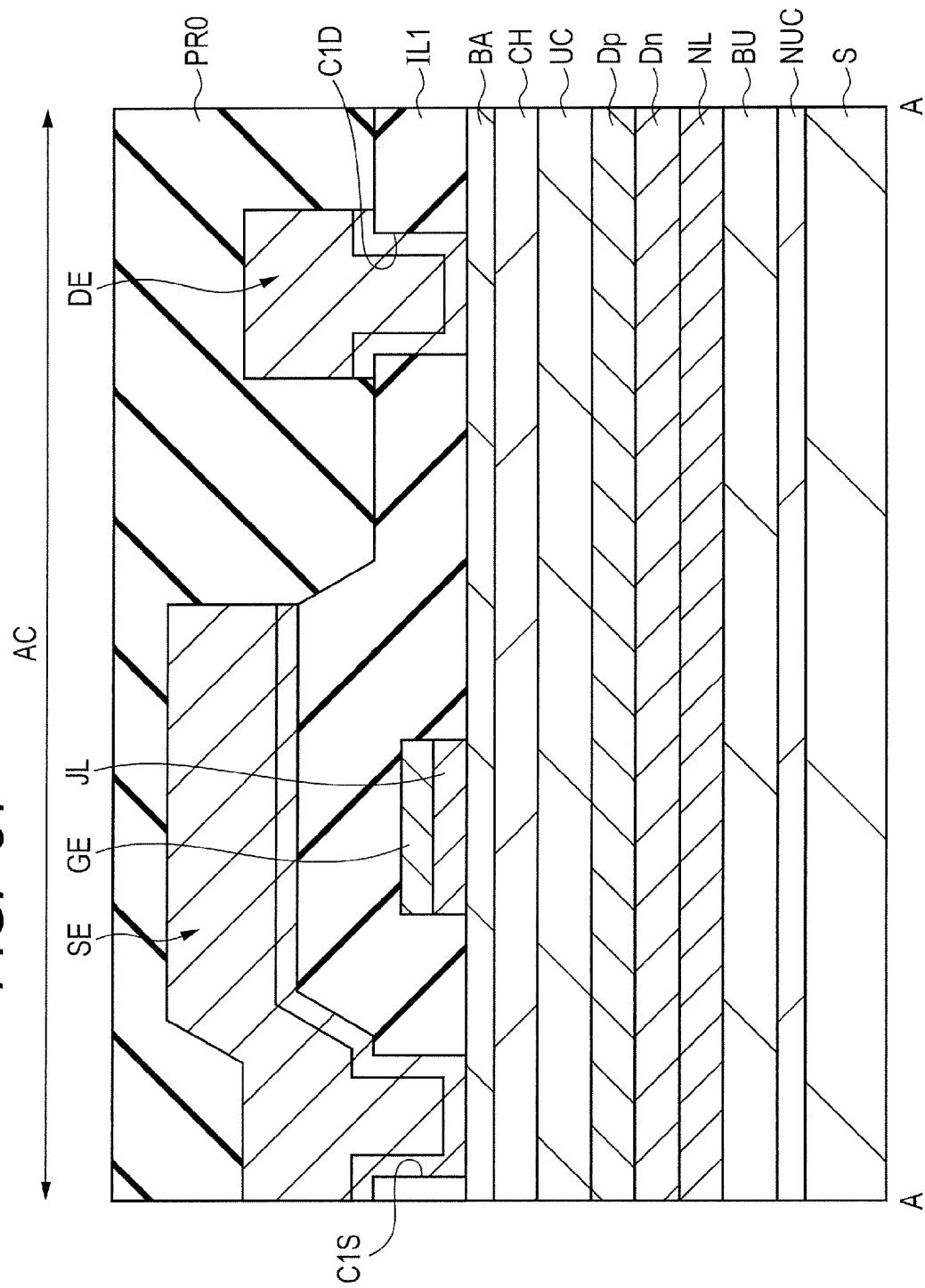
FIG. 51 is a cross-sectional view illustrating a process of manufacturing the semiconductor device according to the third embodiment, which is a cross-sectional view illustrating a manufacturing process subsequent to FIG. 50.
Figure 52:
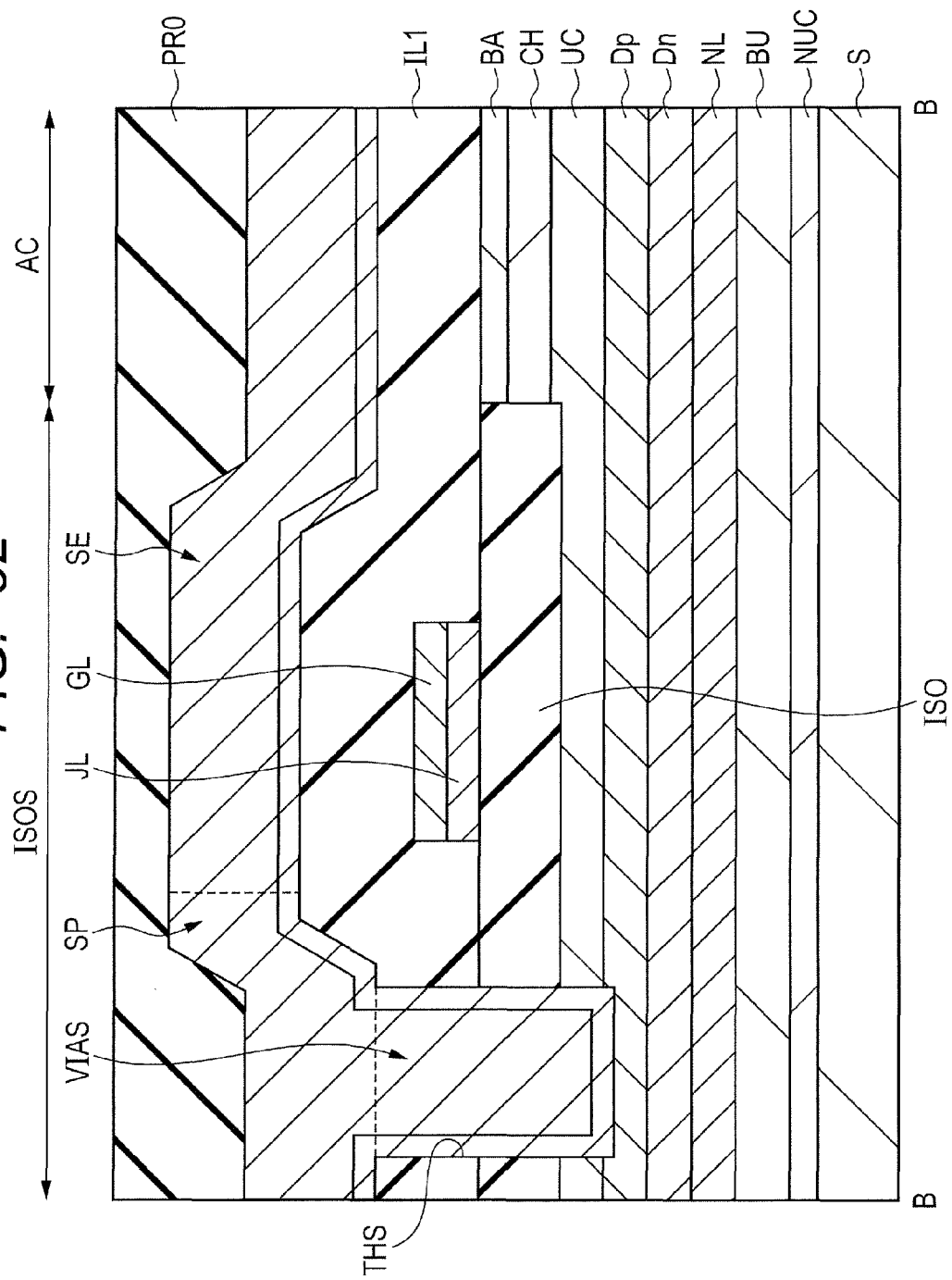
FIG. 52 is a cross-sectional view illustrating a process of manufacturing the semiconductor device according to the third embodiment.
Figure 53:
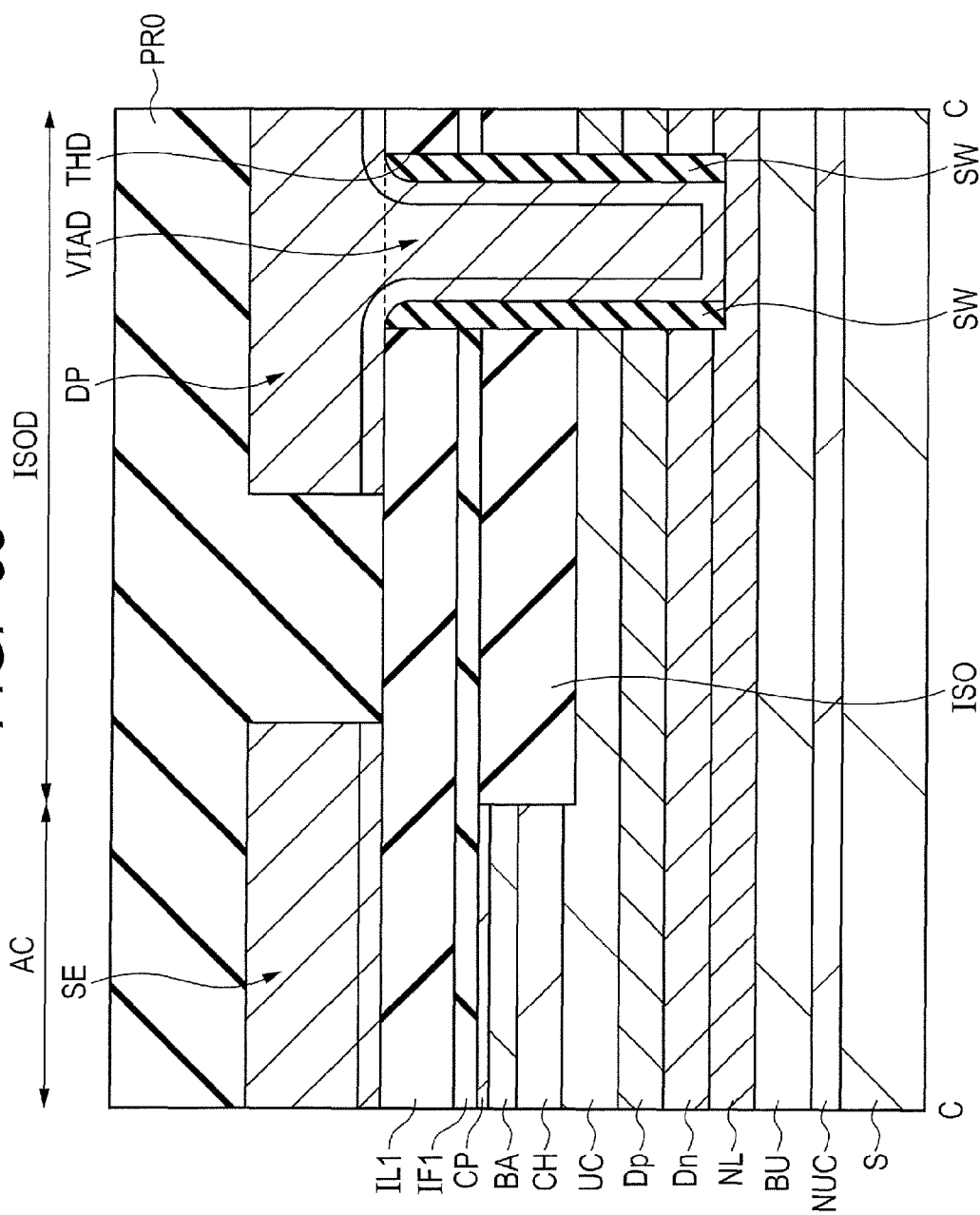
FIG. 53 is a cross-sectional view illustrating a process of manufacturing the semiconductor device according to the third embodiment.

As illustrated in FIGS. 51 to 53, in the semiconductor device according to this embodiment, a nucleation layer NUC, a buffer layer BU, an n+ layer NL, an n-type layer Dn, a p-type layer Dp, a channel underlying layer UC, a channel layer (also called "electron transit layer") CH, and a barrier layer BA are made over a substrate S in the stated order. The semiconductor element according to this embodiment includes a gate electrode GE formed through the gate junction layer JL above the barrier layer BA, and a source electrode SE and a drain electrode DE formed on, the barrier layer BA on both sides of the gate electrode GE. The semiconductor element is formed in the active region AC partitioned by the device isolation region ISO. A contact hole C1D that forms a connection portion between the drain electrode DE and the barrier layer BA is arranged below the drain electrode DE. Also, a contact hole C1S that forms a connection portion between the source electrode SE and the barrier layer BA is arranged below the source electrode SE. Also, the drain electrode DE is coupled to the drain pad DP, and the source electrode SE is coupled to the source pad SP. Also, the gate electrode GE is coupled to gate line GL (refer to FIG. 3).

In this example, the source electrode SE, the drain electrode DE, and the gate electrode GE are mainly arranged on the active region AC surrounded by the device isolation regions ISO. On the other hand, the drain pad DP, the gate line GL, and the source pad SP are arranged on the device isolation regions ISO (refer to FIG. 3).

In this embodiment, in the device isolation regions ISO, a connection portion VIAS (also called "via") that penetrates through the device isolation region ISO, and reaches the drain pad DP below the device isolation regions ISO is provided, and the connection portion VIAS is electrically coupled to the source electrode SE. Also, in the device isolation region ISO, a connection portion (also called "via") VIAD that penetrates through the device isolation regions ISO, and reaches the n+ layer NL below the device isolation region ISO is provided, and the connection portion VIAD is electrically coupled to the drain electrode DE. Hence, a pn diode formed of the p-type layer Dp and the n-type layer Dn is arranged between the source electrode SE and the drain electrode DE. The n-type layer Dn is coupled to the drain electrode DE through the n+ layer NL. Also, in order to prevent an electric connection between the connection portion VIAD and the drain pad DP, the side wall insulating film SW is arranged on the side wall portion of the connection portion VIAD.

A protective film (also called "insulating film", "cover film", or "surface protective film") PRO is arranged over the source electrode SE and the drain electrode DE.

The constituent materials of the nucleation layer NUC, the buffer layer BU, the n+ layer NL, the n-type layer Dn, the p-type layer Dp, the channel underlying layer UC, the channel layer (also called "electron transit layer") CH, and the barrier layer BA are identical with those described in the first embodiment.

The gate junction layer JL can be formed of, for example, a Gan Layer. Also, a thickness of the GaN layer is, for example, about 100 nm. The gate junction layer JL may be made of GaN as well as AlN or InN. The gate junction layer JL may be formed of a non-doped layer, or may be appropriately doped with impurities depending on the intended use. The doping impurities may be formed of n-type impurities or p-type impurities. The n-type impurities are made of, for example, Si, S, or Se, and the p-type impurities are made of, for example, Be, C, or Mg.

Also, the respective constituent materials of the gate electrode GE, the interlayer insulating film IL1, and the protective film PRO are identical with those described in the first embodiment.

Also, the respective constituent materials of the source electrode SE, the drain electrode DE, the source pad SP, the drain pad DP, and the connection portions VIAS, VIAD are identical with those described in the first embodiment.

As described above, according to this embodiment, since then-type layer Dn and the p-type layer Dp (pn diode) are arranged between the buffer layer BU and the channel underlying layer UC, the avalanche breakdown can be inhibited from being generated, and the breaking of the MISFET (element) can be suppressed as described in the first embodiment in detail. Also, since the element and the pn diode are arranged to overlap with each other, the device area can be reduced, and the higher integration of the element can be performed. Also, with the provision of the pn diode made of the nitride semiconductor within the element, operation at high temperature (for example, 200° C. or higher) can be conducted. Also, since the connection portion VIAS and the connection portion VIAD are arranged within the device isolation region ISO outside of the active region AC in which the electrons conduct, the miniaturization and the higher integration of the semiconductor element can be performed. Also, the on-resistance per unit area can be reduced.

(Description of Manufacturing Method)

Subsequently, a description will be given of a method of manufacturing the semiconductor device according to this embodiment while the configuration of the semiconductor device will be more clarified, with reference to FIGS. 46 to 53.

Figure 46:
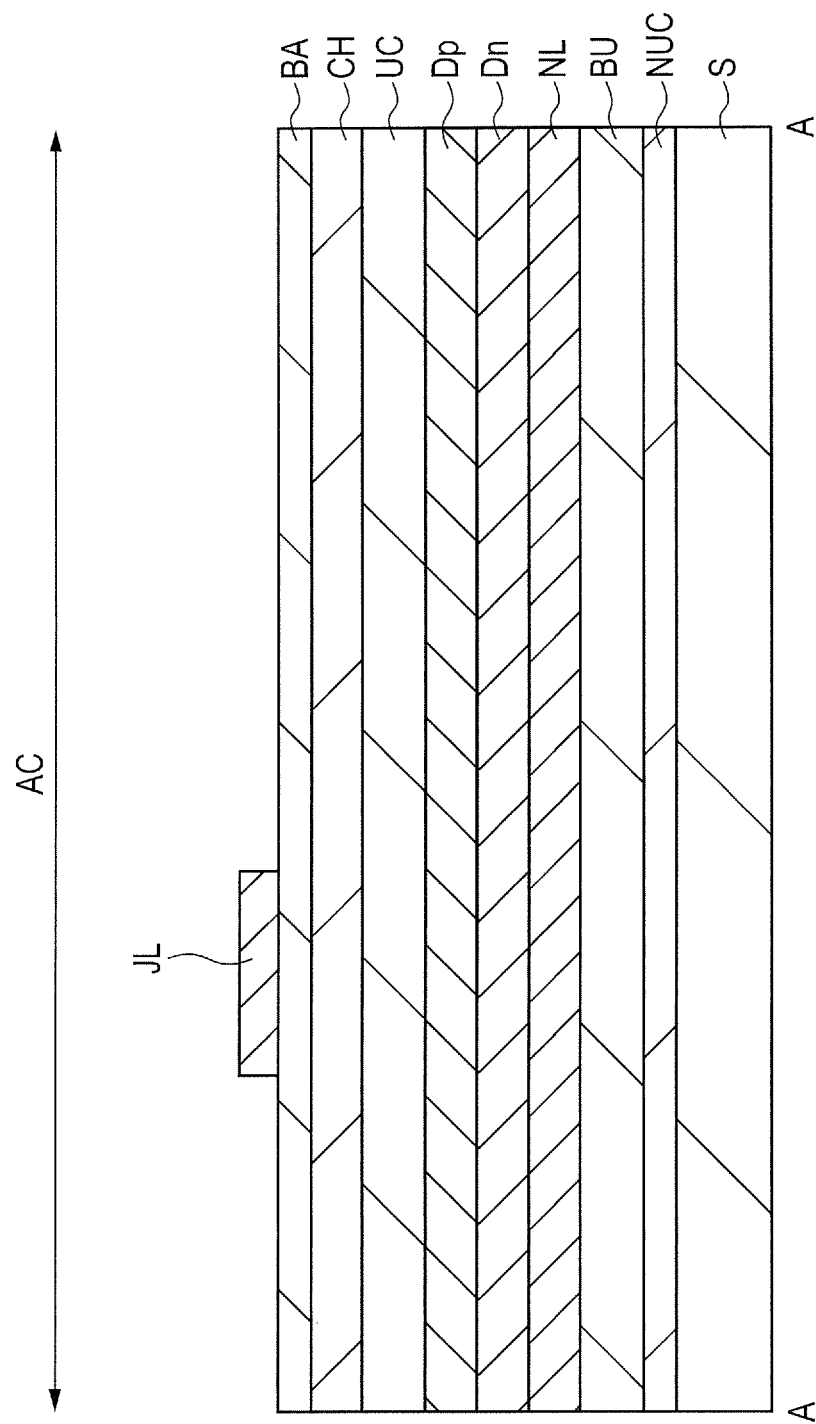
FIG. 46 is a cross-sectional view illustrating a process of manufacturing the semiconductor device according to the third embodiment.

As illustrated in FIG. 46, the nucleation layer NUC and the buffer layer BU are sequentially made on the substrate S.

Those layers are made of the materials described in the first embodiment, and can be formed in the same manner as that in the first embodiment.

Then, as the n+ layer NL, the gallium nitride layer (n$^+$GaN layer) containing the n-type impurities is heteroepitaxially grown on the buffer layer BU through the metal organic vapor phase epitaxy. For example, Si is used as the n-type impurities. For example, the gallium nitride layer is deposited in about 200 nm while being doped with Si. The Si concentration in the deposited film is set to, for example, about $1 \times 10^{19}$(1E19) cm$^{-3}$.

Then, as the n-type layer Dn, for example, the gallium nitride layer (n$^-$GaN layer) containing the n-type impurities is heteroepitaxially grown on the n+ layer NL through the metal organic vapor phase epitaxy. For example, Si is used as the n-type impurities. For example, the gallium nitride layer is deposited in about 1000 nm while being doped with Si. The Si concentration in the deposited film is set to, for example, about $3 \times 10^{16}$(1E16)cm$^{-3}$.

Then, as the p-type layer Dp, for example, the gallium nitride layer (p$^-$GaN layer) containing the p-type impurities is heteroepitaxially grown on the buffer layer BU through the metal organic vapor phase epitaxy. For example, magnesium (Mg) is used as the p-type impurities. For example, the gallium nitride layer is deposited in about 1000 nm while being doped with Mg. The Mg concentration in the deposited film is set to, for example, about $5 \times 10^{17}$ (5E17) cm$^{-3}$.

Then, the channel underlying layer UC, the channel layer CH, the barrier layer BA, the cap layer CP, and the insulating film IF1 are sequentially formed on the p-type layer Dp. Those layers are made of materials described in the first embodiment, and can be formed in the same manner as that in the first embodiment. Then, the device isolation region ISO is formed in the same manner as that in the first embodiment.

Then, as the gate junction layer JL, for example, the gallium nitride layer (p$^-$GaN layer) containing the p-type impurities is heteroepitaxially grown on the buffer layer BU through the metal organic vapor phase epitaxy. For example, magnesium (Mg) is used as the p-type impurities. For example, the gallium nitride layer is deposited in about 100 nm while being doped with Mg.

Then, a photoresist film having an opening in the gate electrode formation region is formed on the gate junction layer JL, and the gate junction layer JL is dry etched with the photoresist film as a mask.

Figure 47:
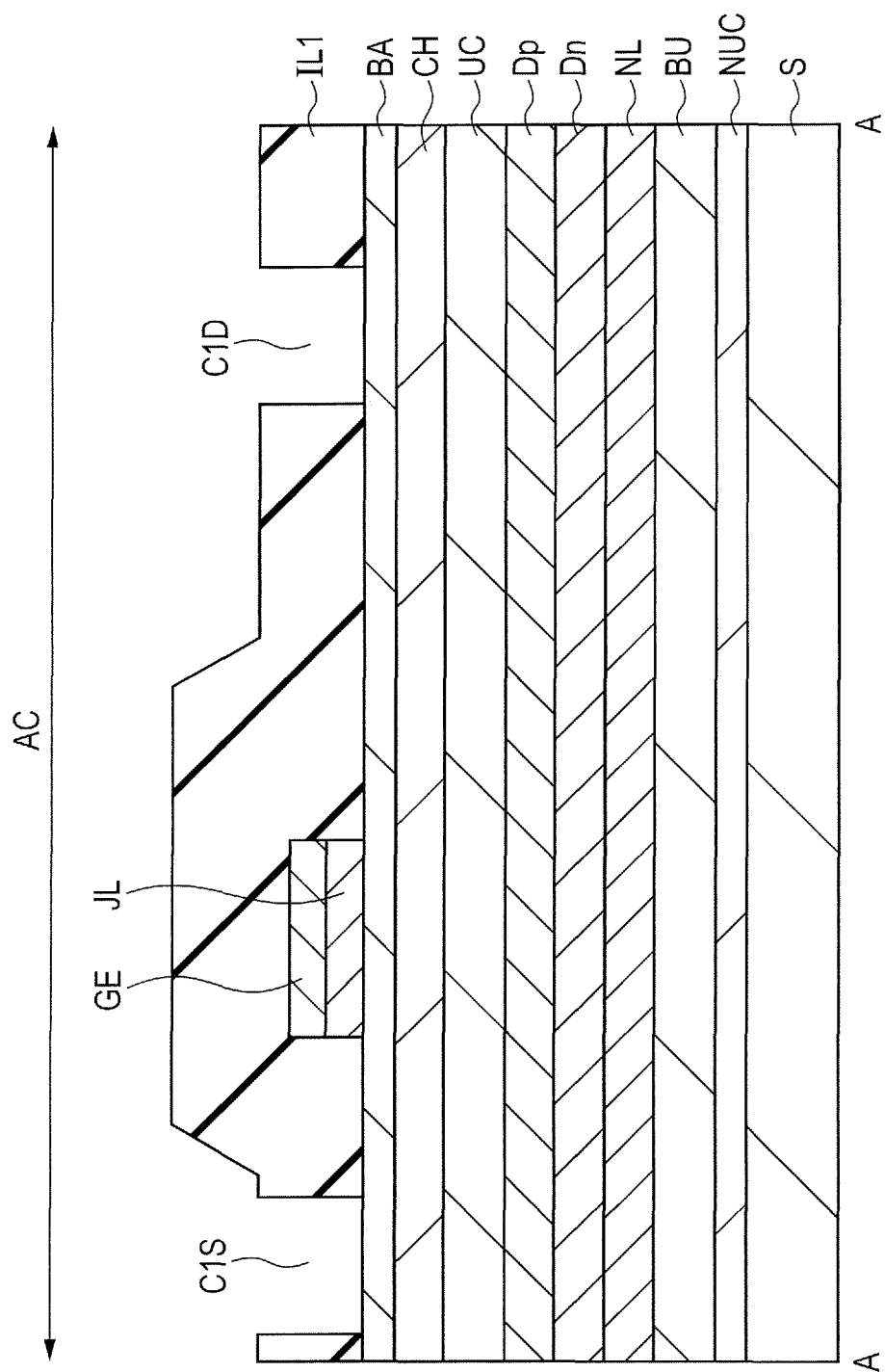
FIG. 47 is a cross-sectional view illustrating a process of manufacturing the semiconductor device according to the third embodiment, which is a cross-sectional view illustrating a manufacturing process subsequent to FIG. 46.
Figure 48:
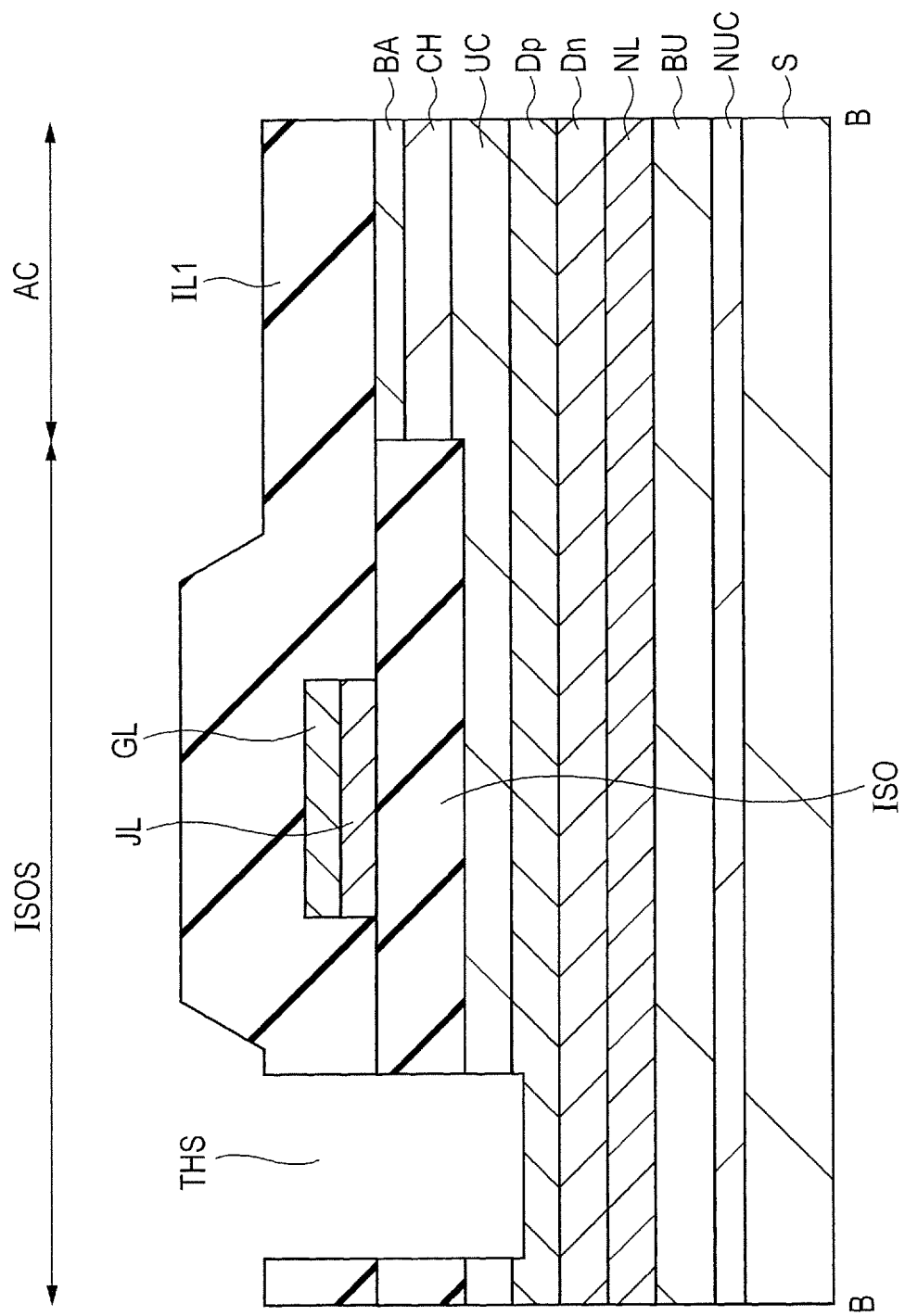
FIG. 48 is a cross-sectional view illustrating a process of manufacturing the semiconductor device according to the third embodiment, which is a cross-sectional view illustrating a manufacturing process subsequent to FIG. 47.
Figure 49:
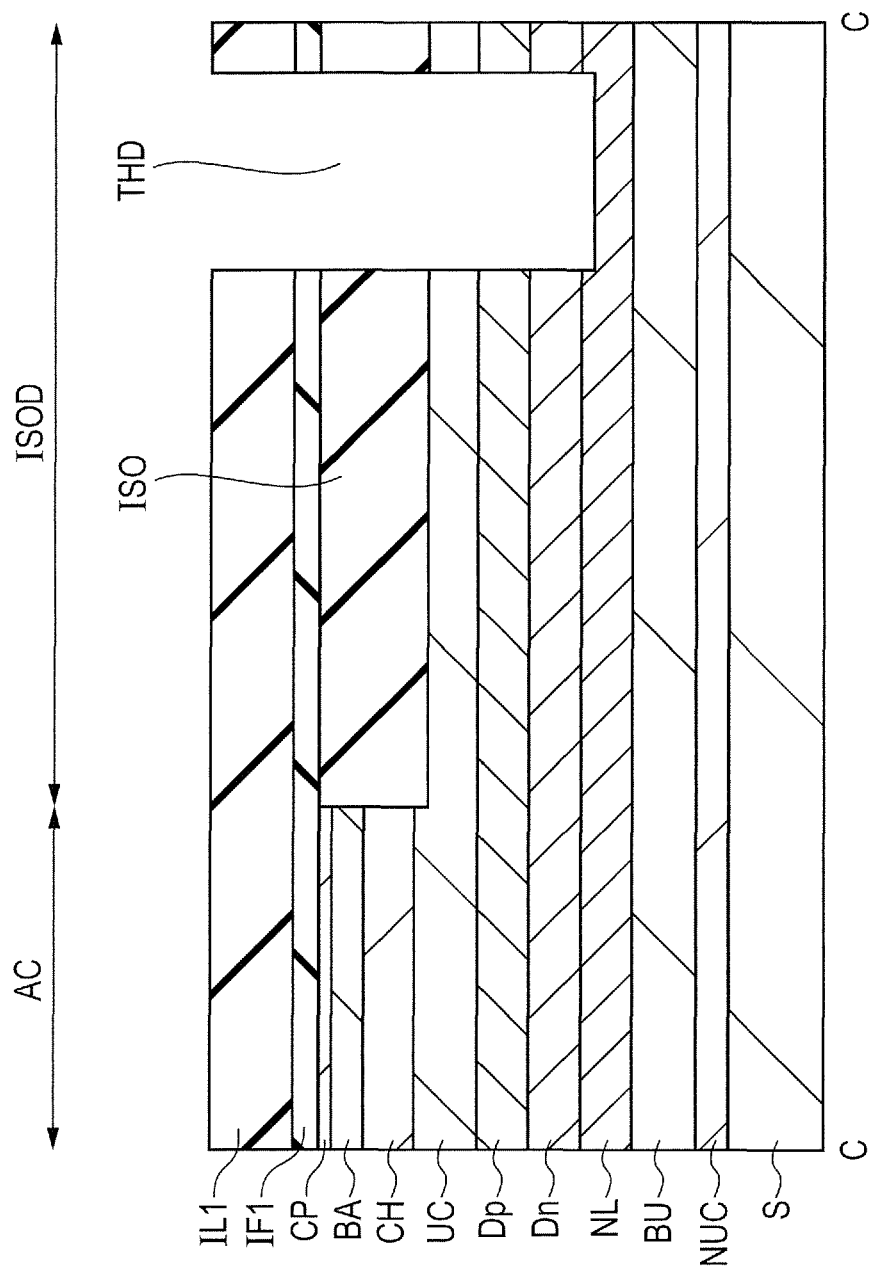
FIG. 49 is a cross-sectional view illustrating a process of manufacturing the semiconductor device according to the third embodiment, which is a cross-sectional view illustrating a manufacturing process subsequent to FIG. 48.

Then, as illustrated in FIGS. 47 to 49, the gate electrode GE is formed over the gate junction layer JL. As a conductive film, for example, a TiN (titanium nitride) film is deposited on, for example, the gate junction layer JL in the thickness of about 200 nm through a sputtering technique. Then, the TiN film is etched to form the gate electrode GE.

Then, the interlayer insulating film IL1 is formed on the gate electrode GE and the barrier layer BA in the same manner as that in the first embodiment.

Figure 50:
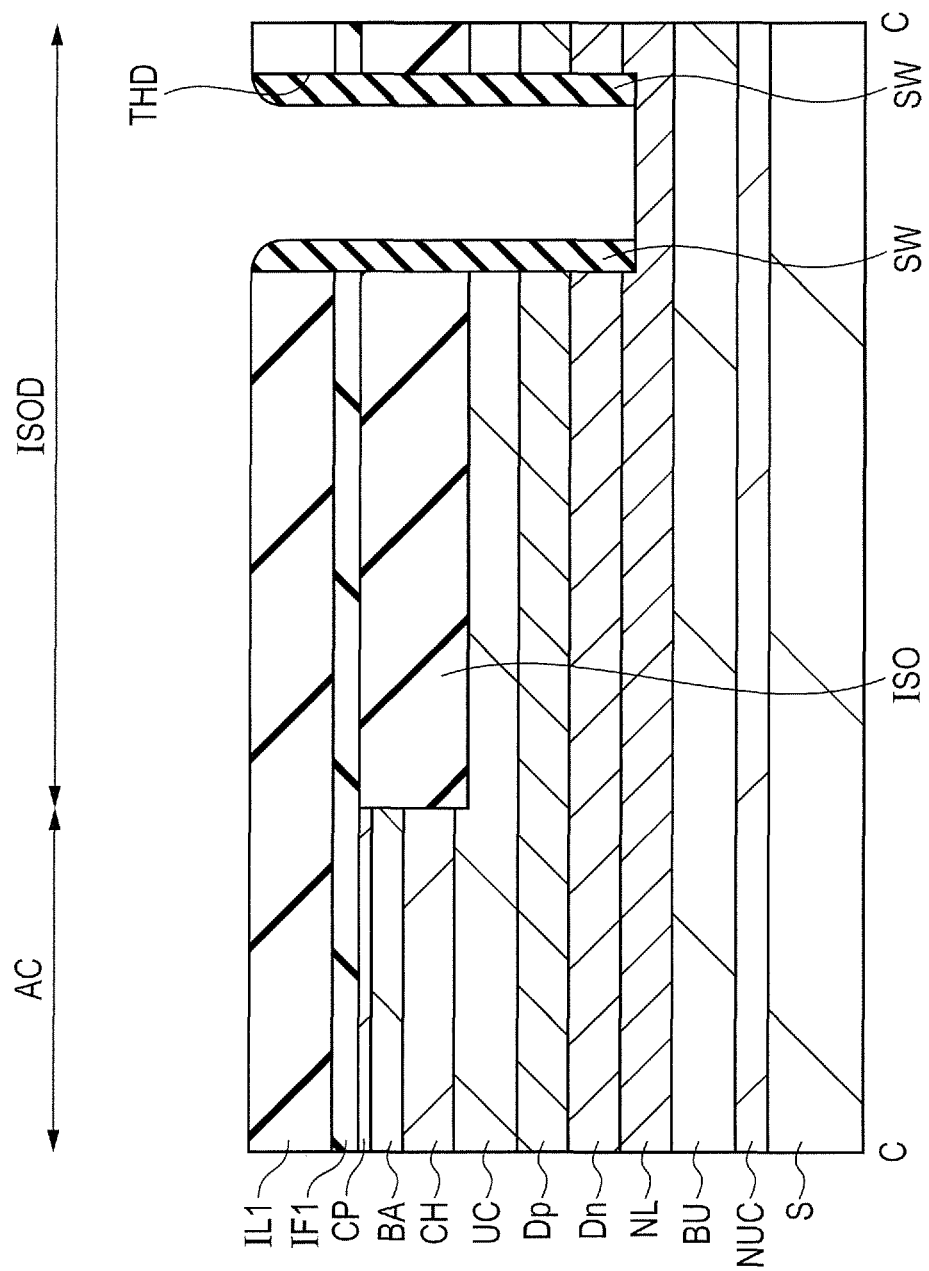
FIG. 50 is a cross-sectional view illustrating a process of manufacturing the semiconductor device according to the third embodiment, which is a cross-sectional view illustrating a manufacturing process subsequent to FIG. 49.

Then, as in the first embodiment, the contact holes C1S, C1D, and the through-holes THS, THD are formed in the interlayer insulating film IL1. Then, as illustrated in FIG. 50, the side wall insulating film SW is formed on the side wall of the through-hole THD in the same manner as that in the first embodiment.

Then, as illustrated in FIGS. 51 to 53, the conductive film is formed on the interlayer insulating film IL1 including the insides of the contact holes C1S, C1D, and the through-holes THS, THD to thereby form the source electrode SE, the drain electrode DE, the source pad SP, the drain electrode DE, and the connection portions VIAS, VIAD. Those components are made of the materials described in the first embodiment, and can be formed in the same manner as that in the first embodiment.

Then, as in the first electrode, the protective film PRO is formed on the interlayer insulating film IL1, as well as on the source electrode SE, the drain electrode DE, the source pad SP, and the drain pad DP.

Through the above process, the semiconductor device according to this embodiment can be formed. The above process is exemplary, and the semiconductor device according to this embodiment may be manufactured through a process other than the above process.

Fourth Embodiment

In the third embodiment, the connection portion VIAS is arranged in the device isolation regions ISO. Alternatively, the connection portion VIAS may be arranged in the active region AC. For example, in this embodiment, the connection portion VIAS is arranged below the source electrode SE.

Hereinafter, a semiconductor device according to this embodiment will be described in detail with reference to the accompanying drawings.

(Structure Description)

Figure 54:
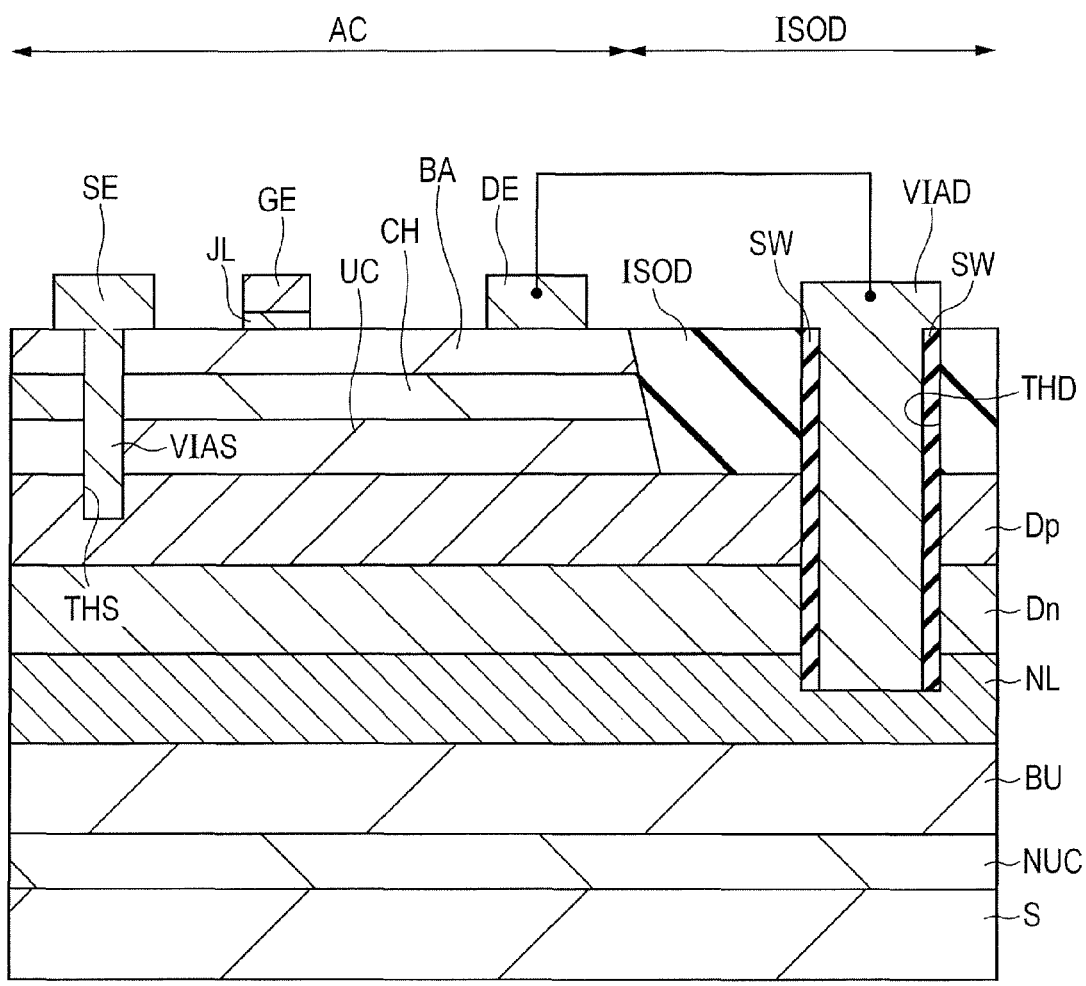
FIG. 54 is a cross-sectional view schematically illustrating a configuration of a semiconductor device according to a fourth embodiment.

FIG. 54 is a cross-sectional view schematically illustrating a configuration of a semiconductor device according to this embodiment. A semiconductor device (semiconductor element) according to this embodiment is a transistor made of a nitride semiconductor. This semiconductor device can be used as a high electron mobility transistor (HEMT) type power transistor.

In the semiconductor device according to this embodiment, as in the third embodiment, a nucleation layer NUC, a buffer layer BU, an n+ layer NL, an n-type layer Dn, a p-type layer Dp, a channel underlying layer UC, a channel layer (also called "electron transit layer") CH, and a barrier layer BA are made over a substrate S in the stated order. The nucleation layer NUC is formed of a nitride semiconductor layer. The buffer layer BU is formed of a nitride semiconductor layer of a single layer or plural layers in which impurities forming a deep level are doped to the nitride semiconductor. In this example, a superlattice structure having plural nitride semiconductor layers is used. The n+ layer NL is formed of a nitride semiconductor layer in which n-type impurities are doped to the nitride semiconductor. The n-type layer Dn is formed of a nitride semiconductor layer in which n-type impurities are doped to the nitride semiconductor, which is a layer lower in a concentration of the n-type impurities than the n+ layer NL. The p-type layer Dp is formed of a nitride semiconductor layer in which p-type impurities are doped to the nitride semiconductor. The channel underlying layer UC is a layer that determines a lattice constant in a planar view of an upper layer, a layer smaller in the lattice constant in the planar direction than the channel underlying layer UC is subject to a tensile strain, and a layer larger in the lattice constant in the planar direction than the channel underlying layer UC is subject to a compressive strain. The channel layer CH is formed of a nitride semiconductor layer larger in the electron affinity than the channel underlying layer UC. The barrier layer BA is formed of a nitride semiconductor layer smaller in the electron affinity than the channel layer CH.

As in the third embodiment, the semiconductor element according to this embodiment has a gate electrode GE formed through a gate junction layer JL above the barrier layer BA, and a source electrode SE and a drain electrode DE which are formed on the barrier layer BA between both sides of the gate electrode GE. The semiconductor element is formed in an active region AC partitioned by device isolation regions ISO. The gate junction layer JL is formed of a nitride semiconductor layer larger in electron affinity than the barrier layer BA. Also, it is preferable that the gate junction layer JL and the gate electrode GE are Schottky coupled to each other.

In this embodiment, the n-type layer Dn and the p-type layer Dp (pn diode) are arranged between the buffer layer BU and the channel underlying layer UC. The n-type layer Dn is coupled to the drain electrode (cathode electrode) DE through the connection portion VIAD, and the p-type layer Dp is coupled to the source electrode (anode electrode) SE through the connection portion VIAS. The n+ layer NL is arranged below the n-type layer Dn, and the n-type layer Dn and the drain electrode (cathode electrode) DE are also coupled to each other through the n+ layer NL. The n-type layer Dn and the p-type layer Dp (pn diode) are thus arranged with the results that the avalanche breakdown can be inhibited from being generated, and the breaking of the MISFET (element) can be suppressed.

Figure 55:
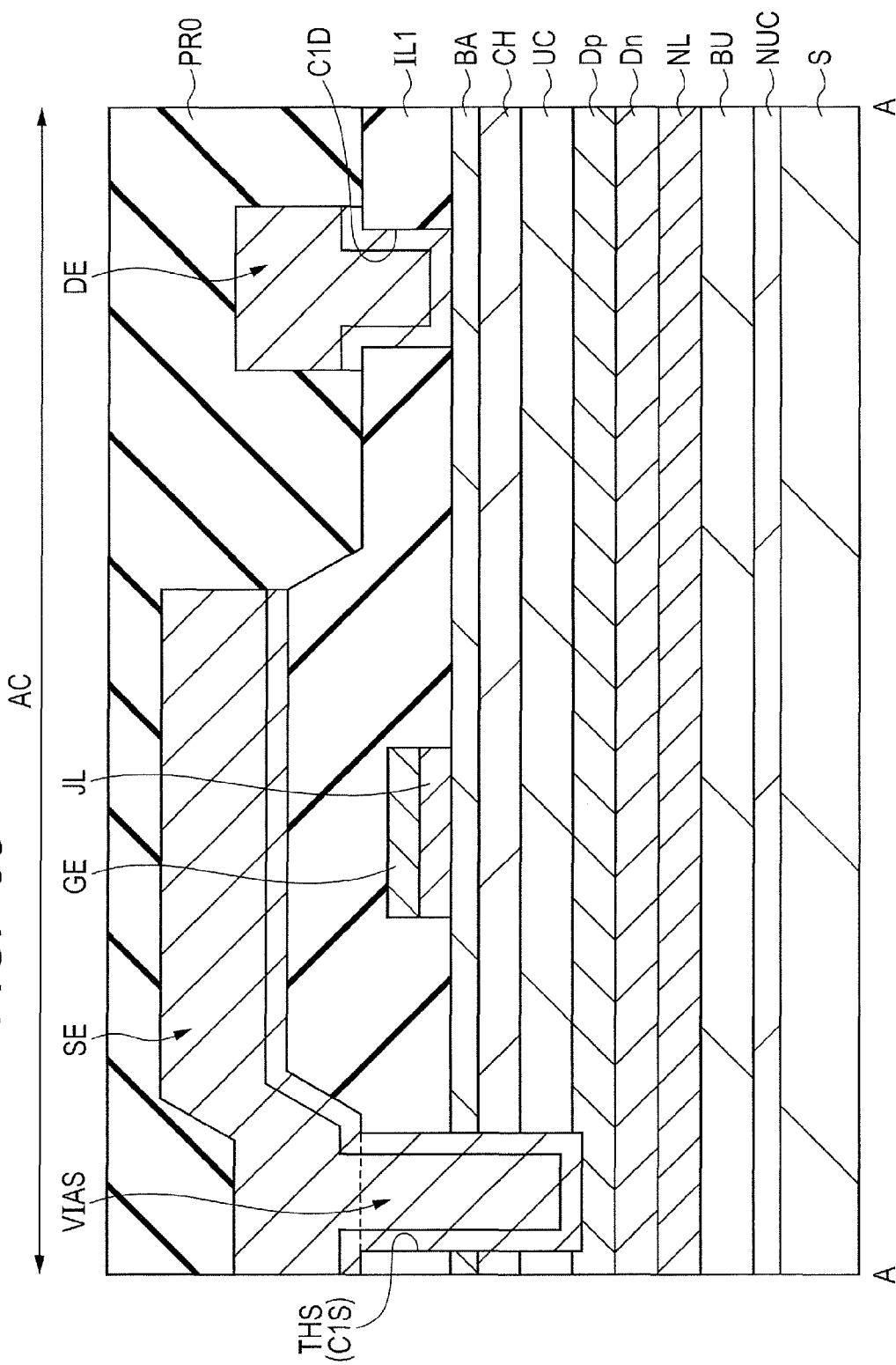
FIG. 55 is a cross-sectional view illustrating the configuration of the semiconductor device according to the fourth embodiment.
Figure 56:
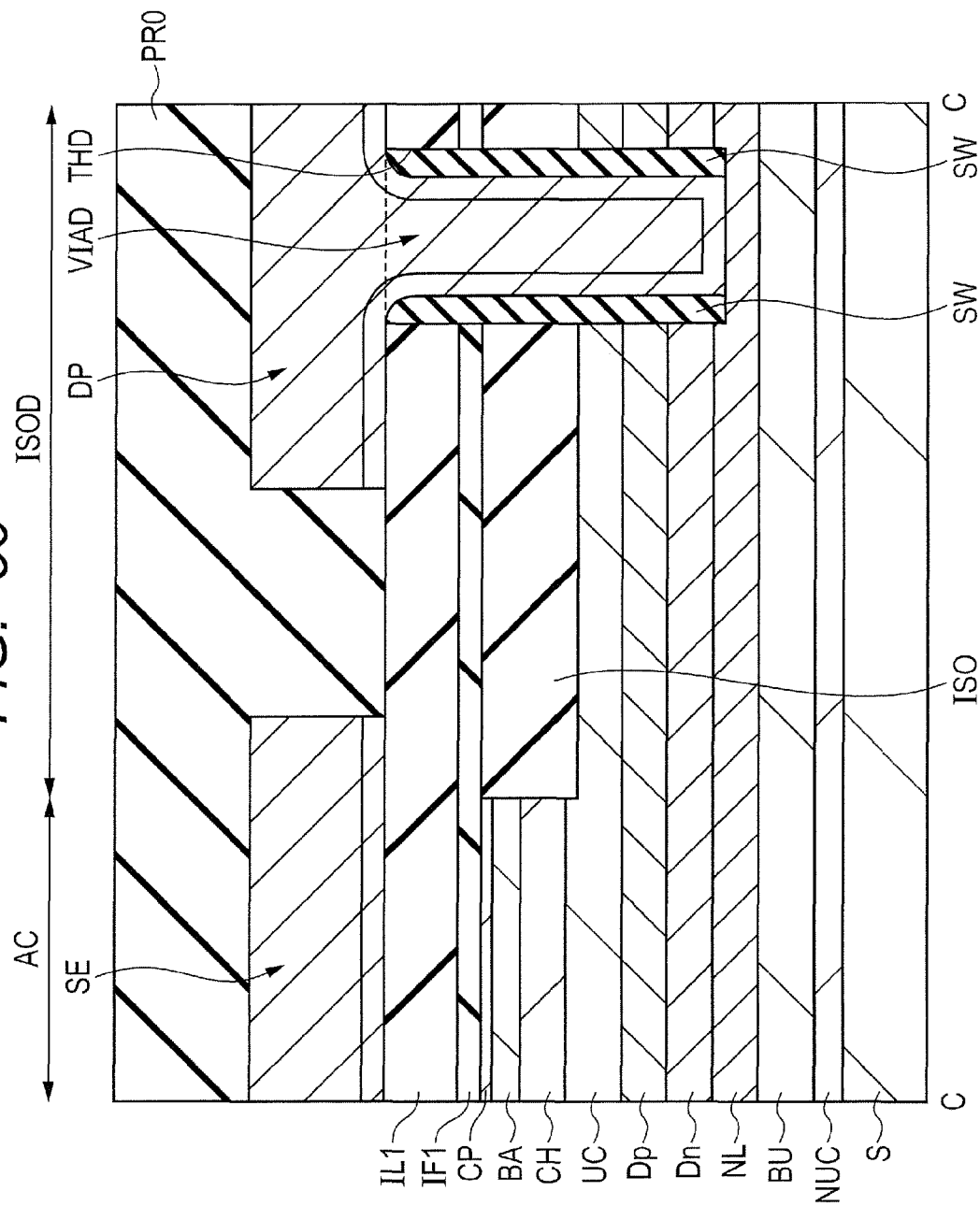
FIG. 56 is a cross-sectional view illustrating the configuration of the semiconductor device according to the fourth embodiment.

The semiconductor device according to this embodiment will be further described with reference to FIGS. 55 and 56. FIGS. 55 and 56 are cross-sectional views illustrating a configuration of the semiconductor device according to this embodiment.

As illustrated in FIGS. 55 and 56, in the semiconductor device according to this embodiment, a nucleation layer NUC, a buffer layer BU, an n+ layer NL, an n-type layer Dn, a p-type layer Dp, a channel underlying layer UC, a channel layer (also called "electron transit layer") CH, and a barrier layer BA are made over a substrate S in the stated order. The semiconductor element according to this embodiment includes a gate electrode GE formed through the gate junction layer JL above the barrier layer BA, and a source electrode SE and a drain electrode DE which are formed on the barrier layer BA on both sides of the gate electrode GE. The semiconductor element is formed in the active region AC partitioned by the device isolation region ISO. As in the third embodiment, a contact hole C1D that forms a connection portion between the drain electrode DE and the barrier layer BA is arranged below the drain electrode DE. Also, in the device isolation region ISOD, a connection portion (also called "via") VIAD that penetrates through the device isolation region ISOD, and reaches the n+ layer NL below the device isolation region ISOD is provided, and the connection portion VIAD is electrically coupled to the drain electrode DE. In order to prevent an electric connection between the connection portion VIAD and the drain pad DP, the side wall insulating film SW is arranged on the side wall portion of the connection portion VIAD. The connection portion VIAS that electrically connects the source electrode SE and the p-type layer Dp is arranged under the source electrode SE. The connection portion VIAS is arranged within the through-hole THS, and a planar shape of the connection portion VIAS is of a rectangular shape having long sides in the Y-direction. Hence, the connection portion VIAS is electrically coupled to the source electrode SE.

As in the third embodiment, the drain electrode DE is coupled to the drain pad DP, and the source electrode SE is coupled to the source pad SP. Also, the gate electrode GE is coupled to the gate line GL (refer to FIG. 3). Also, the source electrode SE, the drain electrode DE, and the gate electrode GE are mainly arranged on the active region AC surrounded by the device isolation regions ISO. On the other hand, the drain, pad DP, the gate line GL, and the source pad SP are arranged on the device isolation regions ISO (refer to FIG. 3).

Also, a protective film (also called "insulating film", "cover film", or "surface protective film") PRO is arranged over the source electrode SE and the drain electrode DE.

The respective constituent materials of the nucleation layer NUC, the buffer layer BU, the n+ layer NL, the n-type layer Dn, the p-type layer Dp, the channel underlying layer UC, the channel layer (also called "electron transit layer") CH, and the barrier layer BA are identical with those described in the first embodiment.

The gate junction layer JL can be formed of the GaN layer. The constituent material of the gate junction layer JL is identical with that described in the third embodiment.

Also, the respective constituent materials of the gate electrode GE, the interlayer insulating film IL1, and the protective film PRO are identical with those described in the first embodiment.

Also, the respective constituent materials of the source electrode SE, the drain electrode DE, the source pad SP, the drain pad DP, and the connection portions VIAS, VIAD are identical with those described in the first embodiment.

As described above, in this embodiment, since then-type layer Dn and the p-type layer Dp (pn diode) are arranged between the buffer layer BU and the channel underlying layer UC, the avalanche breakdown can be inhibited from being generated, and the breaking of the MISFET (element) can be suppressed as described in the first embodiment in detail, as described in the first embodiment in detail. Also, since the element and the pn diode are arranged to overlap with each other, the device area can be reduced, and the higher integration of the element can be performed. Also, with the provision of the pn diode made of the nitride semiconductor within the element, operation at high temperature (for example, 200° C. or higher) can be conducted. Also, since the connection portion VIAS is arranged within the device isolation region ISO outside of the active region AC in which the electrons conduct, the miniaturization and the higher integration of the semiconductor element can be performed. Also, the on-resistance per unit area can be reduced.

(Description of Manufacturing Method)

Subsequently, a description will be given of a method of manufacturing the semiconductor device according to this embodiment while the configuration of the semiconductor, device will be more clarified, with reference to FIGS. 55 and 56.

First, as in the third embodiment, the nucleation layer NUC and the buffer layer BU are sequentially made on the substrate S. Then, the n+ layer NL, the n-type layer Dn, the p-type layer Dp, the channel underlying layer UC, the channel layer CH, the barrier layer BA, the gate junction layer JL, and the gate electrode GE are formed on the buffer layer BU in the same manner as that in the third embodiment.

Then, the contact hole C1D, and the through-holes THS, THD are formed in the interlayer insulating film IL1 in the same manner as that in the second embodiment.

The cap layer CP is exposed from the bottom surface of the contact hole C1D formed in the above process, the p-type layer Dp is exposed from the bottom surface of the through-hole THS, and the n+ layer NL is exposed from the bottom surface of the through-hole THD.

Then, the conductive film is formed on the interlayer insulating film IL1 including the insides of the contact hole C1S, and the through-holes THS, THD, to thereby form the source electrode SE, the drain electrode DE, the source pad SP, the drain electrode DE, and the connection portions VIAS, VIAD. Those components are made of the materials described in the first embodiment, and can be formed in the same manner as that in the first embodiment.

Then, as in the first electrode, the protective film PRO is formed on the interlayer insulating film IL1, as well as on the source electrode SE, the drain electrode DE, the source pad SP, and the drain pad DP.

Through the above process, the semiconductor device according to this embodiment can be formed. The above process is exemplary, and the semiconductor device according to this embodiment may be manufactured through a process other than the above process.

Fifth Embodiment

In the first embodiment, in order to perform insulation between the connection portion VIAD and the p-type layer Dp (prevention of electric connection), the side wall insulating film SW is used. However, in another method, the insulation between the connection portion VIAD and the p-type layer Dp is performed.

Figure 57:
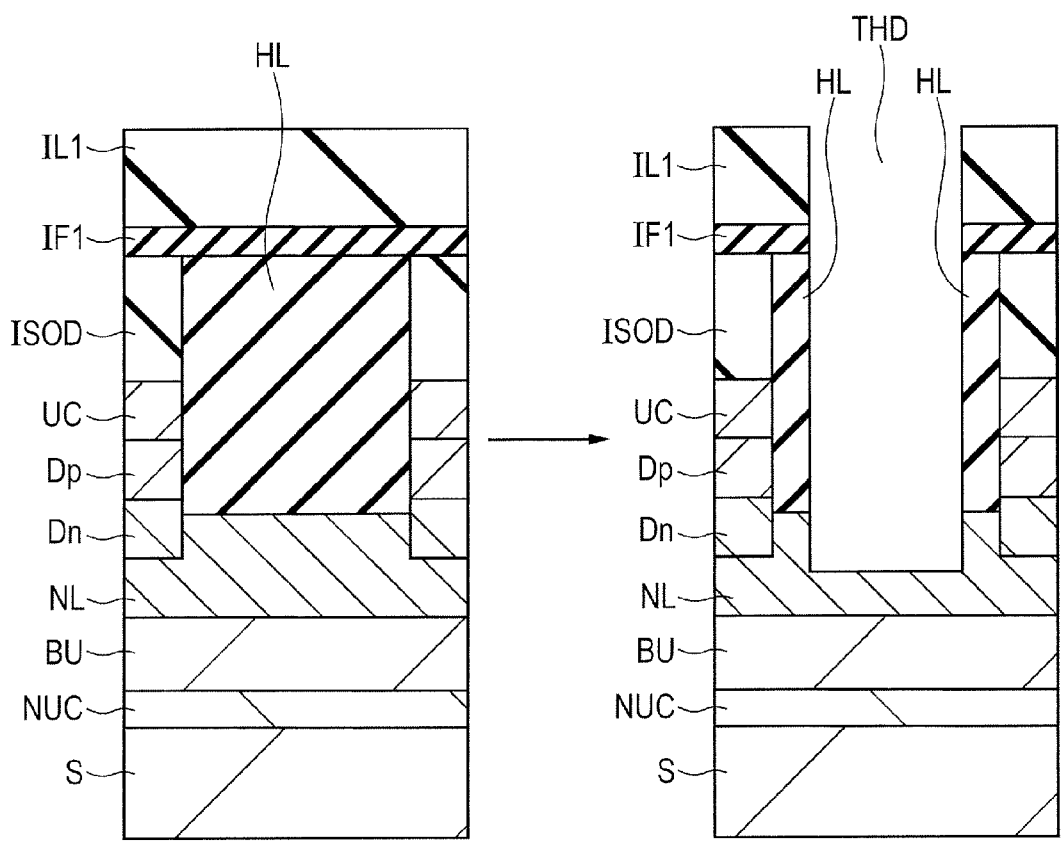
FIG. 57 is a cross-sectional view illustrating a main portion of a semiconductor device according to a first example of a fifth embodiment.

FIG. 57 is a cross-sectional view illustrating a main portion of a semiconductor device according to a first example of this embodiment. As illustrated in FIG. 57, ion species such as nitrogen (N) or boron (B) are implanted into the side wall portion of the through-hole THD to thereby form a high resistance layer HL.

For example, ion species such as nitrogen (N) or boron (B) are implanted into a region including the formation region of the through-hole THD. In this situation, the implantation conditions of ions are adjusted so that a depth of implantation, that is, the bottom portion of the high resistance layer HL is located lower than the bottom surface of the p-type layer Dp. Then, the through-hole THD that penetrates through the high resistance layer HL, and reaches the n+ layer NL below the high resistance layer HL is provided, and the connection portion VIAD is formed within the through-hole THD.

Figure 58:
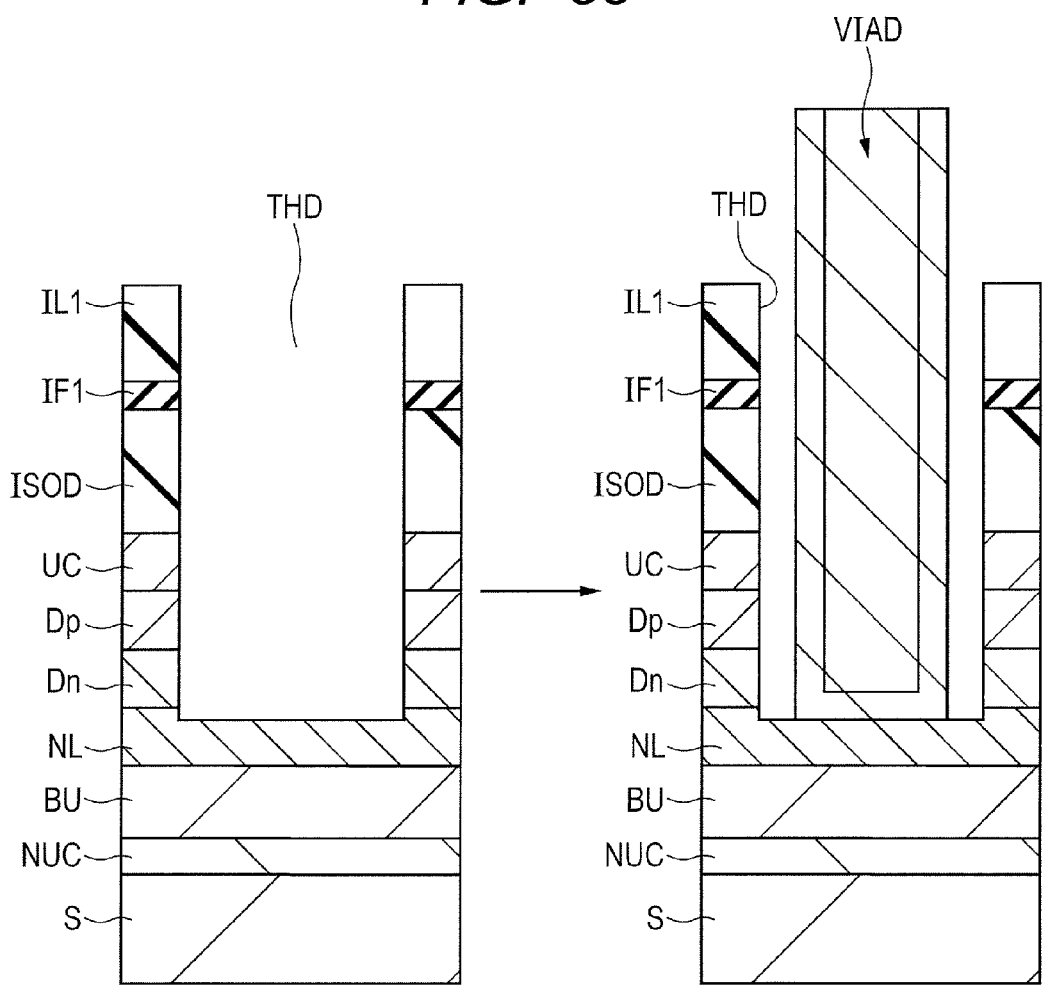
FIG. 58 is a cross-sectional view illustrating a main portion of a semiconductor device according to a second example of the fifth embodiment.

FIG. 58 is a cross-sectional view illustrating a main portion of a semiconductor device according to a second example of the fifth embodiment. As illustrated in FIG. 58, the connection portion VIAD may be spaced apart from the side wall of the through-hole THD. For example, the connection portion VIAD is coupled to the drain electrode DE with the use of a line layer different from the drain electrode DE.

For example, the through-hole THD is formed in the area including the formation area of the connection portion VIAD. Then, the conductive film is formed on the interlayer insulating film IL1 together with the inside of the through-hole THD and the conductive film is etched to form the connection portion VIAD. In this situation, etching is conducted so that the planar shape of the connection portion VIAD becomes smaller than the planar shape of the through-hole THD by one size. With this configuration, a space (gap) is generated between the side wall of the through-hole THD and the connection portion VIAD, thereby being capable of preventing an electric connection between the connection portion VIAD and the drain pad DP. The above space (gap) may be embedded with the protective film PRO through a subsequent process.

The invention made by the present inventors has been described specifically on the basis of the embodiments. However, the present invention is not limited to the above embodiments, but can be variously modified without departing from the spirit of the invention.

For example, a pn diode including the p-type layer Dp and the n-type layer Dn, or the stacked portion including the n+ layer NL, the n-type layer Dn, and the p-type layer Dp may be arranged between the substrate S and the buffer layer BU, or in the buffer layer BU. Also, a layer (for example, i-GaN layer) unintentionally doped with impurities is provided, and an influence of the impurities in the p-type layer Dp on the channel layer CH may be reduced. Also, the n-type layer Dn and the p-type layer Dp (pn diode) may be applied to the semiconductor device having a configuration other than the gate electrode described in the above first to fourth embodiment.

What is claimed is:

1. A semiconductor device, comprising:
a first nitride semiconductor layer that is made over a substrate;
a second nitride semiconductor layer that is formed on the first nitride semiconductor layer;
a third nitride semiconductor layer that is formed on the second nitride semiconductor layer;
a fourth nitride semiconductor layer that is formed on the third nitride semiconductor layer;
a trench that penetrates through the fourth nitride semiconductor layer, and reaches a middle portion of the third nitride semiconductor layer;
a gate electrode that is arranged within the trench through a gate insulating film;
a first electrode and a second electrode that are formed above the fourth nitride semiconductor layer on both sides of the gate electrode;
a first connection portion that connects the first electrode to the first nitride semiconductor layer;
a second connection portion that connects the second electrode to the second nitride semiconductor layer; and
an insulating film that is formed between the first connection portion and the second nitride semiconductor layer,
wherein an electron affinity of the fourth nitride semiconductor layer is smaller than an electron affinity of the third nitride semiconductor layer,
wherein the first nitride semiconductor layer contains impurities of a first conductivity type,
wherein the second nitride semiconductor layer contains impurities of a second conductivity type that is a conductivity type opposite to the first conductivity type,
wherein the substrate has a first region and a second region,
wherein the gate electrode, the first electrode, and the second electrode are formed in the first region,
wherein the second region is an device isolation region formed in the fourth nitride semiconductor layer and the third nitride semiconductor layer,
wherein the first connection portion is arranged within a first through-hole that penetrates through the device isolation region and the second nitride semiconductor layer, and reaches the first nitride semiconductor layer, and
wherein the insulating film is arranged between a side wall of the first through-hole and the first connection portion.

2. The semiconductor device according to claim 1,
wherein the second connection portion is arranged within a second through-hole that penetrates through the device isolation region, and reaches the second nitride semiconductor layer.

3. The semiconductor device according to claim 1,
wherein a first terminal portion that is electrically coupled to the first electrode is arranged on the first connection portion.

4. The semiconductor device according to claim 3,
wherein a second terminal portion that is electrically coupled to the second electrode is arranged on the second connection portion.

5. The semiconductor device according to claim 1,
wherein a fifth nitride semiconductor layer is arranged under the first nitride semiconductor layer, and
wherein the fifth nitride semiconductor layer contains the first conductivity type impurities higher in concentration than the first nitride semiconductor layer.

6. The semiconductor device according to claim 5,
wherein the first connection portion is arranged within a first through-hole that penetrates through the device isolation region, the second nitride semiconductor layer, and the first nitride semiconductor layer, and reaches the fifth nitride semiconductor layer.

7. The semiconductor device according to claim 5,
wherein a superlattice layer is arranged between the substrate and first nitride semiconductor layer, and
wherein in the superlattice layer, two or more stacked bodies having a sixth nitride semiconductor layer, and a seventh nitride semiconductor layer different in electron affinity from the sixth nitride semiconductor layer are repetitively arranged.

8. The semiconductor device according to claim 1,
wherein the second connection portion is arranged within a second through-hole that penetrates through the fourth nitride semiconductor layer and the third nitride semiconductor layer, and reaches the second nitride semiconductor layer.

9. The semiconductor device according to claim 8,
wherein the second electrode is arranged on the second connection portion.

10. The semiconductor device according to claim 1,
wherein the first connection portion comprises a first conductive film, and the second connection portion comprises a second conductive film.

11. The semiconductor device according to claim 1,
wherein the first connection portion comprises a first metal film, and the second connection portion comprises a second metal film.

12. A semiconductor device, comprising:
a first nitride semiconductor layer that is made over a substrate;
a second nitride semiconductor layer that is formed on the first nitride semiconductor layer;
a third nitride semiconductor layer that is formed on the second nitride semiconductor layer;
a fourth nitride semiconductor layer that is formed on the third nitride semiconductor layer;
a gate electrode that is arranged above the fourth nitride semiconductor layer through the fifth nitride semiconductor layer;
a first electrode and a second electrode that are formed above the fourth nitride semiconductor layer on both sides of the gate electrode;
a first connection portion that connects the first electrode to the first nitride semiconductor layer;

a second connection portion that connects the second electrode to the second nitride semiconductor layer; and an insulating film that is formed between the first connection portion and the second nitride semiconductor layer, wherein an electron affinity of the fourth nitride semiconductor layer is smaller than an electron affinity of the third nitride semiconductor layer, wherein an electron affinity of the fifth nitride semiconductor layer is larger than an electron affinity of the fourth nitride semiconductor layer, wherein the first nitride semiconductor layer contains impurities of a first conductivity type, wherein the second nitride semiconductor layer contains impurities of a second conductivity type that is a conductivity type opposite to the first conductivity type, wherein the substrate has a first region and a second region, wherein the gate electrode, the first electrode, and the second electrode are formed in the first region, wherein the second region is a device isolation region formed in the fourth nitride semiconductor layer and the third nitride semiconductor layer, wherein the first connection portion is arranged within a first through-hole that penetrates through the device isolation region and the second nitride semiconductor layer, and reaches the first nitride semiconductor layer, wherein the insulating film is arranged between a side wall of the first through-hole and the first connection portion, and wherein the second connection portion is arranged within a second through-hole that penetrates through the device isolation region, and reaches the second nitride semiconductor layer.

13. The semiconductor device according to claim 12, wherein the second connection portion is arranged within the second through-hole that penetrates through the fourth nitride semiconductor layer and the third nitride semiconductor layer, and reaches the second nitride semiconductor layer.

14. The semiconductor device according to claim 13, wherein the second electrode is arranged on the second connection portion.

* * * * *